US011581318B2

(12) United States Patent
Park et al.

(10) Patent No.: US 11,581,318 B2
(45) Date of Patent: Feb. 14, 2023

(54) METHODS OF MANUFACTURING SEMICONDUCTOR DEVICES

(71) Applicant: Samsung Electronics Co., Ltd., Suwon-si (KR)

(72) Inventors: Hye Sung Park, Hwaseong-si (KR); Jong Hyuk Park, Hwaseong-si (KR); Jin Woo Bae, Yongin-si (KR); Bo Un Yoon, Seoul (KR); Il Young Yoon, Hwaseong-si (KR); Bong Sik Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 8 days.

(21) Appl. No.: 17/237,195

(22) Filed: Apr. 22, 2021

(65) Prior Publication Data

US 2021/0242215 A1 Aug. 5, 2021

Related U.S. Application Data

(63) Continuation of application No. 16/564,688, filed on Sep. 9, 2019, now Pat. No. 11,011,526.

(30) Foreign Application Priority Data

Jan. 10, 2019 (KR) ........................ 10-2019-0003176

(51) Int. Cl.
*H01L 27/108* (2006.01)
*H01L 21/768* (2006.01)
(Continued)

(52) U.S. Cl.
CPC .... *H01L 27/10894* (2013.01); *H01L 21/0274* (2013.01); *H01L 21/76829* (2013.01);
(Continued)

(58) Field of Classification Search
CPC ............ H01L 27/76837; H01L 27/108; H01L 27/10847; H01L 27/222; H01L 27/10814;
(Continued)

(56) References Cited

U.S. PATENT DOCUMENTS 6,365,523 B1 4/2002 Jang et al.
8,039,398 B2 10/2011 Feustel et al.
(Continued)

FOREIGN PATENT DOCUMENTS

KR 10-0421037 B1 3/2004
KR 10-0831256 B1 5/2008
(Continued)

*Primary Examiner* — Errol V Fernandes
*Assistant Examiner* — Jeremy J Joy
(74) *Attorney, Agent, or Firm* — Harness, Dickey & Pierce, P.L.C.

(57) ABSTRACT

A method of manufacturing a semiconductor device includes forming a first pattern structure having a first opening and a second pattern structure having a second opening on a substrate, forming a gap fill layer in the second opening, forming fences and contact structures in the first opening, removing the gap fill layer in the second opening, forming an upper conductive layer to cover the first and second pattern structures, the fences, and the contact structures, forming a mask pattern based on a photolithography process using the second pattern structure covered by the upper conductive layer as an align mark, and etching the upper conductive layer using the mask pattern to form upper conductive patterns. A width of the second opening is larger than a width of a first opening. A thickness of the upper conductive layer is smaller than a depth of the second opening.

20 Claims, 43 Drawing Sheets

(51) Int. Cl.
   *H01L 21/027* (2006.01)
   *H01L 23/544* (2006.01)
(52) U.S. Cl.
   CPC .. *H01L 21/76837* (2013.01); *H01L 21/76897*
      (2013.01); *H01L 23/544* (2013.01); *H01L*
      *27/10814* (2013.01); *H01L 27/10897*
      (2013.01)
(58) Field of Classification Search
   CPC ......... H01L 27/10879; H01L 27/10894; H01L
      27/10897; H01L 21/76897; H01L
      21/76867; H01L 21/76829; H01L 23/544;
      H01L 2223/54426
   See application file for complete search history.

(56) References Cited

U.S. PATENT DOCUMENTS

| | | | |
|---|---|---|---|
| 10,418,366 B2* | 9/2019 | Son | H01L 21/76816 |
| 2002/0132492 A1 | 9/2002 | Kim et al. | |
| 2004/0253809 A1 | 12/2004 | Yao et al. | |
| 2006/0115950 A1 | 6/2006 | Kim et al. | |
| 2007/0026625 A1 | 2/2007 | Chung et al. | |
| 2010/0258907 A1* | 10/2010 | Tomoyama | H01L 28/91 257/E21.012 |
| 2012/0149135 A1* | 6/2012 | Sugimura | H01L 21/31144 257/E21.53 |
| 2014/0038383 A1 | 2/2014 | Han et al. | |
| 2014/0131786 A1 | 5/2014 | Ryu et al. | |
| 2014/0327063 A1* | 11/2014 | Park | H01L 21/76897 257/296 |
| 2014/0367825 A1* | 12/2014 | Kim | H01L 21/764 257/522 |
| 2015/0061134 A1* | 3/2015 | Lee | H01L 21/7682 257/751 |
| 2015/0111360 A1* | 4/2015 | Kim | H01L 27/10885 438/381 |
| 2015/0228574 A1* | 8/2015 | Kim | H01L 27/10814 257/773 |
| 2016/0079260 A1* | 3/2016 | Bae | C09G 1/02 438/586 |
| 2016/0211215 A1* | 7/2016 | Lee | H01L 23/528 |
| 2016/0276273 A1* | 9/2016 | Kwon | H01L 21/764 |
| 2017/0062347 A1* | 3/2017 | Kim | H01L 23/4821 |
| 2017/0084710 A1* | 3/2017 | Koh | H01L 27/10823 |
| 2017/0323893 A1* | 11/2017 | Kim | H01L 27/10823 |
| 2018/0096947 A1* | 4/2018 | Lee | H01L 27/10876 |
| 2018/0175045 A1* | 6/2018 | Lee | G11C 11/4085 |
| 2018/0331046 A1* | 11/2018 | Lee | H01L 27/10894 |
| 2018/0366468 A1* | 12/2018 | Park | H01L 27/10817 |
| 2019/0088739 A1* | 3/2019 | Lee | H01L 23/528 |
| 2019/0206875 A1* | 7/2019 | Kim | H01L 27/10885 |
| 2019/0326278 A1* | 10/2019 | Lee | H01L 29/7851 |
| 2019/0363088 A1* | 11/2019 | Ryu | H01L 27/10894 |

FOREIGN PATENT DOCUMENTS

| | | |
|---|---|---|
| KR | 10-0899060 B1 | 5/2009 |
| KR | 10-1719901 B1 | 3/2017 |

\* cited by examiner

METHODS OF MANUFACTURING SEMICONDUCTOR DEVICES

CROSS-REFERENCE TO RELATED APPLICATIONS

This application is a continuation of U.S. application Ser. No. 16/564,688, filed Sep. 9, 2019, which claims priority under 35 U.S.C. § 119 to Korean Patent Application No. 10-2019-0003176, filed on Jan. 10, 2019, in the Korean Intellectual Property Office, the disclosure of each of which is hereby incorporated by reference in its entirety.

TECHNICAL FIELD

Example embodiments of the present disclosure relate to methods of manufacturing semiconductor devices, and, more specifically, to methods of manufacturing semiconductor devices using one or more chemical mechanical polishing processes, and semiconductor devices formed by the same.

DISCUSSION OF RELATED ART

Sizes of elements at least partially comprising one or more semiconductor devices may be reduced to increase integration of the one or more semiconductor devices. However, as the sizes of the elements are reduced, it can be difficult to form the elements without being damaged. For example, when an align mark is damaged, a yield of a photolithography process can be lowered.

SUMMARY

According to some example embodiments of the inventive concepts, a method of manufacturing a semiconductor device may include forming a first pattern structure and a second pattern structure on a substrate, forming a gap fill layer in the second opening, forming fences and contact structures in the first opening, removing the gap fill layer in the second opening, forming an upper conductive layer that covers the first pattern structure, the second pattern structure, the fences and the contact structures, forming a mask pattern based on a photolithography process using the second pattern structure as an align mark, etching the upper conductive layer using the mask pattern to form a plurality of upper conductive patterns, and removing the mask pattern. The first pattern structure may have a first opening. The second pattern structure may have a second opening. A width of the second opening may be larger than a width of the first opening. A thickness of the upper conductive layer may be smaller than a depth of the second opening. The upper conductive layer may cover an upper surface and a sidewall of the second pattern structure and a lower surface of the second opening.

According to some example embodiments of the inventive concepts, a method of manufacturing a semiconductor device may include forming a conductive layer and a lower capping layer that are sequentially stacked on a substrate including a first region, a second region, and a third region, patterning the conductive layer and the lower capping layer in the third region to form a peripheral gate structure, forming a peripheral interlayer insulation layer on a sidewall of the peripheral gate structure in the third region, forming an upper capping layer on the lower capping layer in the first region, and on the lower capping layer in the second region, and on the peripheral interlayer insulation layer in the third region and on the peripheral gate structure in the third region, patterning the conductive layer, the lower capping layer, and the upper capping layer in the first region and the second region to form a first pattern structure in the first region and in a second pattern structure in the second region, the first pattern structure having a first opening and the second pattern structure having a second opening having a larger width than a width of the first opening, forming a gap fill layer in the second opening, forming fences and contact structures in the first opening, removing the gap fill layer in the second opening, forming an upper conductive layer covering the first and second pattern structures, the fences, and the contact structures, the upper conductive layer covering an upper surface and a sidewall of the second pattern structure and a lower surface of the second opening and having a smaller thickness than a depth of the second opening, and patterning the upper conductive layer to form upper conductive patterns.

According to some example embodiments of the inventive concepts, a method of manufacturing a semiconductor device may include forming a conductive layer and a lower capping layer sequentially stacked on a substrate including a memory cell array region and a peripheral circuit region, patterning the conductive layer and the lower capping layer in the peripheral circuit region to form a peripheral gate structure, forming a peripheral interlayer insulation layer on a sidewall of the peripheral gate structure in the peripheral circuit region, forming an upper capping layer on the lower capping layer in the memory cell array region and on the peripheral interlayer insulation layer and the peripheral gate structure in the peripheral circuit region, patterning the conductive layer, the lower capping layer, and the upper capping layer in the memory cell array region to form a pattern structure having an opening, forming fences and first contact holes in the opening, forming lower contact patterns partly filling the first contact holes, forming a second contact hole passing through the upper capping layer and the peripheral interlayer insulation layer in the peripheral circuit region, forming a contact material layer on the lower contact patterns, the pattern structure, and the fences in the memory cell array region and on the upper capping layer and in the second contact hole in the peripheral circuit region, and planarizing the contact material layer to form first contact structures and a second contact structure. The first contact structures may include upper contact patterns in the first contact holes and lower contact patterns on separate, respective upper contact patterns of the upper contact patterns, and the second contact structure may remain in the second contact hole.

According to some example embodiments of the inventive concepts, a semiconductor device may include a field region in a substrate and defining a cell active region and a peripheral active region, a cell gate structure traversing the cell active region and extending to the field region, a first impurity region and a second impurity region in the cell active region at opposite sides of the cell gate structure, a peripheral gate structure on the peripheral active region, peripheral source/drain regions in the peripheral active region at opposite sides of the peripheral gate structure, a pattern structure on and extending across the cell gate structure, the pattern structure overlapped with the first impurity region in a direction extending substantially perpendicular to an upper surface of the substrate, the pattern structure including a first conductive layer, a first lower capping layer on the first conductive layer, a first upper capping layer on the first lower capping layer, and a contact plug between the first conductive layer and the first impurity region, a first contact structure on the second impurity region, one or more first spacer layers between the pattern structure and the first contact structure, a peripheral interlayer insulation layer around the peripheral gate structure, a peripheral upper capping layer on the peripheral gate structure and the peripheral interlayer insulation layer, and a separate second contact structure on each of the peripheral source/drain regions and extending through the peripheral upper capping layer and the peripheral interlayer insulation layer. The peripheral gate structure may include a peripheral conductive layer and a peripheral lower capping layer on the peripheral conductive layer. The first conductive layer and the peripheral conductive layer may include a same first material. The first lower capping layer and the peripheral lower capping layer may include a same second material. The first upper capping layer and the peripheral upper capping layer mat include a same third material. An upper surface of the first contact structure, an upper surface of the second contact structure, an upper surface of the first upper capping layer, and an upper surface of the peripheral upper capping layer may be coplanar with each other.

DETAILED DESCRIPTION

Figure 1:
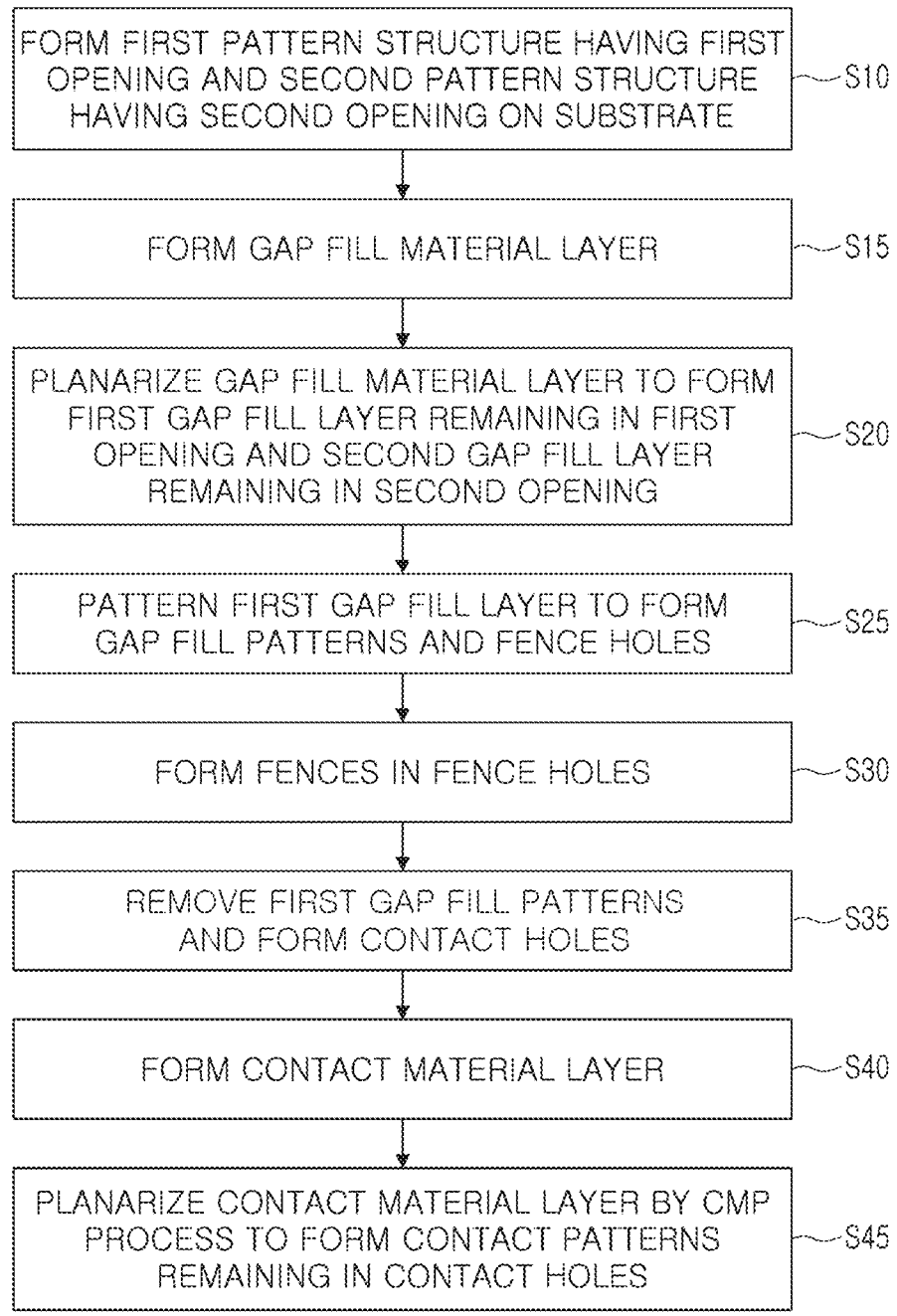
FIG. 1 is a flow chart of a method of manufacturing a semiconductor device according to some example embodiments of the inventive concept.

Various example embodiments will now be described more fully hereinafter with reference to the accompanying drawings. Like reference numerals may refer to like elements throughout this application.

FIG. 1 is a flow chart of a method of manufacturing a semiconductor device according to some example embodiments of the inventive concept.

Referring to FIG. 1, in operation S10, a first pattern structure having a first opening and a second pattern structure having a second opening may be formed on a substrate. The second opening may have a larger width than a width of the first opening. In operation S15, a gap fill material layer may be formed. The gap fill material layer may be formed on the first and second pattern structures. In S20, the gap fill material layer may be planarized to form a first gap fill layer remaining in the first opening and a second gap fill layer remaining in the second opening. In operation S25, the first gap fill layer may be patterned to form gap fill patterns and fence holes. The fence holes may be formed between the gap fill patterns. In operation S30, fences may be formed in the fence holes. In operation S35, the first gap patterns may be removed and thus the contact holes may be formed. In operation S40, a contact material layer may be formed. In operation S45, the contact material layer may be planarized by a chemical mechanical polishing (CMP) process to form contact patterns remaining in the contact holes.

Figure 2:
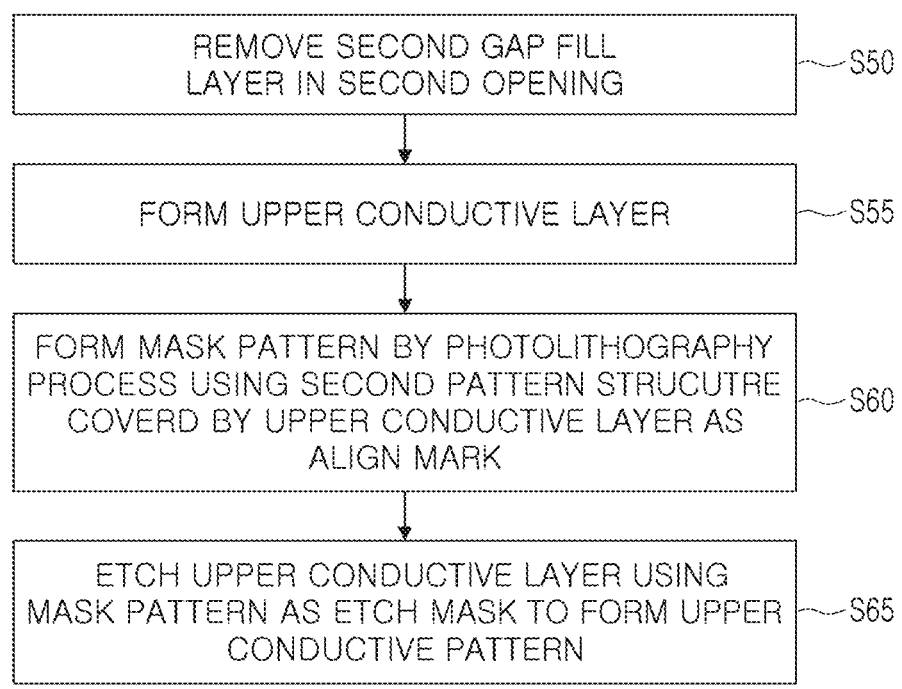
FIG. 2 is a flow chart of a method of manufacturing a semiconductor device according to some example embodiments of the inventive concept.

FIG. 2 is a flow chart of a method of manufacturing a semiconductor device according to some example embodiments of the inventive concept. The semiconductor device according to some example embodiments is described with reference to FIGS. 1 and 2.

Referring to FIGS. 1 and 2, after operation S45 of forming the contact patterns remaining in the contact holes, the second gap fill layer in the second opening may be removed in operation S50. In operation S55, an upper conductive layer may be formed. The upper conductive layer may have a smaller thickness than a depth of the second opening and may cover a sidewall and a lower surface of the second opening. In operation S60, a mask pattern may be formed by a photolithography process using the second pattern structure covered by the upper conductive layer as an align mark. The mask pattern may be formed on the upper conductive layer. In operation S65, the upper conductive layer may be etched using the mask pattern as an etch mask to form an upper conductive pattern.

Figure 3A:
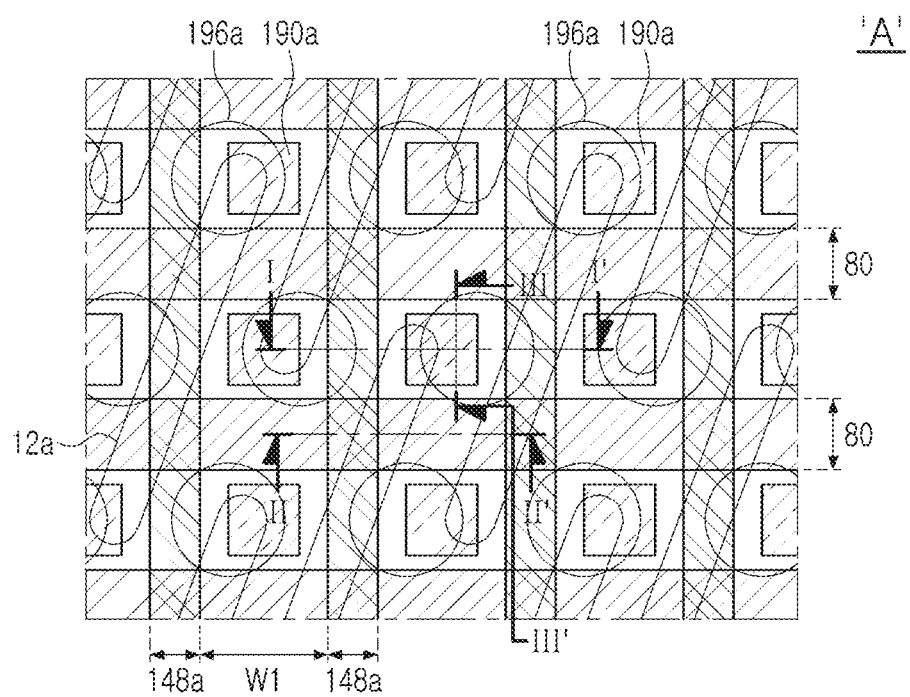
FIGS. 3A, 3B, and 3C are plan views illustrating a semiconductor device according to some example embodiments of the inventive concept.
Figure 3B:
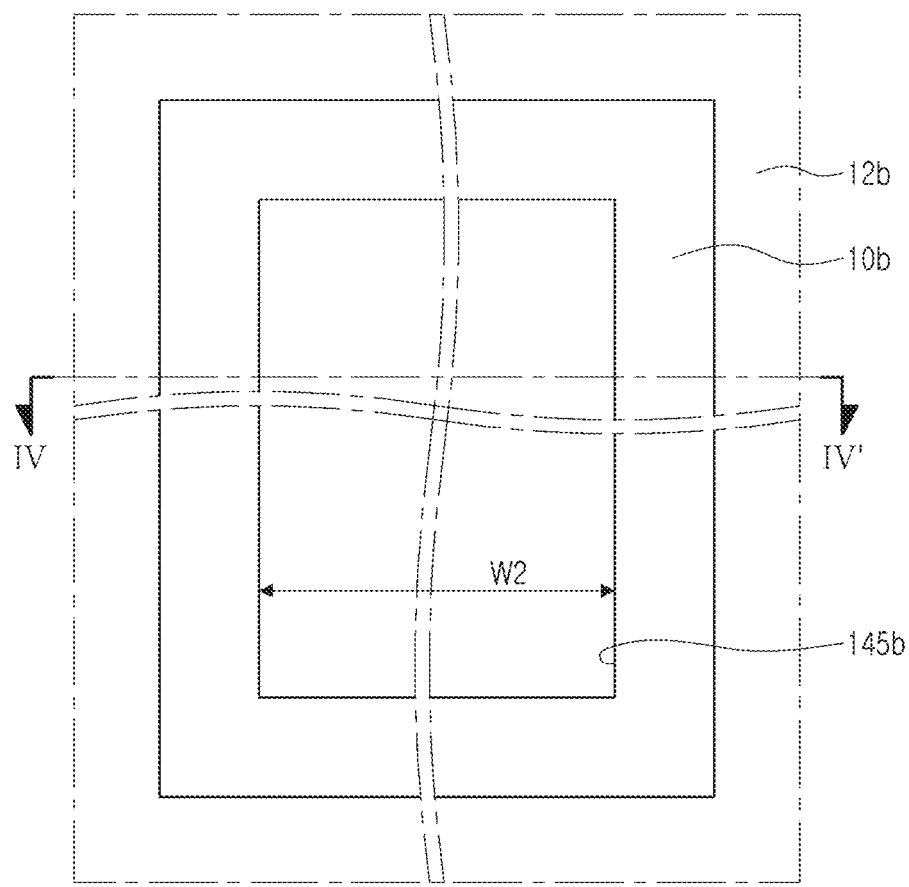
Figure 3C:
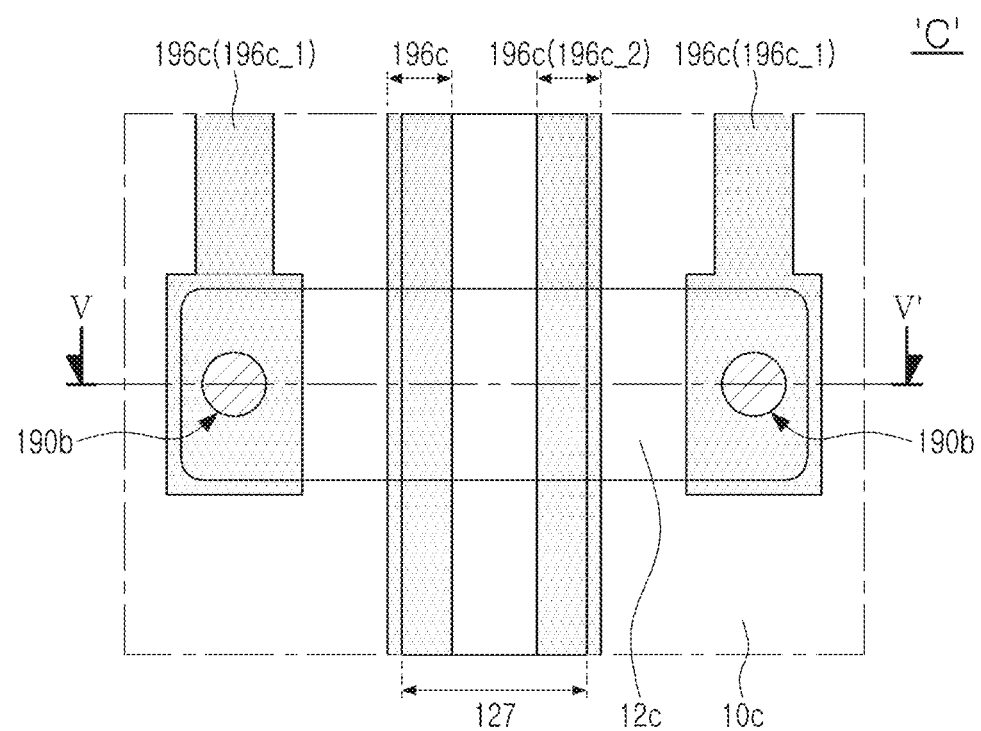

FIGS. 3A, 3B, and 3C are plan views illustrating a semiconductor device according to some example embodiments of the inventive concept. FIGS. 4A to 20C are cross-sectional views illustrating stages in a method of manufacturing a semiconductor device according to some example embodiments of the inventive concept. In FIGS. 3A, 3B, and 3C, FIG. 3A is a plan view illustrating a first region A of a semiconductor device according to some example embodiments of the inventive concept, FIG. 3B is a plan view illustrating a second region B of a semiconductor device according to some example embodiments of the inventive concept, and FIG. 3C is a plan view illustrating a third region C of a semiconductor device according to some example embodiments of the inventive concept. In FIGS. 4A to 20C, FIGS. 4A, 5A, 6A, 7A, 8, 9, 10, 11, 13A, 14A, 16A, 17A, 18A, 19A, and 20A are cross-sectional views taken along lines I-I', II-II', and III-III' of FIG. 3A. FIGS. 4B, 5B, 6B, 7B, 13B, 14B, 15, 16B, 18B, 19B, and 20B are cross-sectional views taken along line IV-IV' of FIG. 3B. FIGS. 4C, 5C, 6C, 12, 13C, 14C, 16C, 17B, 18C, 19C, and 20C are cross-sectional views taken along line V-V' of FIG. 3C.

Referring to FIGS. 3A, 3B, 3C, 4A, 4B, and 4C, a substrate 5 including a first region A, a second region B, and a third region C may be prepared.

The substrate 5 may be a semiconductor substrate. In some example embodiments, the first region A may be a memory cell array region, the second region B may be an align mark region which is used for a photolithography process, and the third region C may be a peripheral circuit region. In some example embodiments, the second region B may be an overlay mark region which is used for the photolithography process.

An active region and a field region 10, may be formed in the substrate 5. The field region 10 may be a shallow trench isolation region. The field region 10 may include a first field region 10a in the first region A, a second field region 10b in the second region B, and a third field region 10c in the third region C. First active regions 12a defined by the first field region 10a may be formed in the first region A. A third active region 12c defined by the third field region 10c may be formed in the third region C. A second active region 12b surrounding the second field region 10b may be formed in the second region B. The first active regions 12a may be referred to as cell active regions, and the third active region 12c may be referred to as a peripheral active region.

The first active regions 12a and the first field region 10a may be etched to form a cell gate trench 25 in the first region A. The cell gate trench 25 may traverse the first active regions 12a and may extend to the field region 10.

Before the cell gate trench 25 is formed, an ion injection process may be performed to form a first impurity region 15a and a second impurity region 15b in the first active region 12a. The first and second impurity regions 15a and 15b may be cell source/drain regions.

A cell gate structure 80 may be formed in the cell gate trench 25. The cell gate structure 80 may include a cell gate insulation layer 30, a cell gate electrode 50, and a cell gate capping layer 60. The cell gate insulation layer 30 may be formed between the cell gate electrode 50 and each of the first active regions 12a. The first impurity region 15a and the second impurity region 15b may be in the first active regions 12a at opposite sides of the cell gate structure 80. The cell gate capping layer 60 may be formed on the cell gate electrode 50.

In some example embodiments, the cell gate electrode 50 may be a word line of a memory device.

A first insulation layer 109a, a first conductive layer 121a, a bit line contact plug 114, and a first lower capping layer 124a may be formed in the first region A.

A second insulation layer 109b, a second conductive layer 121b, and a second lower capping layer 124b which are sequentially stacked may be formed in the second region B.

A third insulation layer 109c, a third conductive layer 121c, and a third lower capping layer 124c which are sequentially stacked may be formed in the third region C.

Figure 4A:
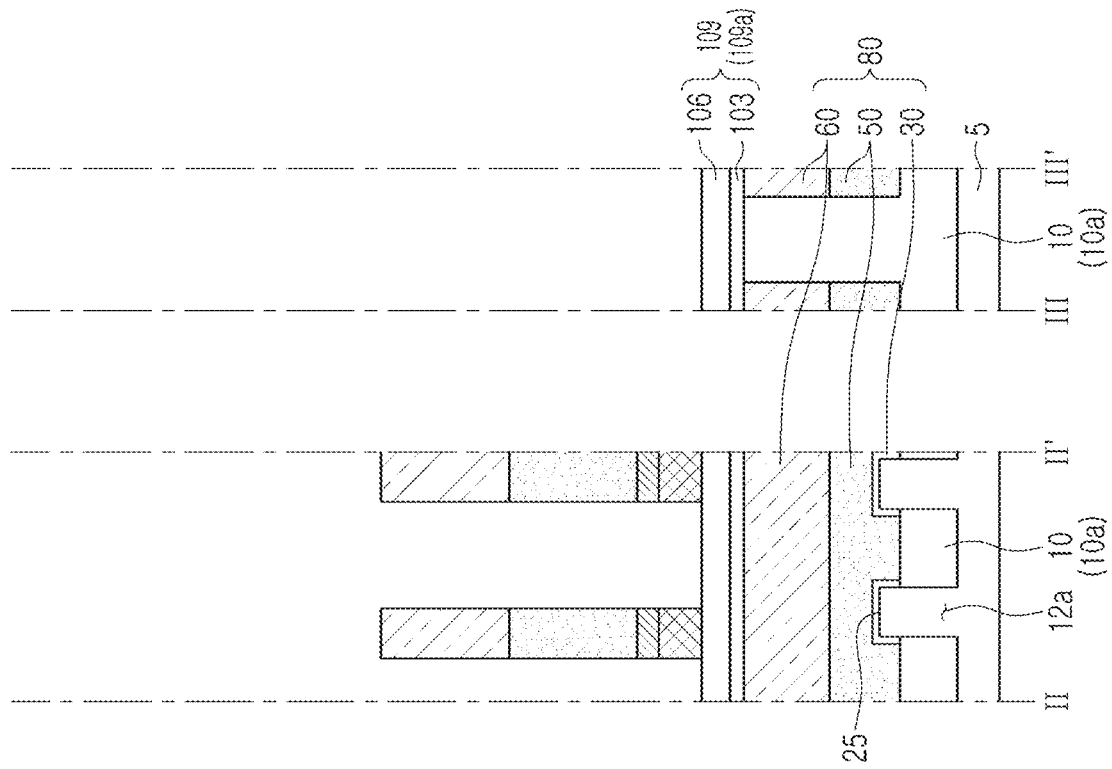
FIGS. 4A, 4B, 4C, 5A, 5B, 5C, 6A, 6B, 6C, 7A, 7B, 8, 9, 10, 11, 12, 13A, 13B, 13C, 14A, 14B, 14C, 15, 16A, 16B, 16C, 17A, 17B, 18A, 18B, 18C, 19A, 19B, 19C, 20A, 20B, and-20C are cross-sectional views illustrating stages in a method of manufacturing a semiconductor device according to some example embodiments of the inventive concept.
Figure 4B:
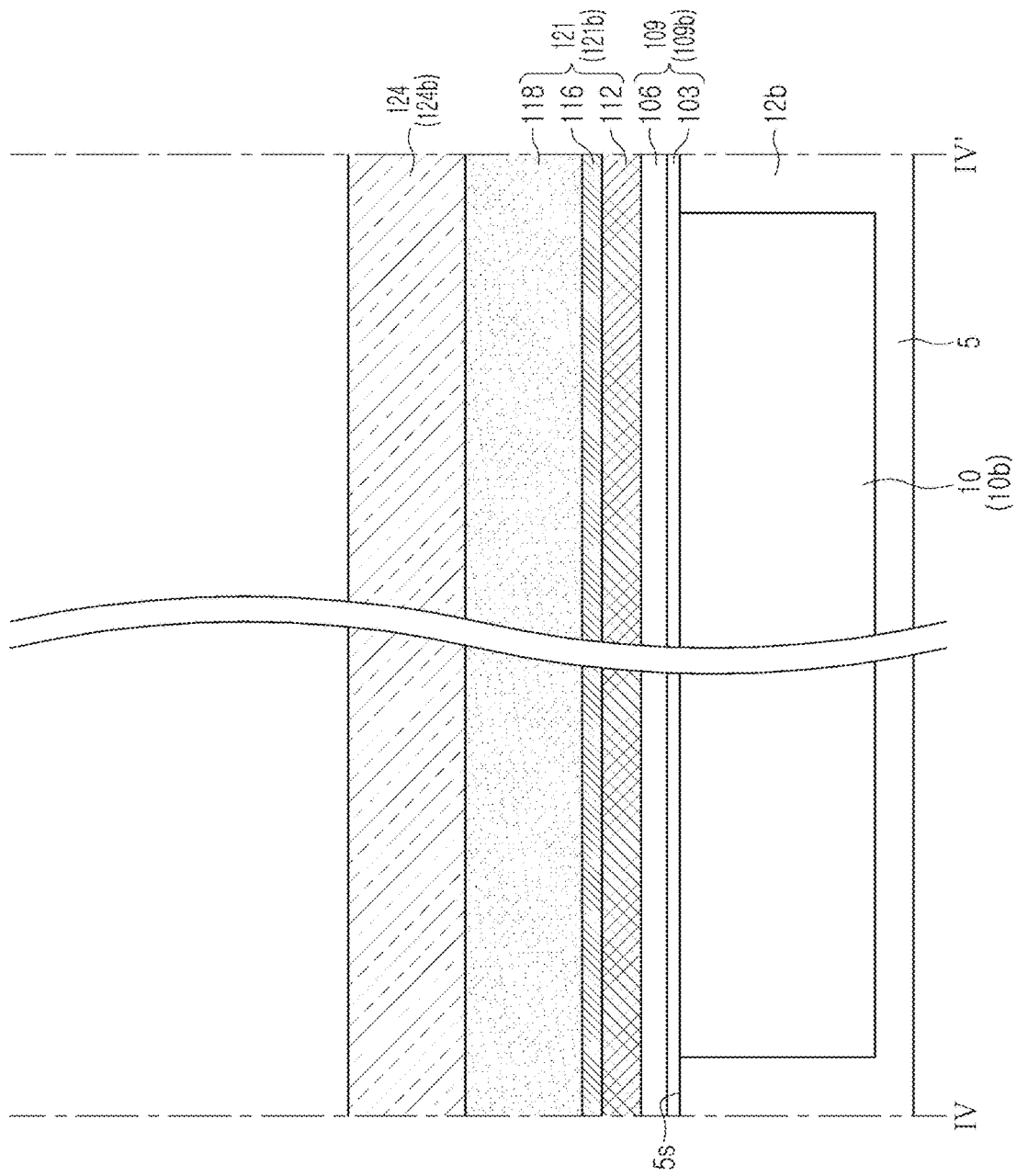
Figure 4C:
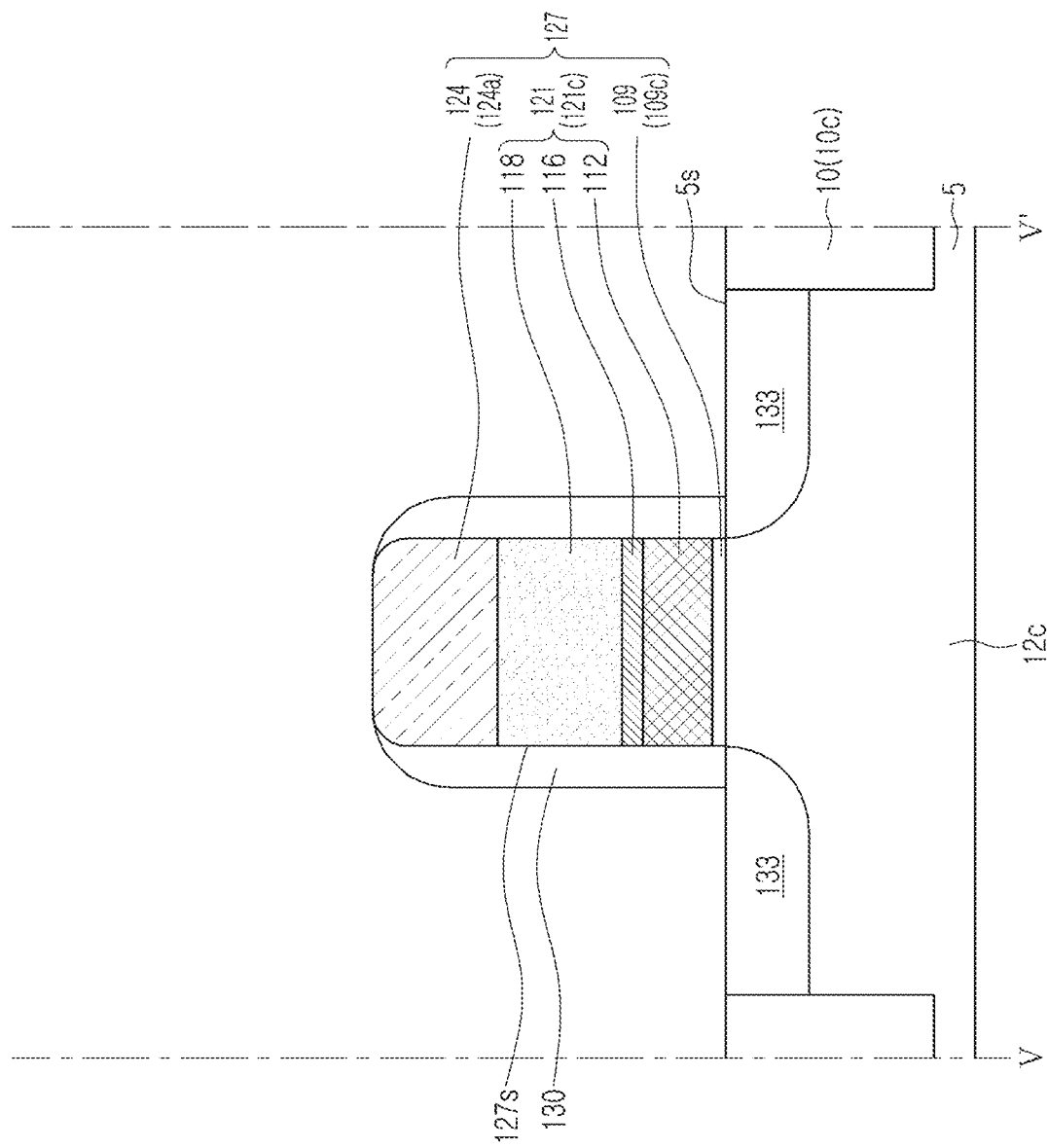

Referring to at least FIGS. 4A-4C, the first through third conductive layers 121a-121c may be referred to herein as a singular conductive layer 121, the first through third insulation layers 109a-109c may be referred to herein as a singular insulation layer 109, and the first through third lower capping layers 124a-124c may be referred to herein as a singular lower capping layer 124, where the singular conductive layer 121 and the singular lower capping layer 124 may be formed to be sequentially stacked on the substrate 5 that includes the first region A, the second region B, and the third region C. The singular insulation layer 109 may be formed on the substrate 5 prior to forming the singular conductive layer 121.

After the third insulation layer 109c, the third conductive layer 121c, and the third lower capping layer 124c which are sequentially stacked are formed in the third region C, the third insulation layer 109c, the third conductive layer 121c, and the third lower capping layer 124c may be patterned to form a peripheral gate structure 127. Restated, the singular insulation layer 109, the singular conductive layer 121 and the singular lower capping layer 124 in the third region C may be patterned to form a peripheral gate structure 127, such that the peripheral gate structure 127 includes a peripheral insulation layer (e.g., third insulation layer 109c), a peripheral conductive layer (e.g., third conductive layer 121c) on the peripheral insulation layer, and a peripheral lower capping layer (e.g., third lower capping layer 124c) on the peripheral conductive layer. Thus, the peripheral gate structure 127 may include the third insulation layer 109c, the third conductive layer 121c, and the third lower capping layer 124c that are sequentially stacked.

Each of the first and second insulation layers 109a and 109b may include a lower insulation layer 103 and an upper insulation layer 106 on the lower insulation layer 103.

The first to third conductive layers 121a, 121b, and 121c may be formed at the same time and may at least partially comprise the same material (e.g., a same first material). For example, each of the first to third conductive layers 121a, 121b, and 121c may include a first material layer 112, a second material layer 116, and a third material layer 118 that are sequentially stacked. For example, the first material layer 112 may at least partially comprise polysilicon, the second material layer 116 may at least partially comprise metal silicide (e.g., tungsten silicide, etc.) and/or metal nitride (e.g., TiN, WN, etc.), and the third material layer 118 may at least partially comprise metal (e.g., tungsten, etc.).

In the first region A, the bit line contact plug 114 may contact the first material layer 112 of the first conductive layer 121a and may pass through the first insulation layer 109a to be electrically connected to the first impurity region 15a.

The first to third lower capping layers 124a, 124b, and 124c may at least partially comprise the same material (e.g., a same second material). For example, the first to third lower capping layers 124a, 124b, and 124c may at least partially comprise a nitride-based material (e.g., silicon nitride, etc.).

Figure 5A:
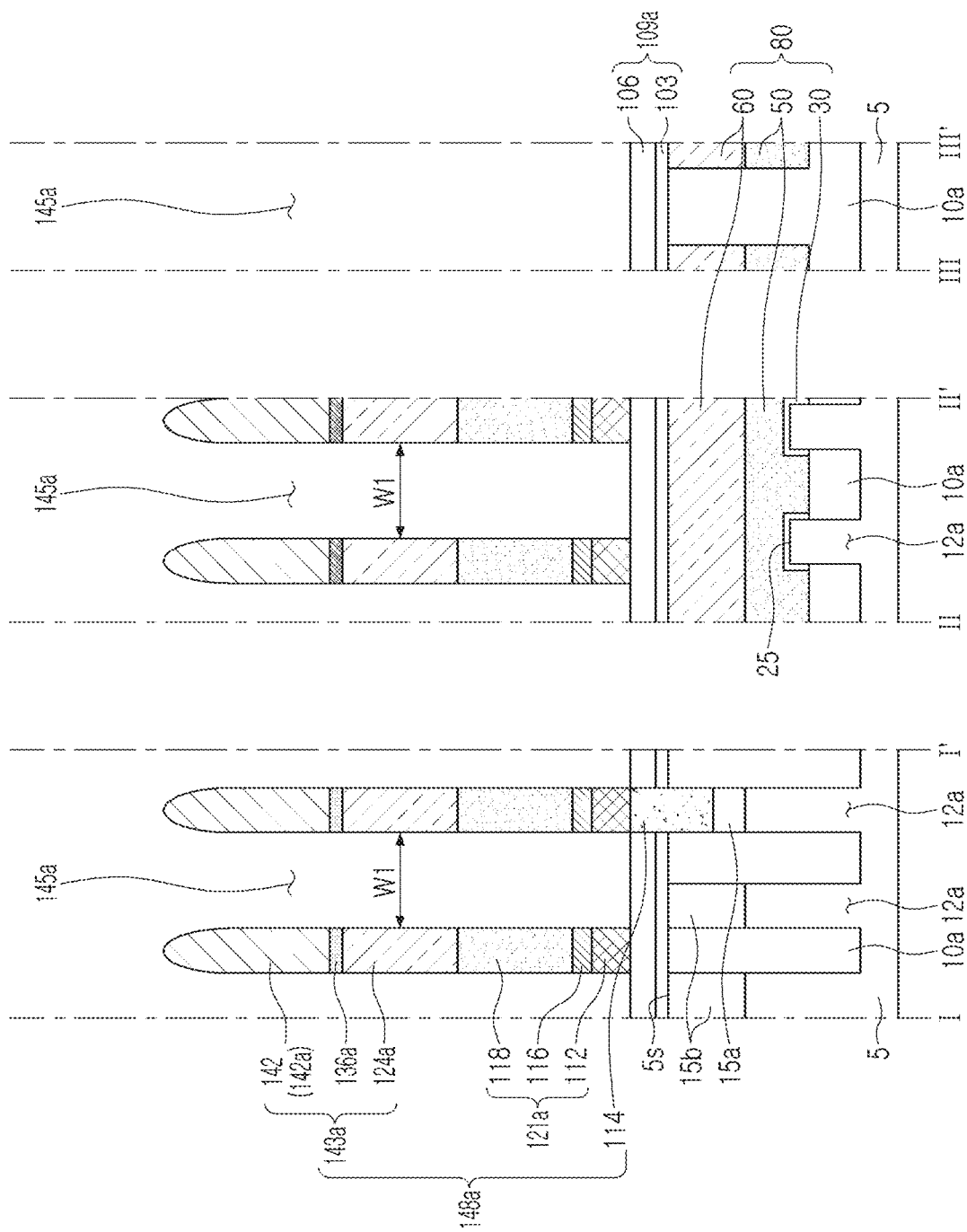
Figure 5B:
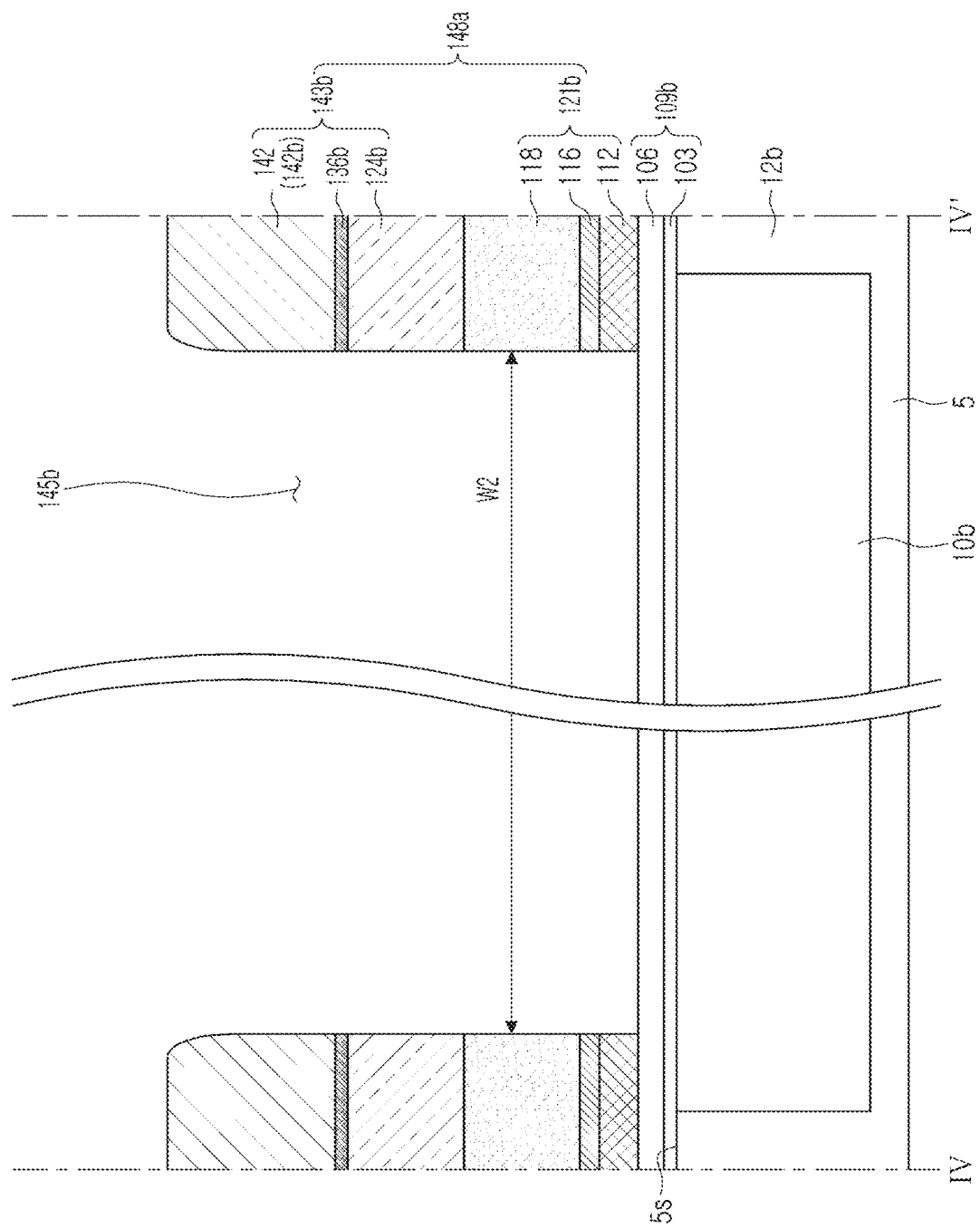
Figure 5C:
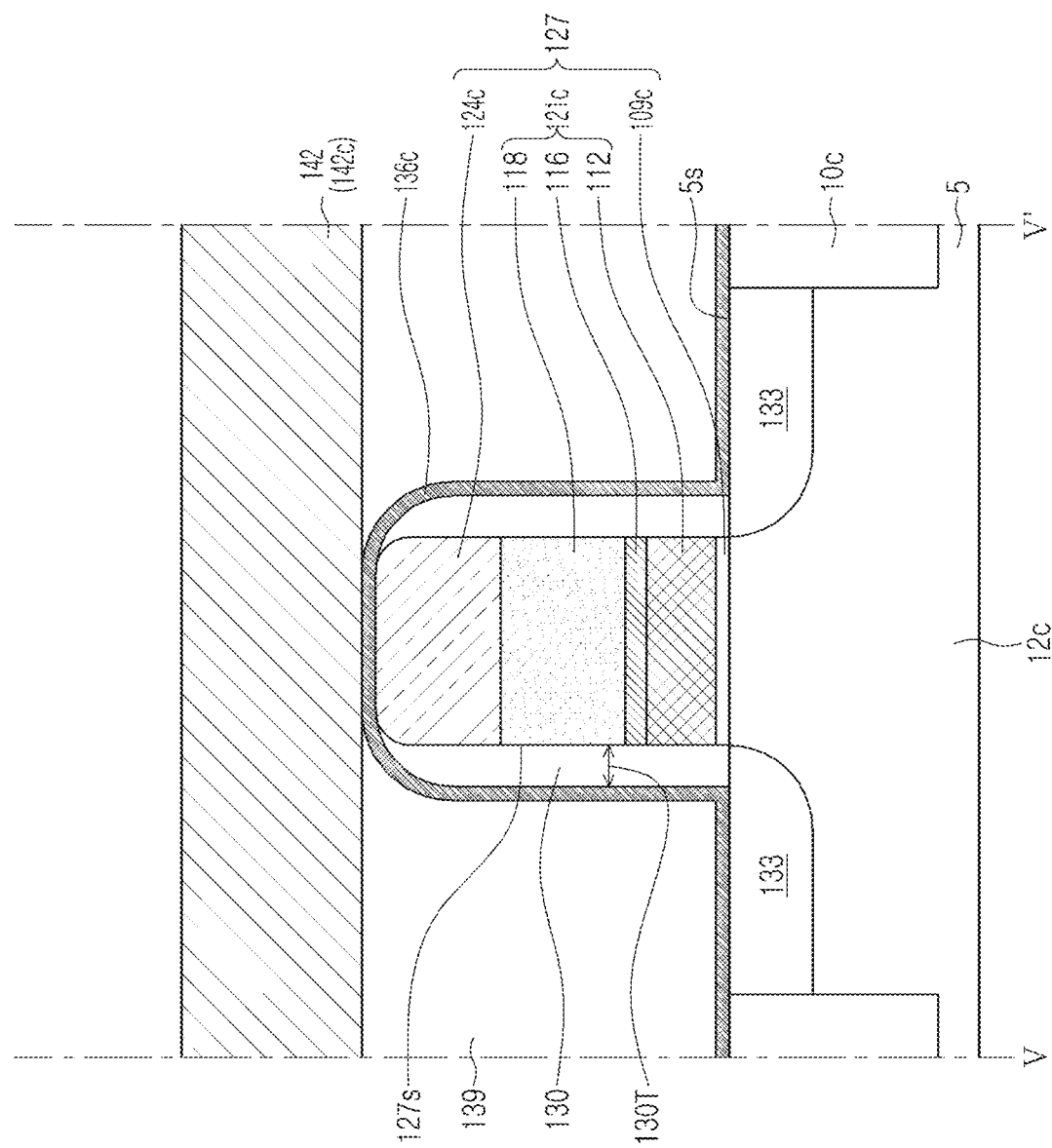
Figure 6A:
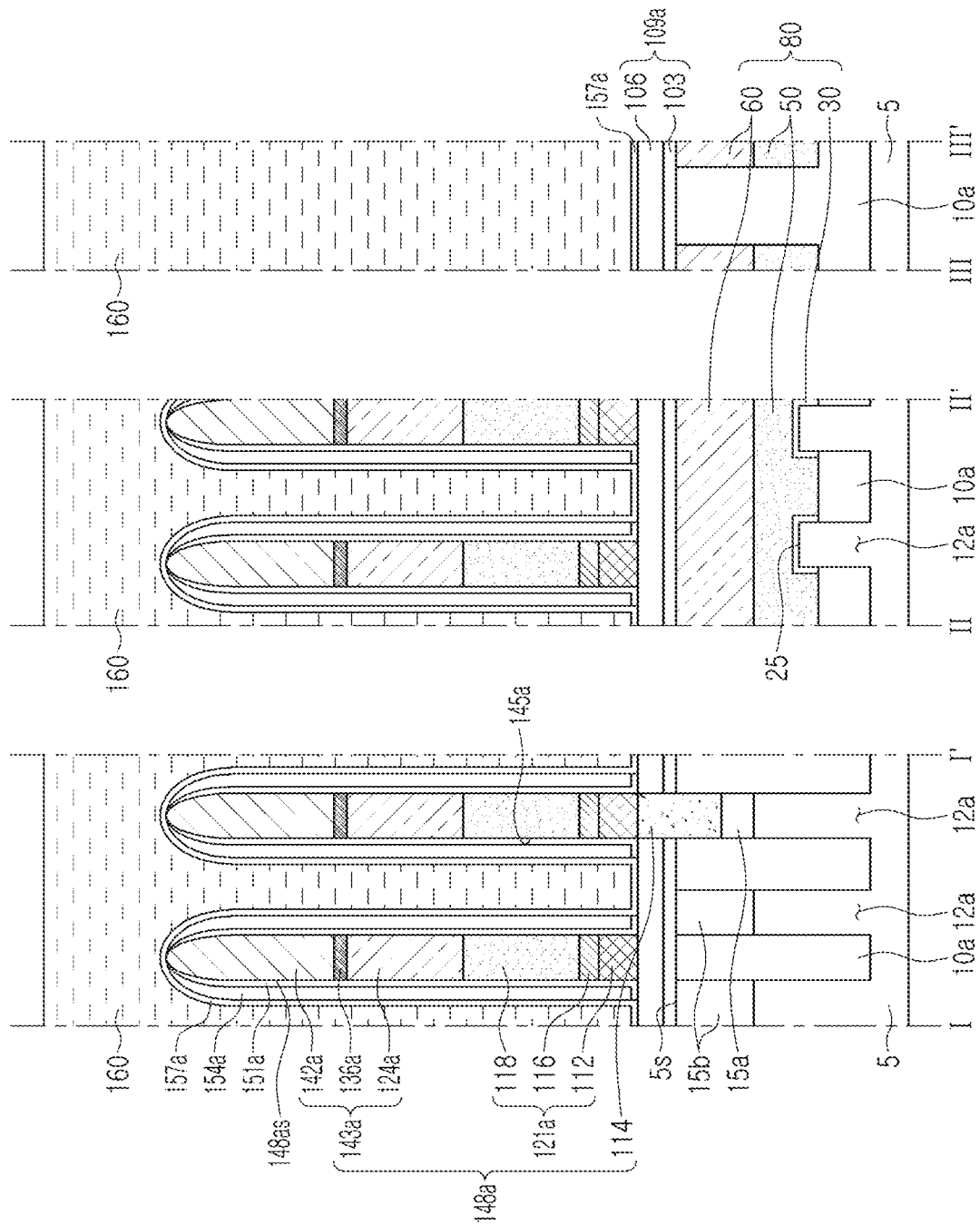
Figure 6B:
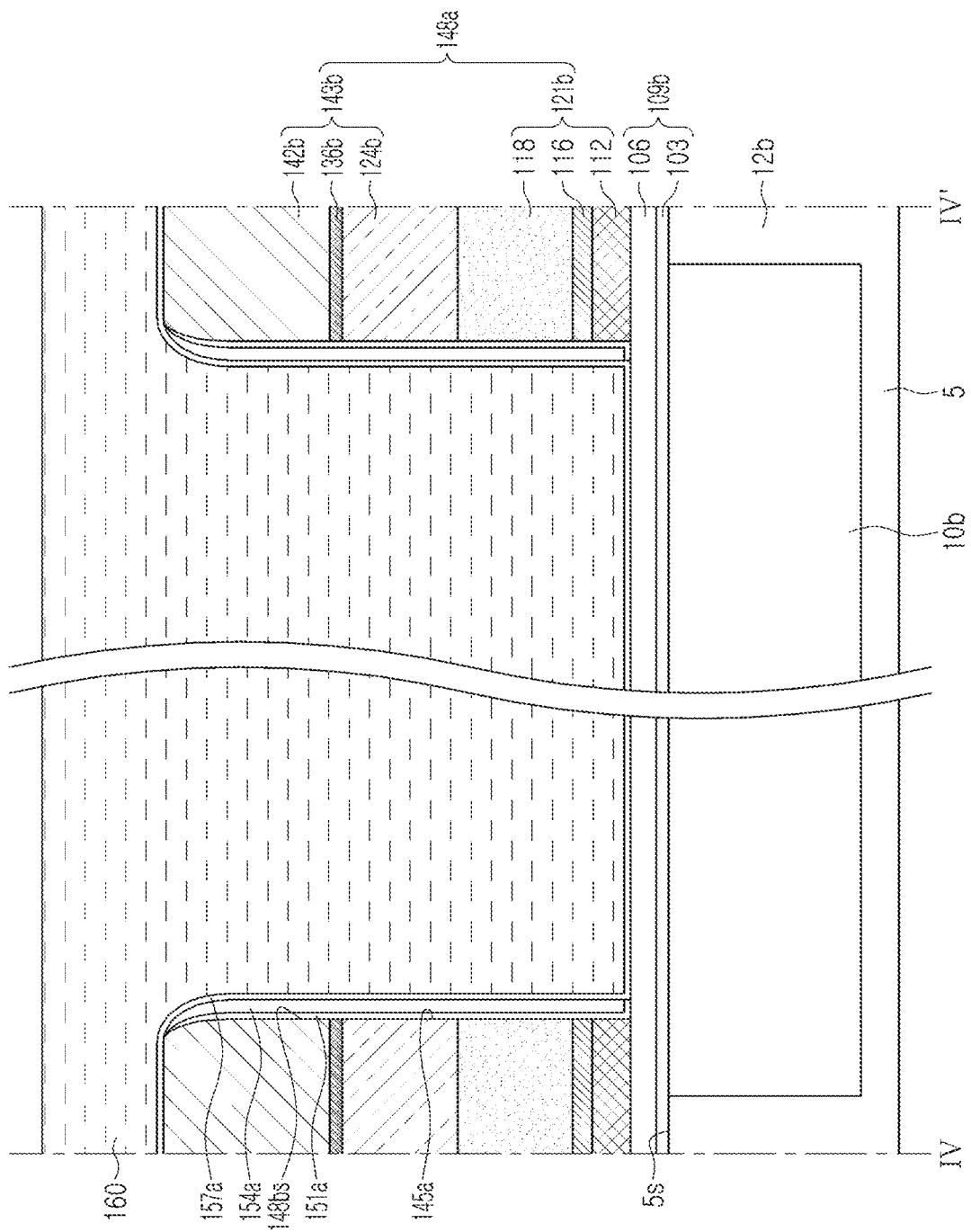
Figure 6C:
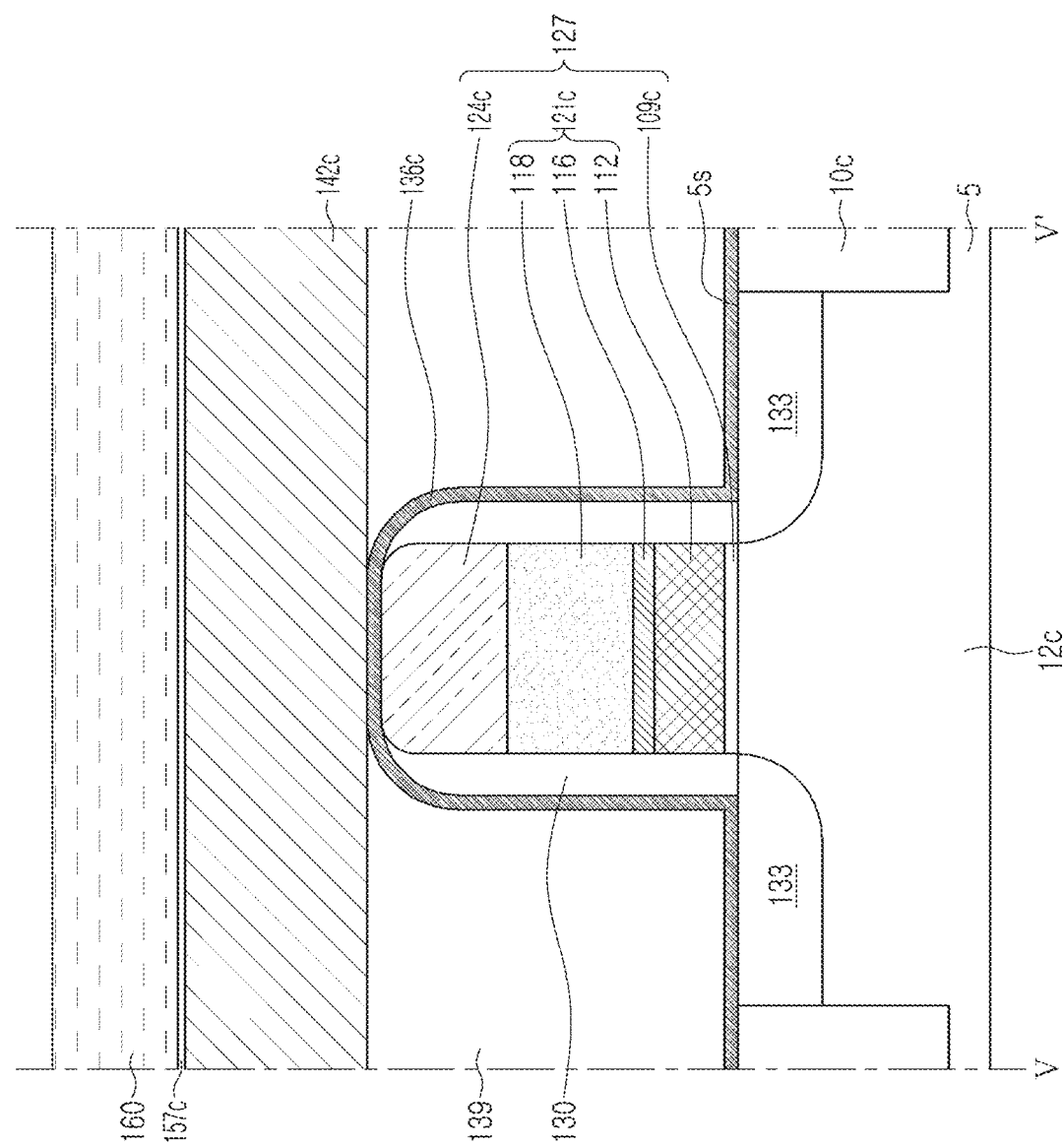
Figure 7A:
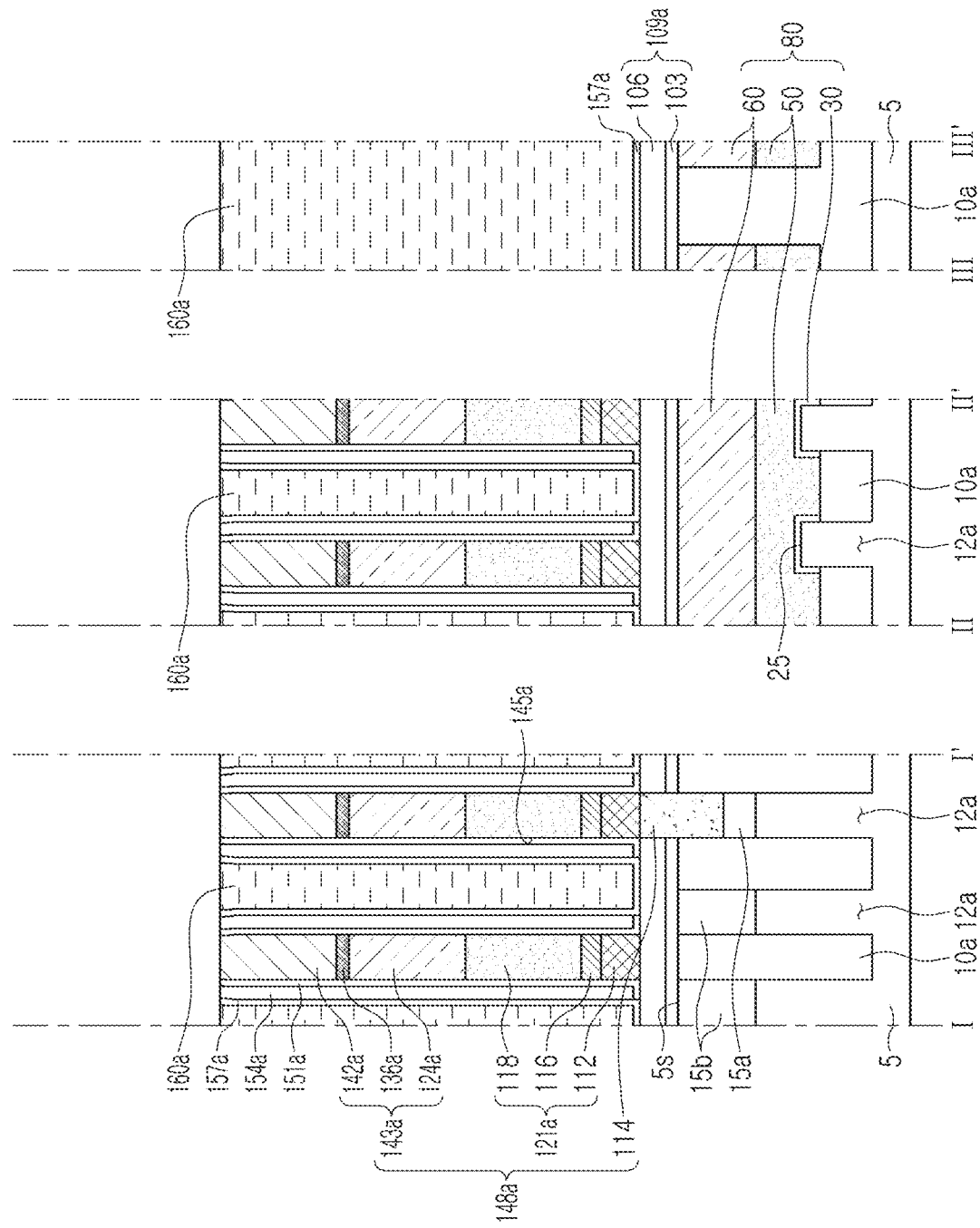
Figure 7B:
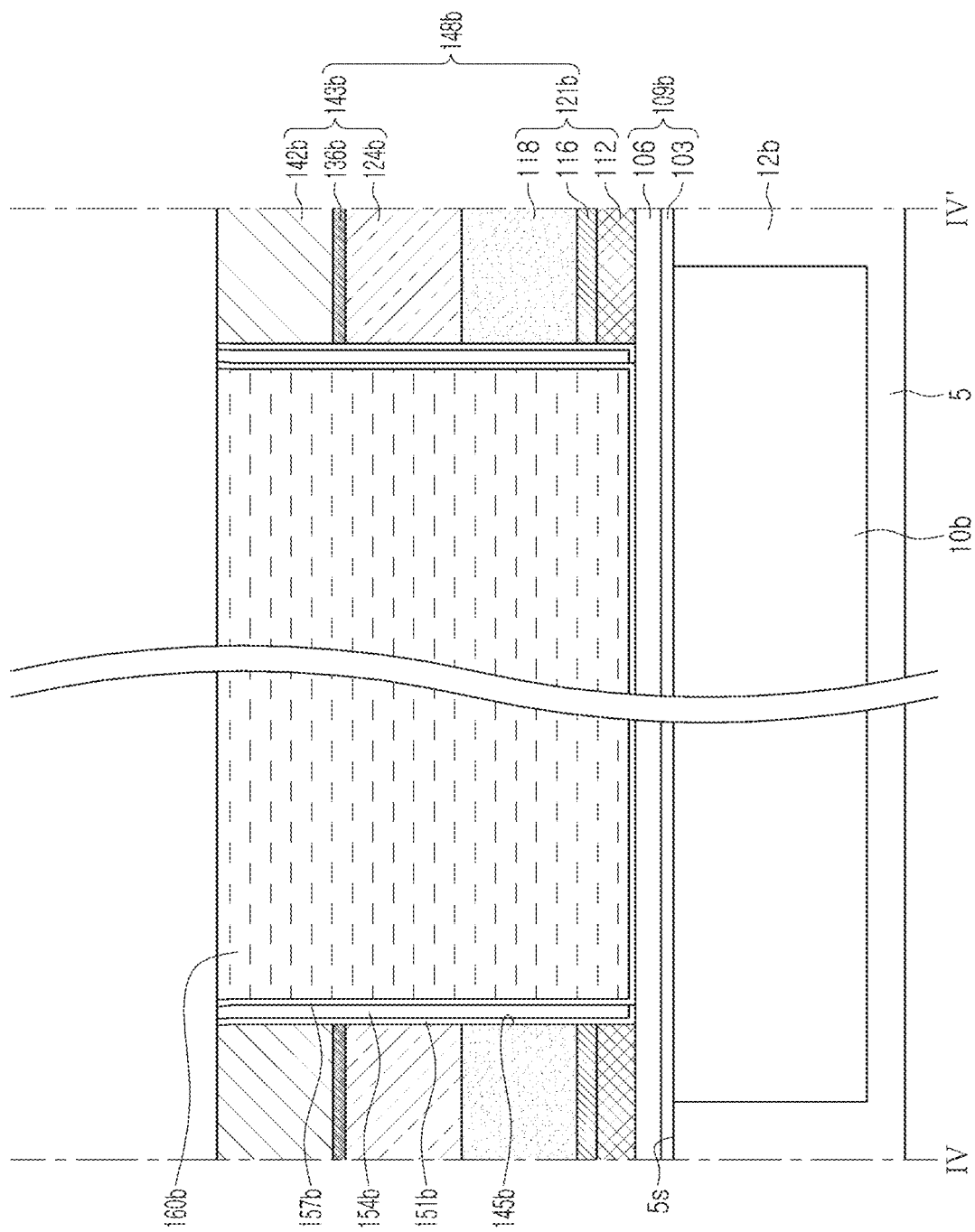

A peripheral gate spacer 130 may be formed on a sidewall 127s of the peripheral gate structure 127 in the third region C, such that the peripheral gate spacer 130 is between the sidewall 127s of the peripheral gate structure 127 and the peripheral interlayer insulation layer (see, 139 of FIG. 5C). In some embodiments, the thickness 130T of the peripheral gate spacer 130 may be greater than a thickness of an individual spacer layer of the one or more spacer layers (see e.g., 151a, 154a, 157a of FIG. 6A described further herein. The peripheral gate spacer 130 may at least partially comprise an insulating material (e.g., silicon oxide, silicon nitride, etc.).

In the third region C, the peripheral gate structure 127 may traverse the third active region 12c and may extend onto the third field region 10c.

In the third region C, peripheral source/drain regions 133 may be formed in the third active region 12c at opposite sides of the peripheral gate structure 127.

The third conductive layer 121c of the peripheral gate structure 127 may be a peripheral gate electrode, and the third insulation layer 109c of the peripheral gate structure 127 may be a peripheral gate insulation layer. The third conductive layer 121c, the third insulation layer 109c, and the peripheral source/drain regions 133 may constitute a peripheral transistor.

Referring to FIGS. 1, 3A, 3B, 3C, 5A, 5B, and 5C, an insulation liner may be conformally formed on the entirety of the substrate 5 having the peripheral gate structure 127 and the peripheral gate spacer 130.

The insulation liner may be formed as a first intermediate capping layer 136a covering the first lower capping layer 124a, in the first region A. The insulation liner may be formed as a second intermediate capping layer 136b covering the second lower capping layer 124b, in the second region B. The insulation liner may be formed as a third intermediate capping layer 136c covering the peripheral gate structure 127, the peripheral gate spacer 130, the peripheral source/drain regions 133, and the third field region 10c, in the third region C. The first to third intermediate capping layers 136a, 136b, and 136c may at least partially comprise an insulating material (e.g., silicon nitride, etc.).

An insulating material may be formed on the first to third intermediate capping layers 136a, 136b, and 136c and may be planarized until upper surfaces of the first to third intermediate capping layers 136a, 136b, and 136c are exposed, thus forming a peripheral interlayer insulation layer 139 remaining in the third region C. The peripheral interlayer insulation layer 139 may at least partially comprise silicon oxide. The peripheral interlayer insulation layer 139 may include a material (e.g., total material composition) that is different from a material (e.g., total material composition) of the lower capping layer 124 and a material (e.g., total material composition) of an upper capping layer 142. The peripheral interlayer insulation layer 139 may be formed on the sidewall 127s of the peripheral gate structure 127. As shown, the insulation liner that is formed as the third intermediate capping layer 136c may be formed prior to forming the peripheral interlayer insulation layer 139.

It will be understood that, as described herein, an element that is "on" another element may be directly on the other element, such that the element contacts the other element, or may be indirectly on the other element that the element is isolated from direct contact with the other element by one or more interposing spaces and/or structures.

The upper capping layer 142 may be formed on the substrate 5 having the peripheral interlayer insulation layer 139.

The upper capping layer 142 may be formed as ("may include") a first upper capping layer 142a covering the first intermediate capping layer 136a in the first region A and thus on the lower capping layer 124 in the first region A. The upper capping layer 142 may be formed as a second upper capping layer 142b covering the second intermediate capping layer 136b in the second region B and thus on the lower capping layer 124 in the second region B. The upper capping layer 142 may be formed as a third upper capping layer 142c covering the third intermediate capping layer 136c and the peripheral interlayer insulation layer 139 in the third region C and thus on the peripheral interlayer insulation layer 139 in the third region C and on the peripheral gate structure 127 in the third region C. The first to third upper capping layers 142a, 142b, and 142c (i.e., the upper capping layer 142) may at least partially comprise the same material (e.g., a same third material), for example, a nitride-based material (e.g., silicon nitride, etc.).

The first pattern structure 148a having the first opening 145a and the second pattern structure 148b having the second opening 145b may be formed on the substrate 5, in operation S10. As shown, the first pattern structure 148a may be on and may extend across the cell gate structure 80. As shown, the first pattern structure 148a may be overlapped with the first impurity region 15a in a direction that is perpendicular or substantially perpendicular (e.g., perpendicular within manufacturing tolerances and/or material tolerances) to an upper surface 5s of the substrate 5.

The first pattern structure 148a may be formed by patterning the first conductive layer 121a, the first lower capping layer 124a, the first intermediate capping layer 136a, and the first upper capping layer 142a that are sequentially stacked. Restated, the singular conductive layer 121, the lower capping layer 124, and the upper capping layer 142 in the first region A and in the second region B may be patterned to form a first pattern structure 148a in the first region A and a second pattern structure 148b in the second region. Accordingly, as shown in at least FIG. 5A, the first pattern structure 148a may include a conductive layer (e.g., first conductive layer 121a) and a capping structure (e.g., first capping structure 143a) that are sequentially stacked. As shown in at least FIG. 5A, the first capping structure 143a may include a plurality of capping layers (e.g., the first lower capping layer 124a, the first intermediate capping layer 136a, and the first upper capping layer 142a) that include an insulating layer (e.g., the material of the first intermediate capping layer 136a). The first pattern structure 148a may include the bit line contact plug 114 described above, such that the first pattern structure 148a includes a bit line contact plug 114 that is between the first conductive layer 121a and the first impurity region 15a. The first pattern structure 148a may have a first opening 145a and the second pattern structure 148b may have a second opening 145b.

The first lower capping layer 124a, the first intermediate capping layer 136a, and the first upper capping layer 142a may form the first capping structure 143a.

In some example embodiments, the first pattern structure 148a may include linear structures spaced apart from each other. In the first pattern structure 148a, the first conductive layer 121a may be a bit line. In the first pattern structure 148a, the first opening 145a may be defined between the spaced linear structures.

The second pattern structure 148b may be formed by patterning the second conductive layer 121b, the second lower capping layer 124b, the second intermediate capping layer 136b, and the second upper capping layer 142b in the second region B. The second lower capping layer 124b, the second intermediate capping layer 136b, and the second upper capping layer 142b may form a second capping structure 143b. Accordingly, as shown in at least FIG. 5B, the second pattern structure 148b may include a conductive layer (second conductive layer 121b) and a capping structure (second capping structure 143b) that are sequentially stacked. Therefore, as shown in at least FIGS. 5A-5B, each pattern structure of the first and second pattern structures 148a and 148b may include a conductive layer and a capping structure that are sequentially stacked. As shown in at least FIG. 5B, the second capping structure 143b may include a plurality of capping layers (e.g., the second lower capping layer 124b, the second intermediate capping layer 136b, and the second upper capping layer 142b) that include an insulating layer (e.g., the material of the second intermediate capping layer 136b).

The second pattern structure 148b may be an align mark or an overlay mark that is used for the photolithography process.

The first opening 145a may have a first width W1, and the second opening 145b may have a second width W2 greater than the first width W1.

The second opening 145b may be formed on the second field region 10b.

Sidewalls of the second pattern structure 148b defining the second opening 145b (or sidewalls of the second opening 145b) may be located on the second field region 10b. The second pattern structure 148b may be overlap the second active region 12b and a portion of the second pattern structure 148b may extend onto the second field region 10b.

Referring to FIGS. 1, 3A, 3B, 3C, 6A, 6B, and 6C, an inner spacer layer and an intermediate spacer layer may be sequentially formed on the substrate 5 having the first and second pattern structures 148a and 148b and then may be anisotropically etched. As a result, a first inner spacer layer 151a and a first intermediate spacer layer 154a (e.g., one or more first spacer layers) may be formed on a sidewall 148as of the first pattern structure 148a, and a second inner spacer layer 151b and a second intermediate spacer layer 154b (e.g., one or more second spacer layers) may be formed on the sidewalls 148bs of the second pattern structure 148b.

The first and second inner spacer layers 151a and 151b may at least partially comprise a nitride-based material (e.g., silicon nitride, etc.). The first and second intermediate spacer layers 154a and 154b may at least partially comprise an oxide-based material (e.g., silicon oxide, etc.).

An outer spacer layer may be conformally formed on the substrate 5 on which the first and second inner spacer layers 151a and 151b and the first and second intermediate spacer layers 154a and 154b are formed.

The outer spacer layer may be formed as a first outer spacer layer 157a conformally covering an upper surface of the first pattern structure 148a, the first intermediate spacer layer 154a, and a lower surface of the first opening 145a, in the first region A. Accordingly, an inner spacer layer (e.g., first inner spacer layer 151a), an intermediate spacer layer (e.g., first intermediate spacer layer 154a), and an outer spacer layer (e.g., first outer spacer layer 157a) may be formed to be sequentially stacked on a sidewall of a pattern structure (e.g., sidewall 148as of the first pattern structure 148a), subsequently to forming the pattern structure (e.g., first pattern structure 148a). In some embodiments, as shown in FIGS. 5A-5C, each of the inner spacer layer (e.g., first inner spacer layer 151a), intermediate spacer layer (e.g., first intermediate spacer layer 154a), and outer spacer layer (e.g., first outer spacer layer 157a) may be thinner than the thickness 130T of the peripheral gate spacer 130, and may have a height (e.g., in a direction extending perpendicular or substantially perpendicular to the upper surface 5s of the substrate 5) that is greater than the height of the peripheral gate spacer 130. The outer spacer layer may be formed as a second outer spacer layer 157b conformally covering an upper surface of the second pattern structure 148b, the second intermediate spacer layer 154b, and a lower surface of the second opening 145b, in the second region B. The outer spacer layer may be formed as a third outer spacer layer 157c conformally covering the third upper capping layer 142c in the third region C. The first to third outer spacer layers 157a, 157b, and 157c may at least partially comprise a nitride-based material (e.g., silicon nitride, etc.).

The gap fill material layer 160 may be formed on the first and second pattern structures 148a and 148b in operation S15. The gap fill material layer 160 may be formed on the first to third outer spacer layers 157a, 157b, and 157c. The gap fill material layer 160 may fill the first and second openings 145a and 145b. The gap fill material layer 160 may at least partially comprise an oxide-based material (e.g., silicon oxide, etc.).

Referring to FIGS. 1, 3A, 3B, 3C, 7A, and 7B, the gap fill material layer 160 may be planarized to form the first gap fill layer 160a remaining in the first opening 145a and the second gap fill layer 160b remaining in the second opening 145b, in operation S20.

The gap fill material layer 160 may be planarized by a chemical mechanical polishing (CMP) process until upper surfaces of the first to third upper capping layers 142a, 142b, and 142c are exposed. In some example embodiments, the gap fill material layer 160 may be further planarized by the CMP process, such that the upper surfaces of the first to third upper capping layers 142a, 142b, and 142c may be lowered.

Referring to FIGS. 1, 3A, 3B, 3C, and 8, the first gap fill layer 160a may be patterned to form a plurality of first gap fill patterns 160a' and the fence holes 163 in the first opening 145a, in operation S25. In the first opening 145a, each separate fence hole 163 of the fence holes 163 may be formed between a separate set of adjacent first gap fill patterns 160a'.

Figure 8:
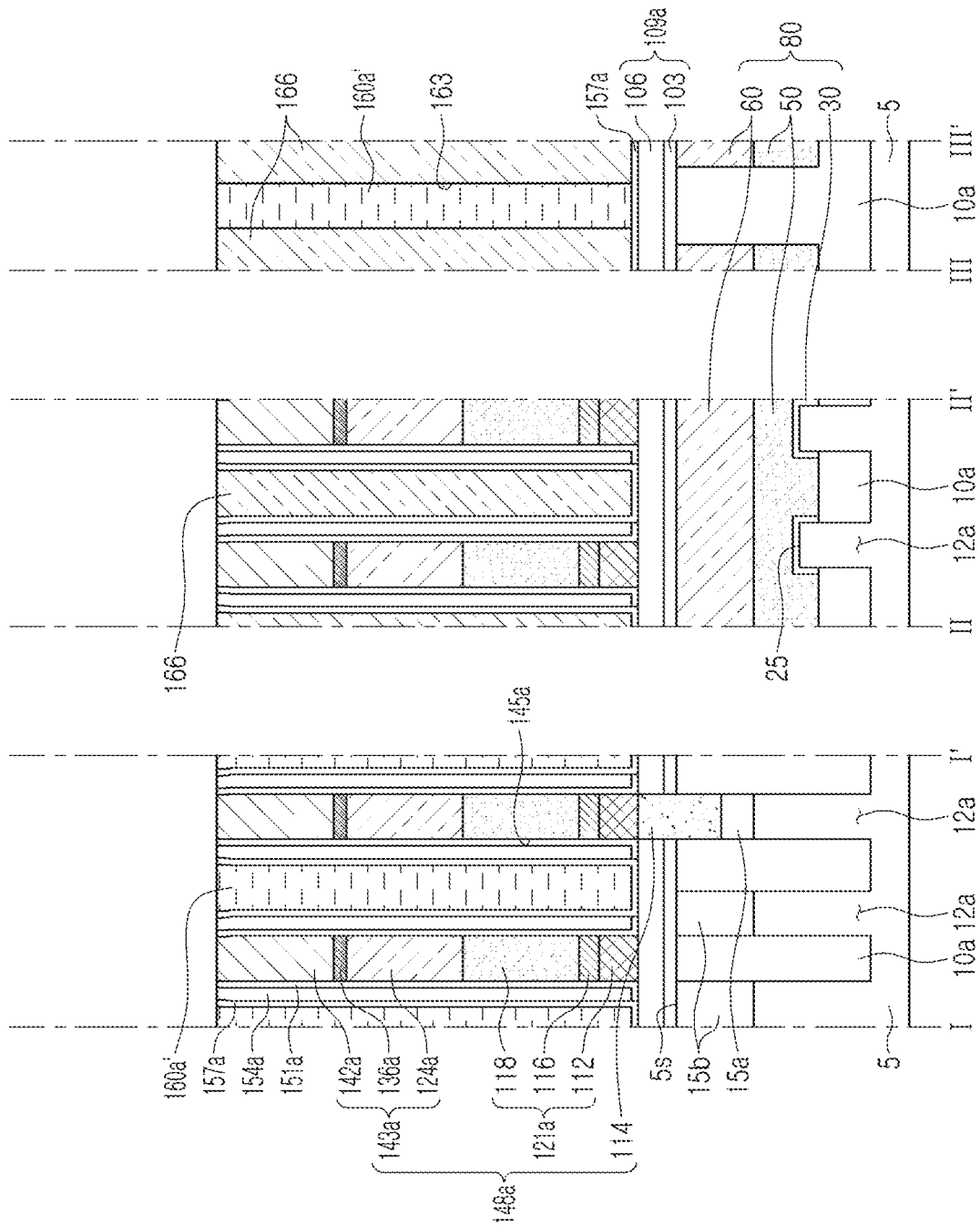
Figure 9:
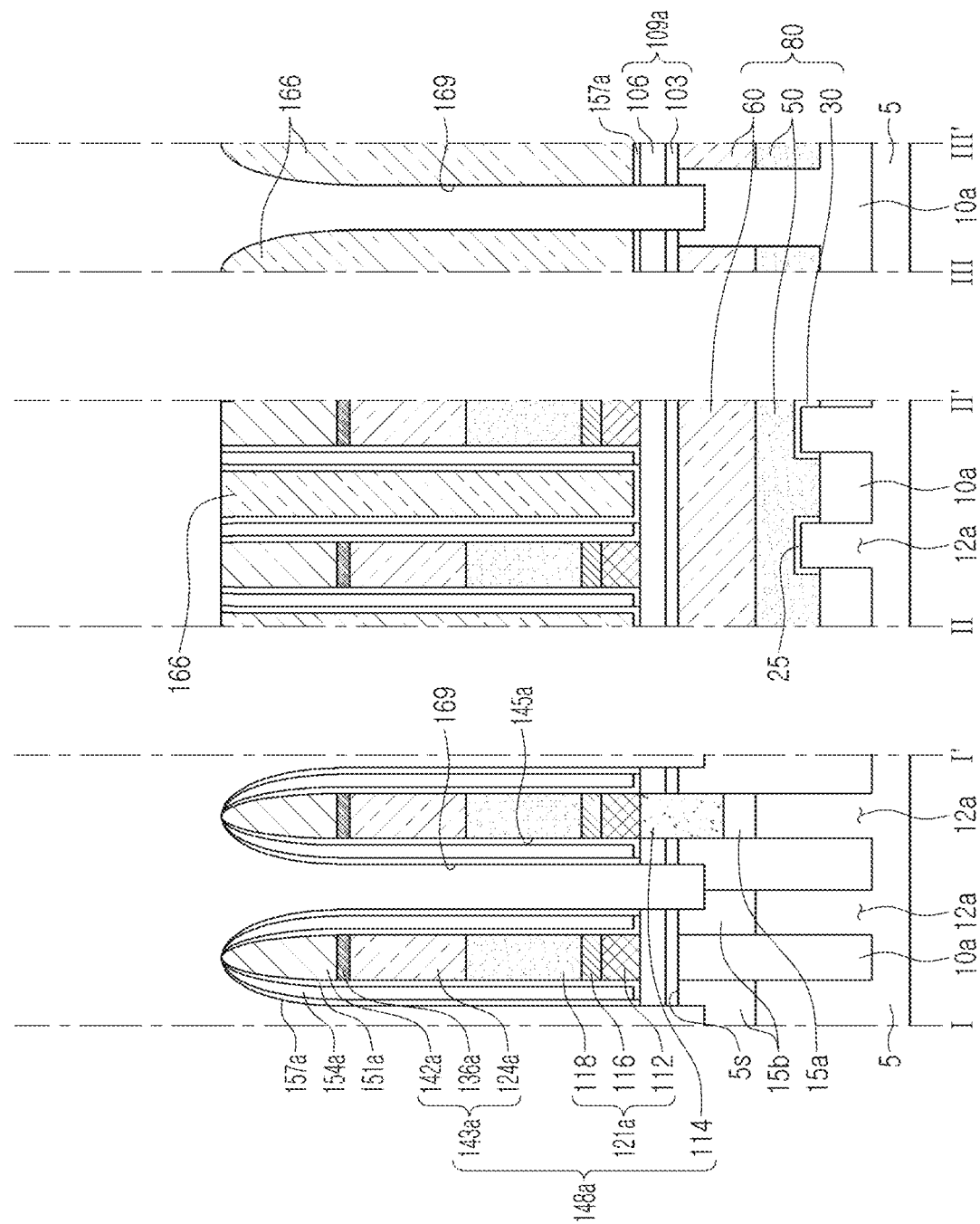

The fences 166 may be formed in the fence holes 163, in operation S30 based on filling the fence holes 163, as shown in at least FIG. 8. The fences 166 may include a material (e.g., a total material composition) that is different from a material (e.g., a total material composition) of the first gap fill layer 160a and/or the second gap fill layer 160b. The fences 166 may at least partially comprise a nitride-based material (e.g., silicon nitride, etc.).

Referring to FIGS. 1, 3A, 3B, 3C, and 9, the first gap fill patterns 160a' may be removed and the contact holes 169 may be formed, in operation S35. The contact holes 169 may be formed in the first region A and may refer to "first contact holes".

The first contact holes 169 may be formed by removing the first gap fill patterns 160a' and also etching the first outer spacer layer 157a and the first insulation layer 109a below the first gap fill patterns 160a' to expose a portion of each of the first active regions 12a. The first contact holes 169 may expose the second impurity regions 15b in the first active regions 12a.

Referring to FIGS. 1, 3A, 3B, 3C, and 10, preliminary lower contact patterns 172 may be formed to partly fill the first contact holes 169, such that at least a portion of each first contact hole 169 is not filled by the preliminary lower contact patterns 172. In some example embodiments, the preliminary lower contact patterns 172 may be referred to as simply "lower contact patterns". The preliminary lower contact patterns 172 may at least partially comprise polysilicon. The preliminary lower contact patterns 172 may be electrically connected to the second impurity regions 15b. A portion of the first outer spacer layer 157a and a portion of the first intermediate spacer layer 154a may be etched. For example, a portion of the first outer spacer layer 157a and a portion of the first intermediate spacer layer 154a in upper portions of the first contact holes 169 and over the preliminary lower contact patterns 172 may be removed by etching. Accordingly, at least a portion of the one or more first spacer layers may be removed subsequent to forming the preliminary lower contact patterns 172.

Figure 10:
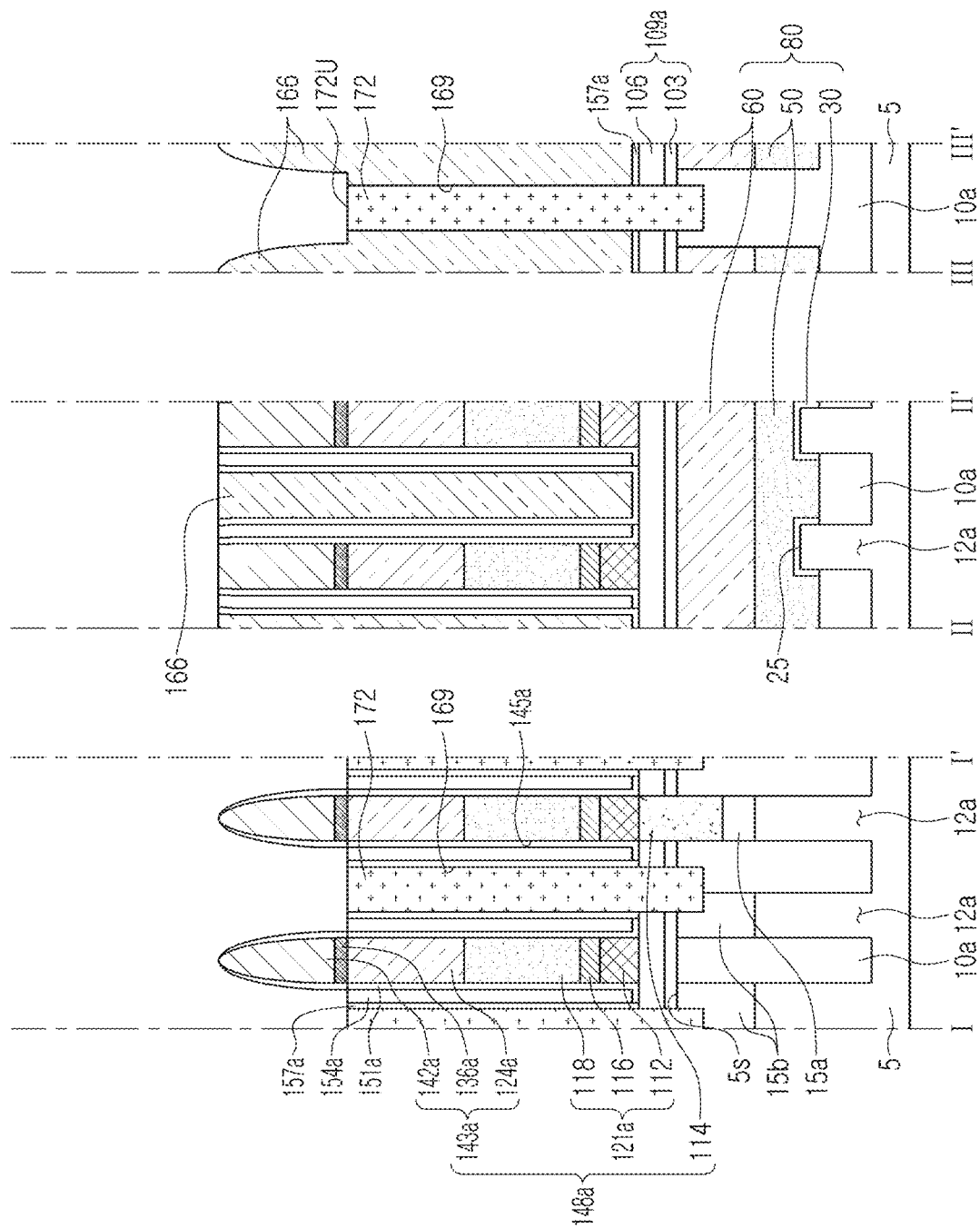
Figure 11:
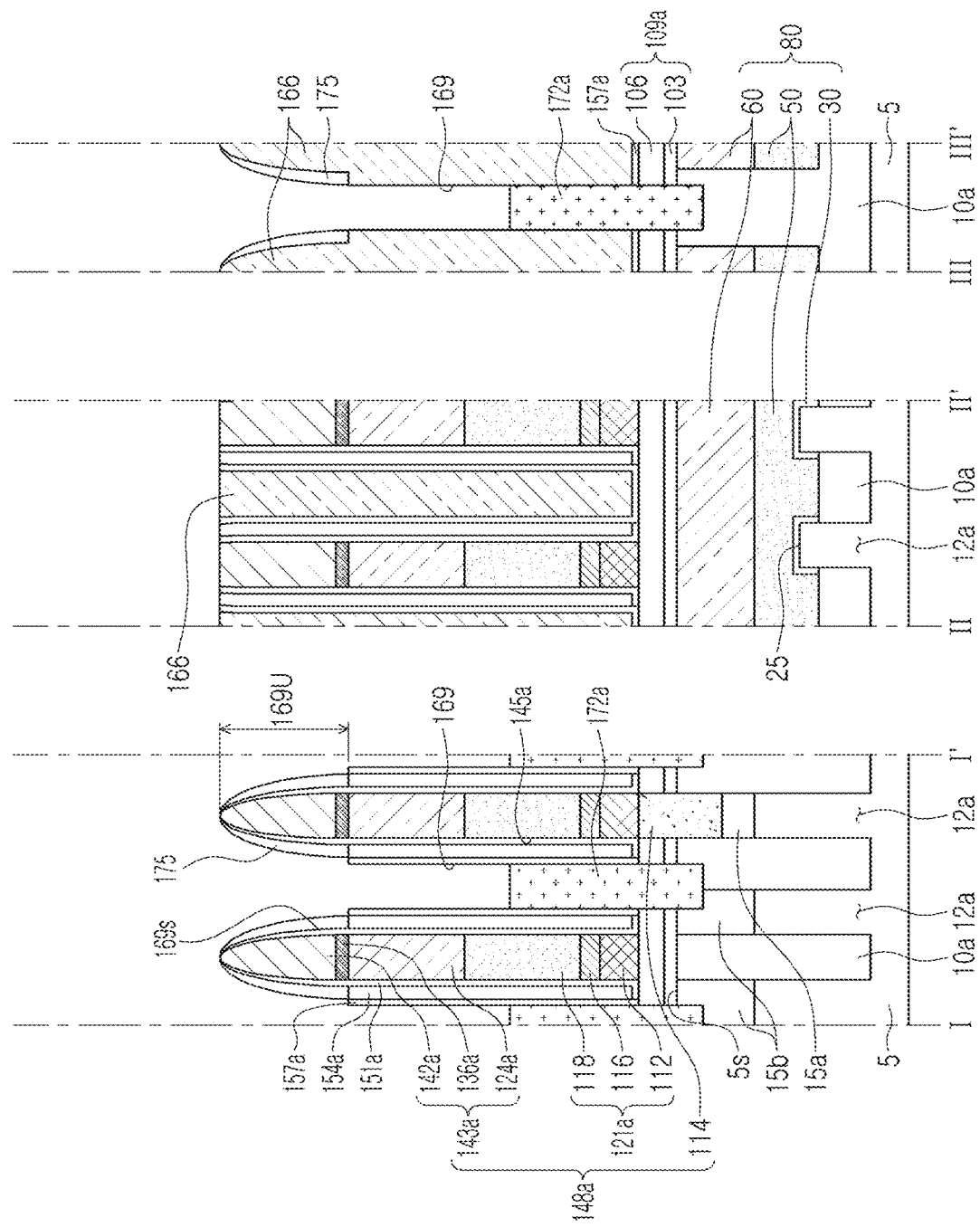
Figure 12:
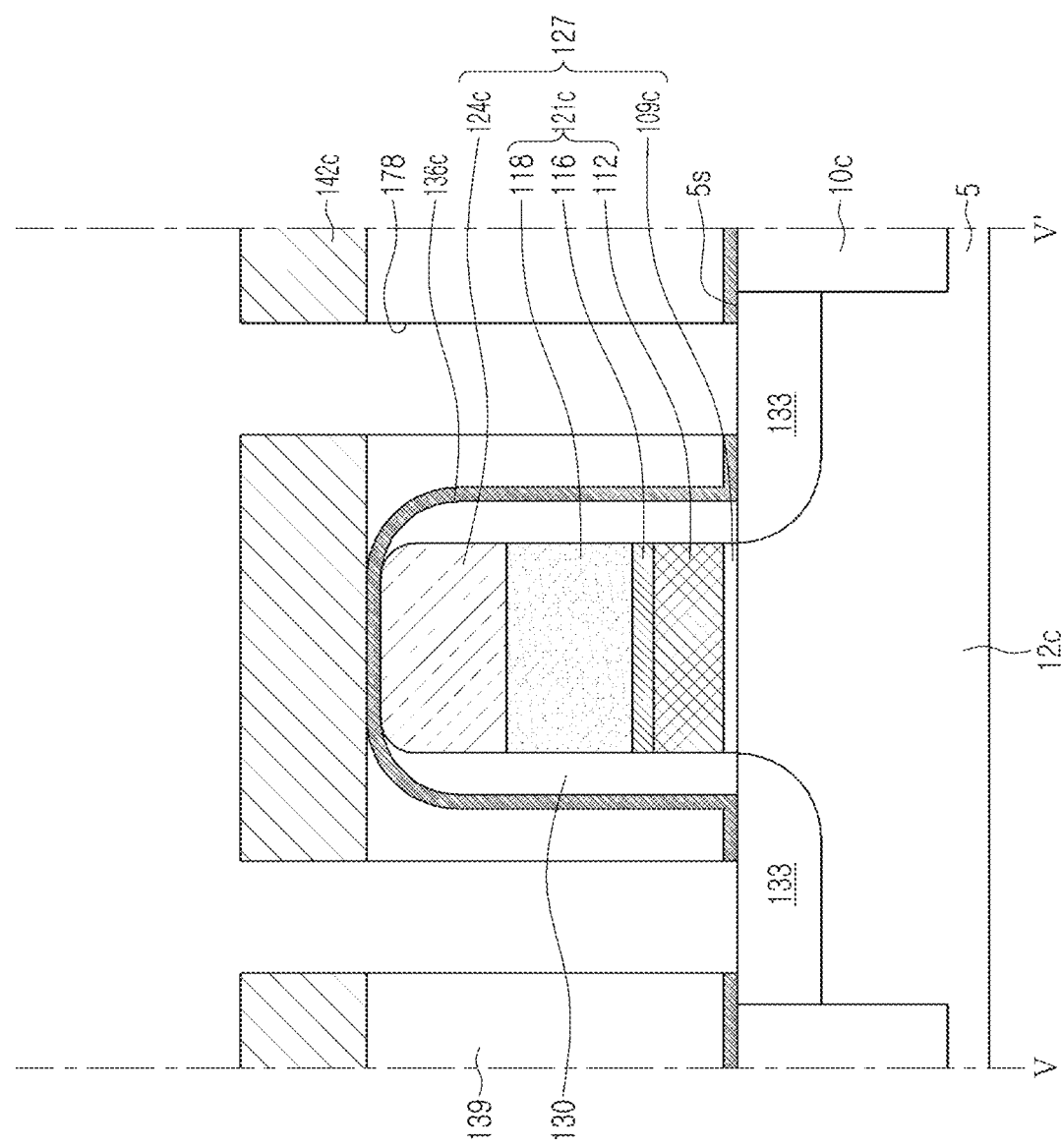
Figure 13A:
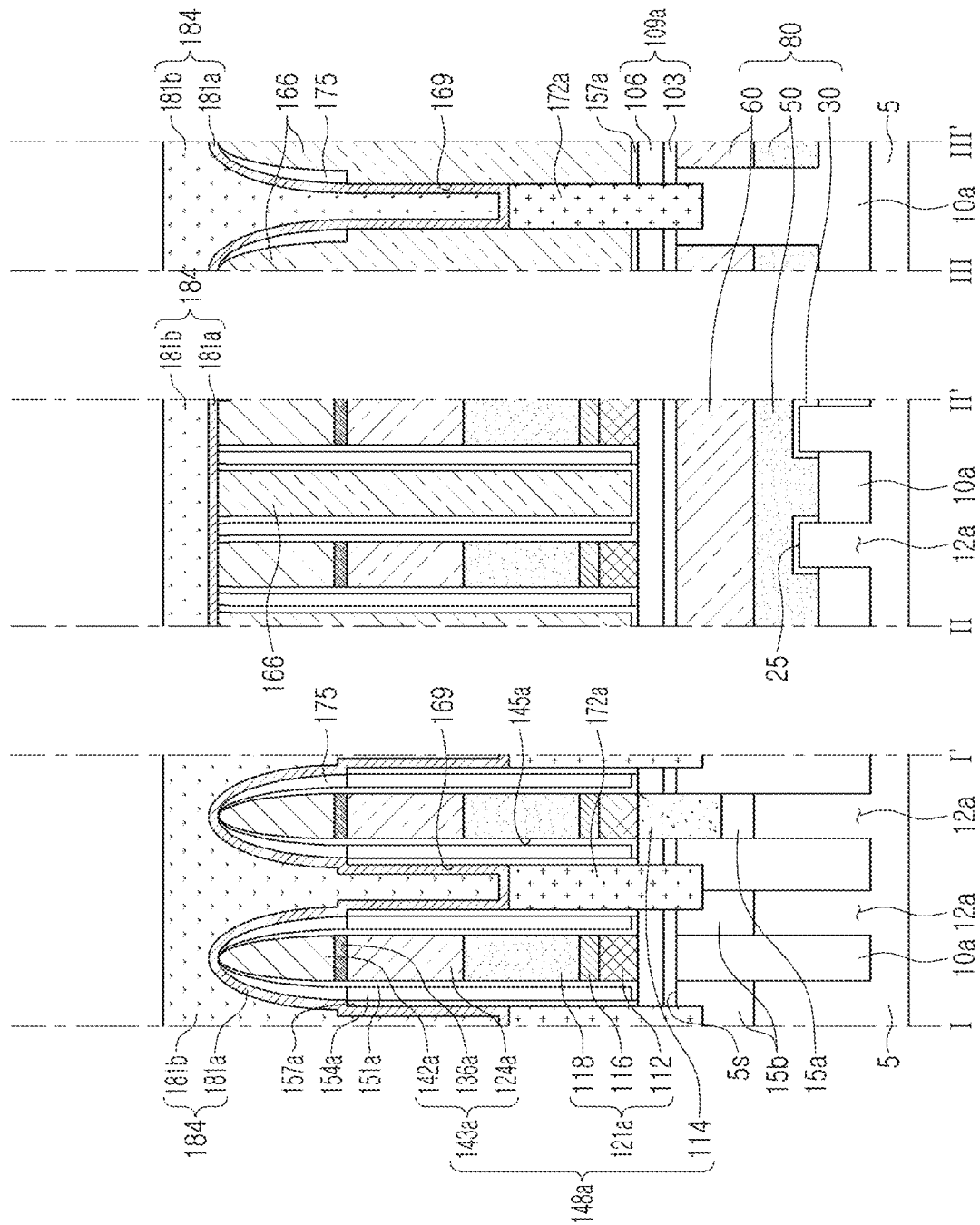
Figure 13B:
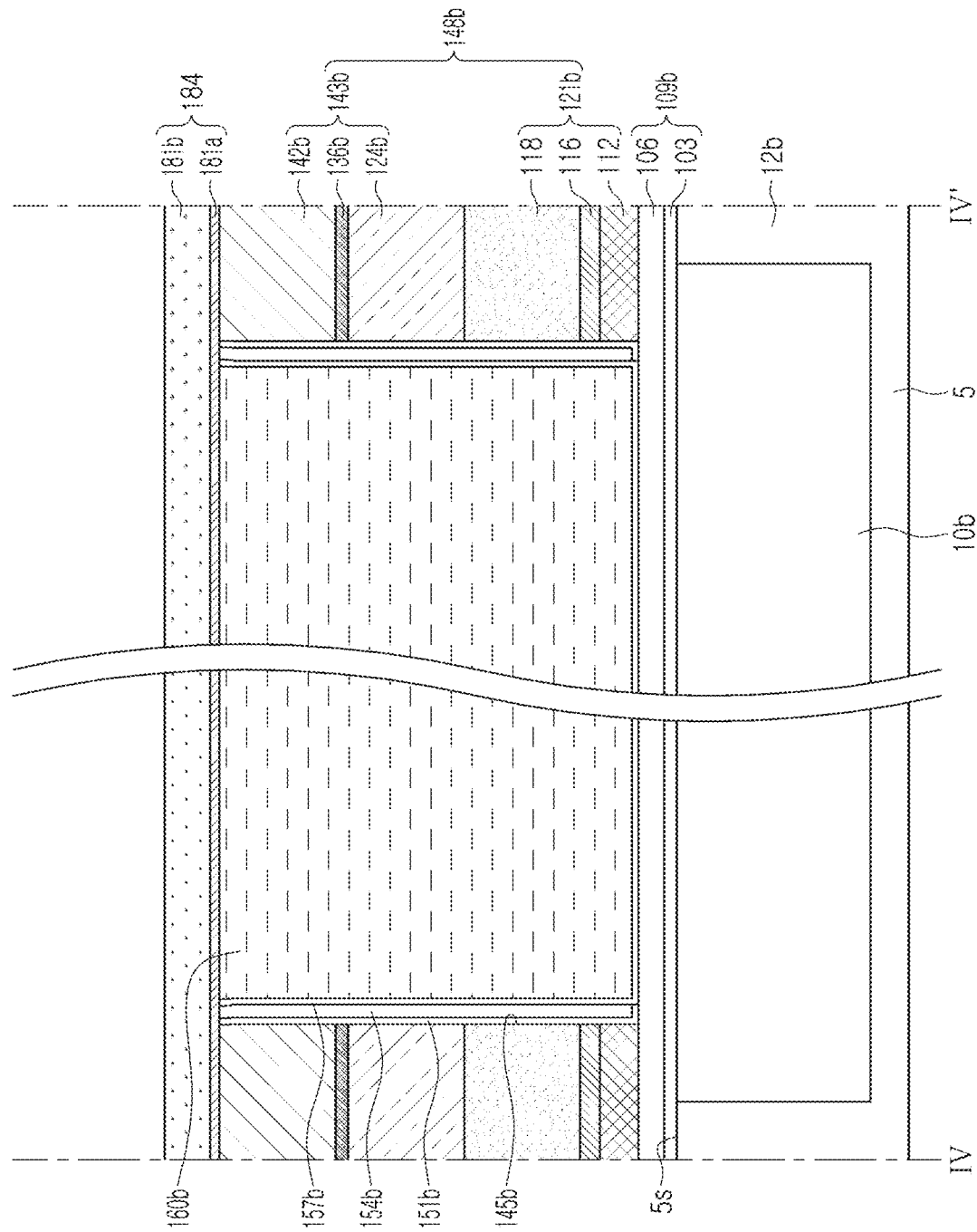
Figure 13C:
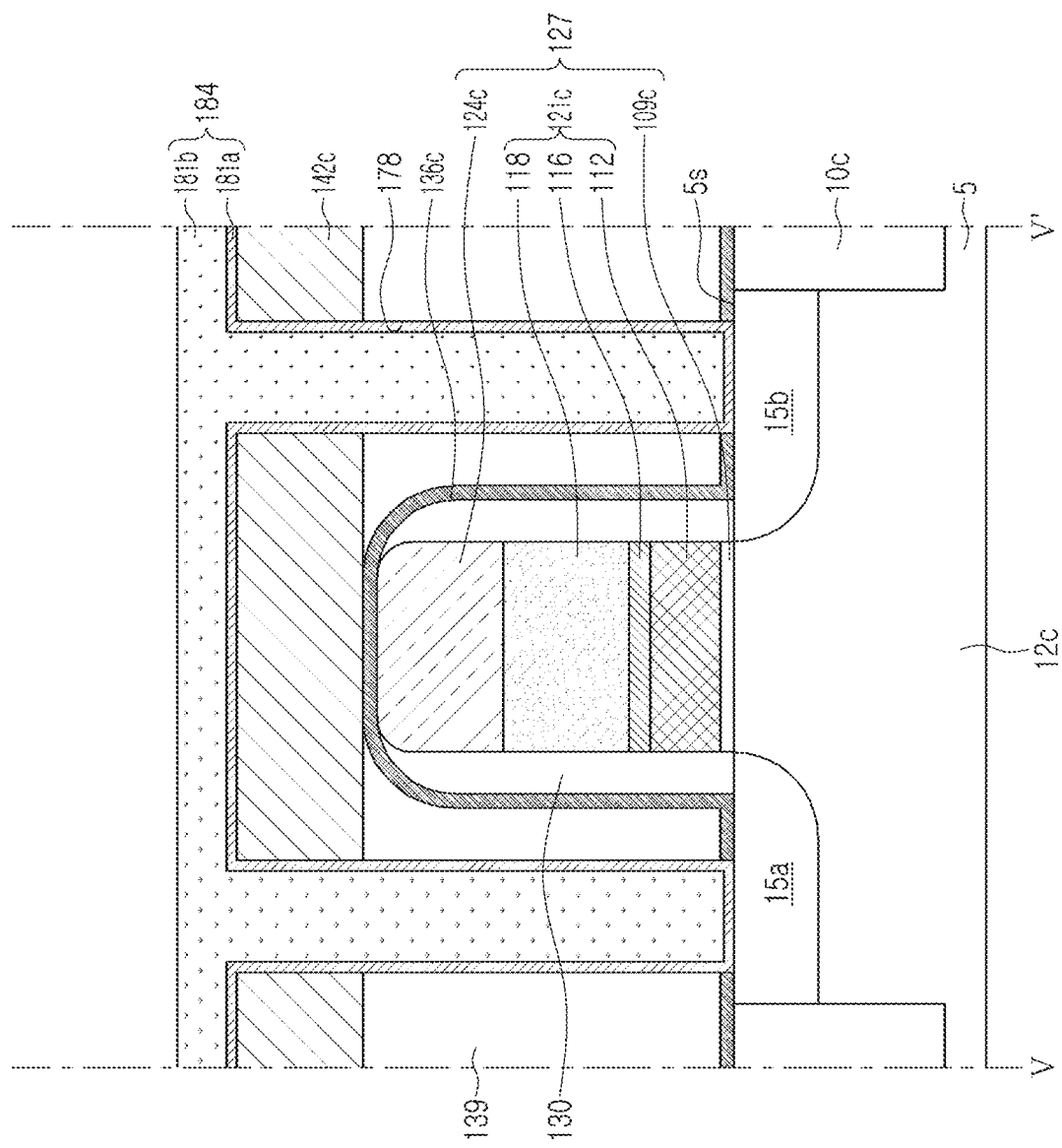
Figure 14A:
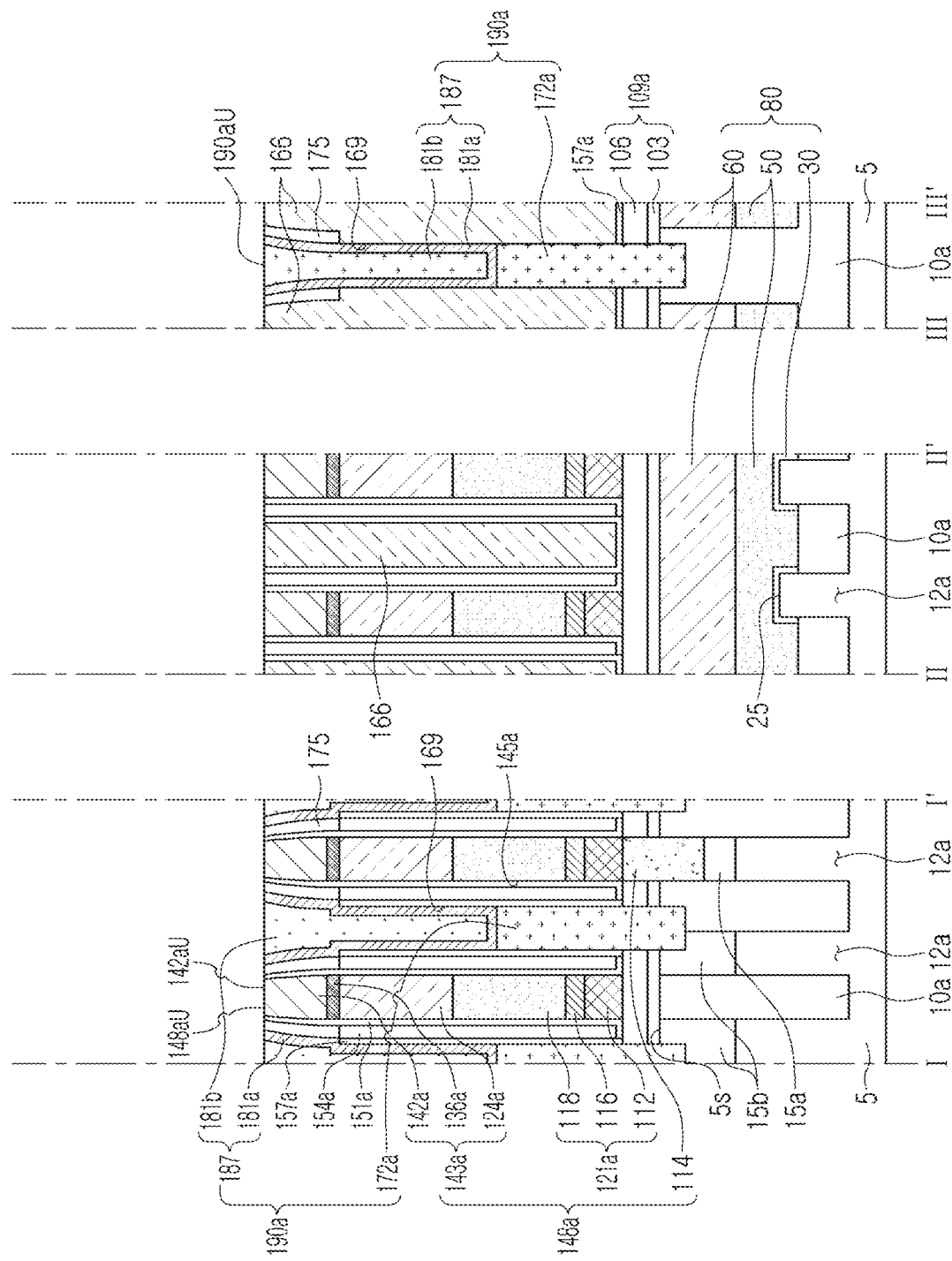
Figure 14B:
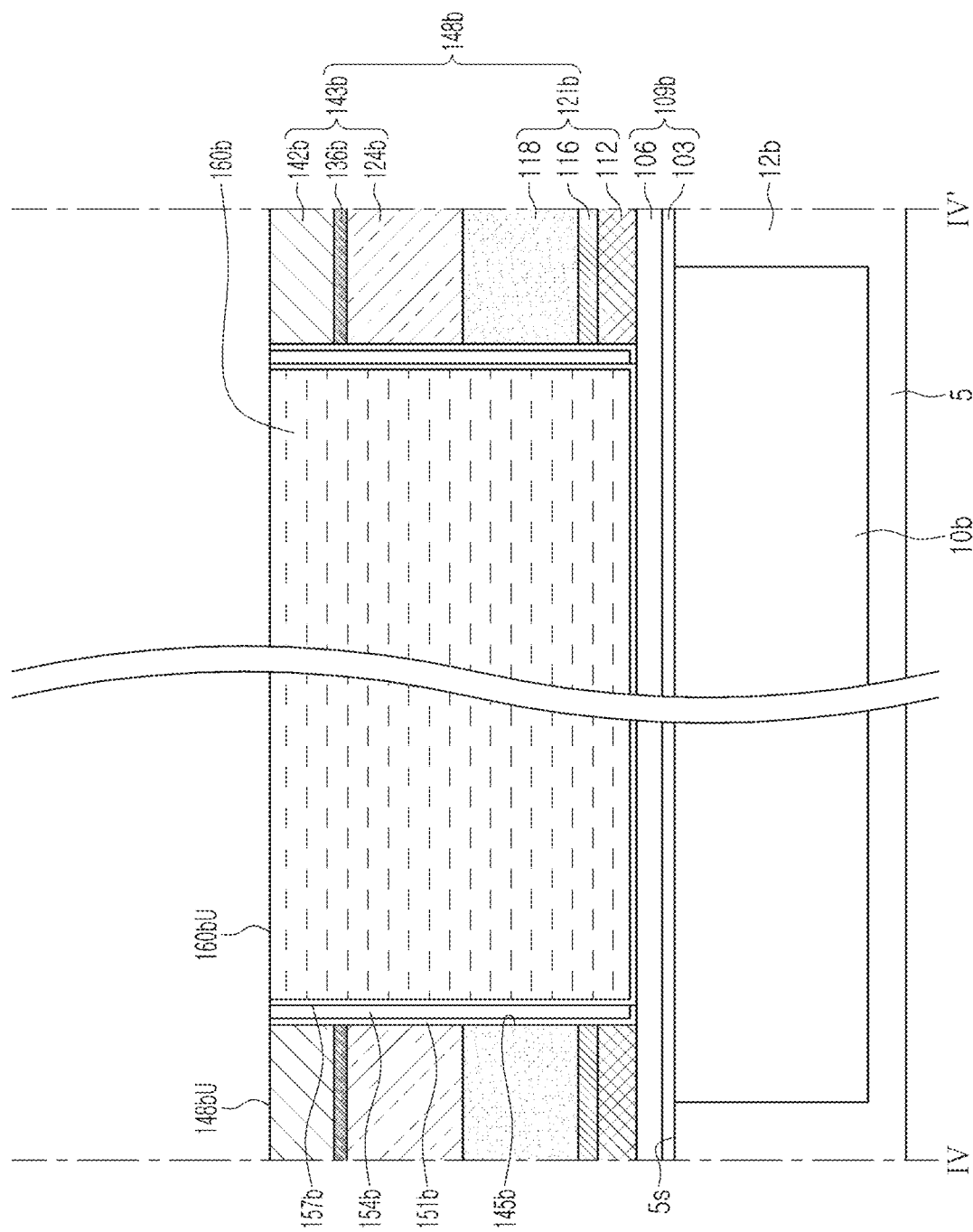
Figure 14C:
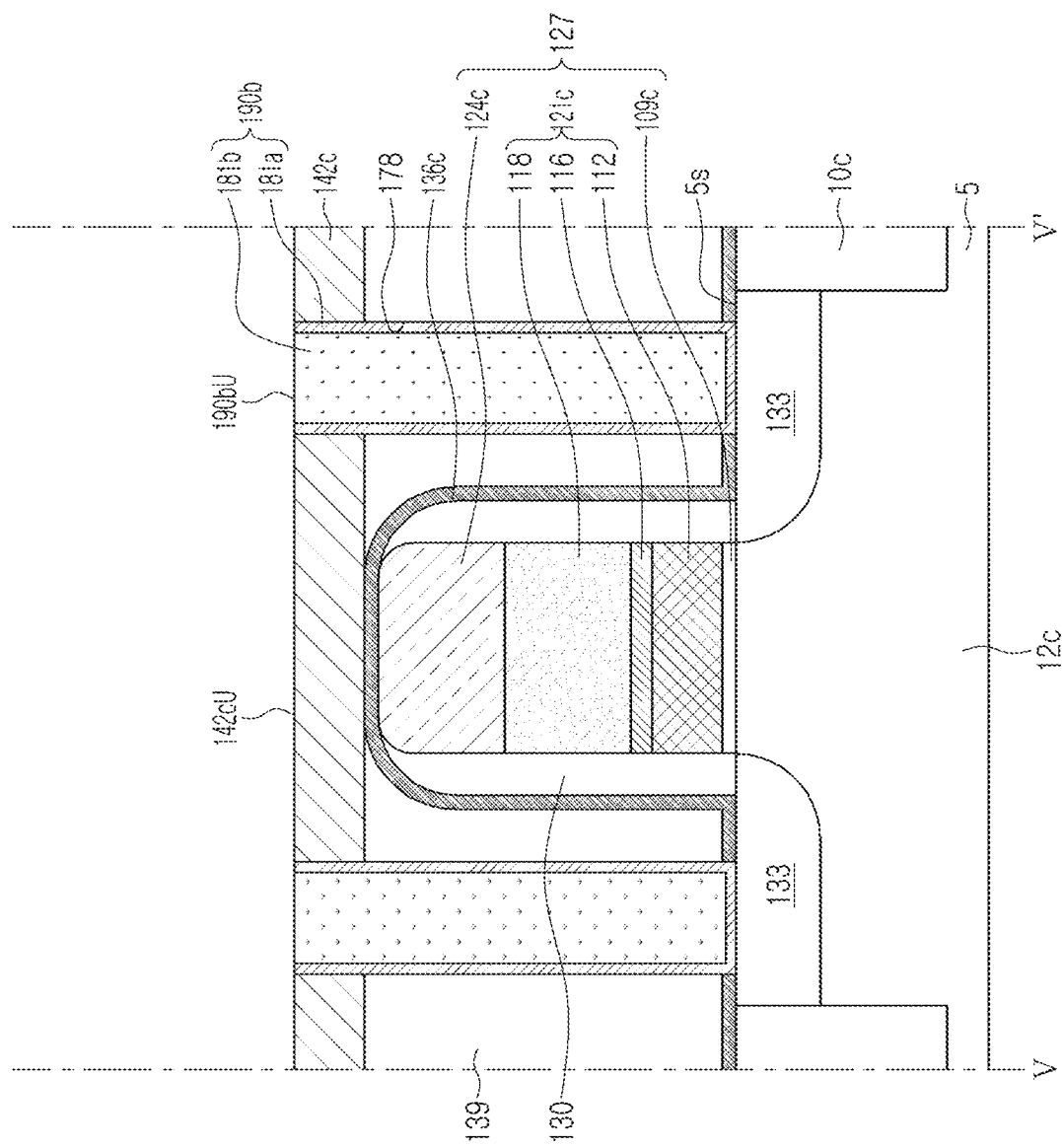
Figure 15:
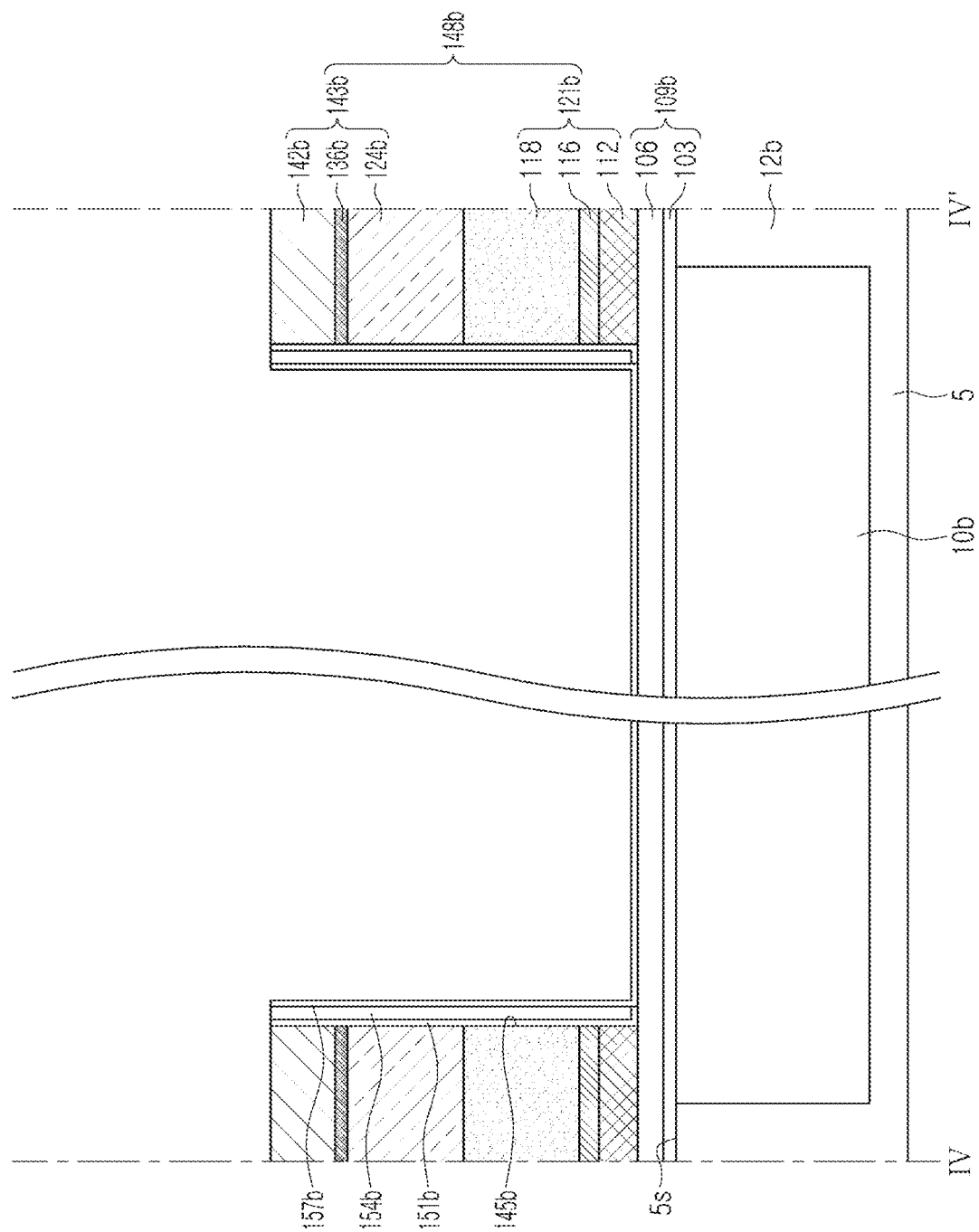

In some example embodiments, and as shown in at least FIG. 10, upper surfaces 172U of the preliminary lower contact patterns 172 may be higher than an upper surface of the first conductive layer 121a with respect to the upper surface 5s of the substrate 5.

An upper spacer layer 175 may be formed on sidewalls 169s of the upper portions 169U of the first contact holes 169. The upper spacer layer 175 may at least partially comprise an insulation material, for example, a nitride-based material.

Referring to FIGS. 1, 3A, 3B, 3C, and 11, the preliminary lower contact patterns 172 may be partly etched to form lower contact patterns 172a, such that the lower contact patterns 172a partly fill the first contact holes 169.

In some example embodiments, upper surfaces of the lower contact patterns 172a may be lower than an upper surface of the first conductive layer 121a with respect to the upper surface 5s of the substrate 5.

Referring to FIGS. 1, 3A, 3B, 3C, and 12, in third region C, second contact holes 178 may be formed to expose the peripheral source/drain regions 133.

The second contact holes 178 may be formed after the lower contact patterns 172a is formed in the first region A. The second contact holes 178 may pass ("extend") through the upper capping layer 142 (e.g., the third upper capping layer 142c), the peripheral interlayer insulation layer 139, and the third intermediate capping layer 136c to expose the peripheral source/drain regions 133.

Referring to FIGS. 1, 3A, 3B, 3C, 13A, 13B, and 13C, the contact material layer 184 may be formed in the first contact holes 169 in operation S40. The contact material layer 184 may be formed on the lower contact patterns 172a in the first contact holes 169. As shown in at least FIGS. 13A-13C, the contact material layer 184 may be formed on the lower contact patterns 172a, the first pattern structure 148a and the fences 166 in the first region A, and on the upper capping layer 142 (e.g., the third upper capping layer 142c) and in the second contact holes 178 in the third region C. The contact material layer 184 may cover the first pattern structure 148a, the second pattern structure 148b, the fences 166, and the second gap fill layer 160b. The contact material layer 184 may include a barrier material layer 181a and a metal layer 181b that are sequentially formed. The barrier material layer 181a may be formed thinner than the metal layer 181b.

In some example embodiments, the barrier material layer 181a may at least partially comprise a conductive material such as Ti/TiN, and the metal layer 181b may at least partially comprise metal such as tungsten (W). However, the barrier material layer 181a and the metal layer 181b are not limited thereto and may at least partially comprise other conductive materials, for example.

Referring to FIGS. 1, 3A, 3B, 3C, 14A, 14B, and 14C, the contact material layer 184 may be planarized based on the CMP process to form the contact patterns remaining in the first and second contact holes 169 and 178, respectively, in operation S45.

The contact patterns in the first contact holes 169 may refer to upper contact patterns 187. In the first contact holes 169, the contact material layer 184 may be planarized to form upper contact patterns 187 in the first contact holes 169 having the lower contact patterns 172a. The upper contact patterns 187 may be formed on and electrically connected to the lower contact patterns 172a.

Each of the lower contact patterns 172a and each of the upper contact patterns 187 that are sequentially stacked in each of the first contact holes 169 may constitute each of first contact structures 190a. Accordingly, the first contact structures 190a may be formed in the first contact holes 169. Further accordingly, fences 166 and first contact structures 190a may be formed in the first opening 145a. The contact patterns remaining in the second contact holes 178 may refer to second contact structures 190b. As shown in at least FIG. 14C, a separate second contact structure 190b may be on each of the peripheral source/drain regions 133 and may extend through the upper capping layer 142 (e.g., third upper capping layer 142c) and the peripheral interlayer insulation layer 139.

The first contact structures 190a may be formed in the first contact holes 169, respectively. The second contact structures 190b may be formed in the second contact holes 178, respectively and thus may remain in separate, respective second contact holes 178. Accordingly, the first contact structure 190a and the second contact structures 190b may be formed based on planarizing the contact material layer 184. As shown, the first contact structures 190a may include upper contact patterns 187 in the first contact holes 169 and lower contact patterns 172b on (e.g., below) separate, respective upper contact patterns 187. As shown in at least FIG. 14A, a first contact structure 190a may be on the second impurity region 15b. As further shown in at least FIG. 14A, one or more first spacer layers (e.g., 151a, 154a, and 157a) may be between the first pattern structure 148a and a first contact structure 190a.

It will be understood that, as described herein, an element that is "on" another element may be "above," "below," "next to," and/or "around" the other element.

The upper contact patterns 187 and the second contact structures 190b may at least partially comprise the same material. For example, each of the upper contact patterns 187 and the second contact structures 190b may at least partially comprise the metal layer 181b and the barrier material layer 181a covering sidewalls and a lower surface of the metal layer 181b.

Portions of the first to third upper capping layers 142a, 142b, and 142c may be planarized by the CMP process for planarizing the contact material layer 184, such that the upper surfaces of the first to third upper capping layers 142a, 142b, and 142c may be lowered. Since the first and second contact structures 190a and 190b are formed by the planarization of the contact material layer 184, upper surfaces 190aU and 190bU of the first and second contact structures 190a and 190b may be coplanar with each other. For example, the upper surfaces 190aU and 190bU of the first and second contact structures 190a and 190b may be located at the same level with respect to an upper surface 5s of the substrate 5. The upper surfaces 190aU and 190bU of the first and second contact structures 190a and 190b may be coplanar with an upper surface 142aU of the first upper capping layer 142a and an upper surface 142cU of the third upper capping layer 142c.

After the first and second contact structures 190a and 190b are formed, in the second region B, an upper surface 160bU of the second gap fill layer 160b in the second opening 145b of the second pattern structure 148b may be exposed. It will be understood that planarizing the contact material layer 184 to form the first and second contact structures 190a and 190b remaining in the first and second contact holes 169 and 178 may expose one or more upper surfaces 148aU of the first pattern structure 148a, one or more upper surfaces 148bU of the second pattern structure 148b, and one or more upper surfaces 160bU of the second gap fill layer 160b.

The second gap fill layer 160b may act to prevent the second pattern structure 148b from being damaged by the CMP process for planarizing the contact material layer 184.

Referring to FIGS. 2, 3A, 3B, 3C, and 15, the second gap fill layer 160b in the second opening 145b may be removed in operation S50. When the second gap fill layer 160b is removed, the second outer spacer layer 157b may be exposed in the second opening 145b.

Referring to FIGS. 2, 3A, 3B, 3C, 16A, 16B, and 16C, the upper conductive layer 192 may be formed on the substrate 5 in operation S55, subsequent to forming the first and second contact structures 190a and 190b. The upper conductive layer 192 may include metal, for example, tungsten. The upper conductive layer 192 may cover the first region A, the second region B, and the third region C. Thus, the upper conductive layer 192 may cover the second pattern structure 148b having the second opening 145b.

A thickness 192T of the upper conductive layer 192 may be smaller ("less") than a depth 145bT of the second opening 145b. Thus, the upper conductive layer 192 may cover the sidewalls 145bSW and the lower surface 145bLS of the second opening 145b. As shown in at least FIG. 16B, the upper conductive layer 192 may cover the upper surface 148bu and a sidewall 148bs of the second pattern structure 148b and a lower surface 145bLS of the second opening 145b.

In the second region B, the upper conductive layer 192 may include a first portion 192a covering the upper surface of the second pattern structure 148b, a second portion 192b covering the sidewalls of the second pattern structure 148b, and a third portion 192c covering the lower surface of the second opening 145b. The first portion 192a and the third portion 192c of the upper conductive layer 192 may be located at different levels with respect to the upper surface 5s of the substrate 5. In the second region B, the upper conductive layer 192 may include the first to third portions 192a, 192b, and 192c forming a step.

The mask pattern 194 may be formed based on a photolithography process using the second pattern structure 148b covered by the upper conductive layer 192 as an align mark, in operation S60. The mask pattern 194 may be a photoresist pattern or a hard mask pattern formed by using a photoresist pattern.

In the second region B, the first to third portions 192a, 192b, and 192c of the upper conductive layer 192 may form the step, and thus the align mark may be formed by the step of the upper conductive layer 192 covering the second pattern structure 148b having the second opening 145b.

The mask pattern 194 may expose a portion of the upper conductive layer 192 in the first region A and a portion of the upper conductive layer 192 in the third region C. In some example embodiments, the mask pattern 194 may expose the upper conductive layer 192 in the second region B.

Referring to FIGS. 2, 3A, 3B, 3C, 17A and 17B, the upper conductive layer 192 may be patterned, for example etched using the mask pattern 194 as an etch mask, to form the plurality of upper conductive patterns 196, which may include conductive pads in the first region A and conductive wirings in the third region C, in operation S65.

The upper conductive patterns 196 may include, in the first region A, conductive pads 196a electrically connected to the first contact structures 190a, respectively. As shown, the upper conductive patterns 196 may include conductive pads 196a (first upper conductive patterns) on respective first contact structures 190a and contacting respective upper surfaces 190au of the first contact structures 190a. The conductive pads 196a may each contact at least a portion of an upper surface (e.g., 142aU) of a separate upper capping layer (e.g., first upper capping layer 142a). As shown in at least FIG. 18B, the upper conductive layer 192 may remain in the second region B, for example remaining in the second opening 145b. The upper conductive patterns 196 may include, in the third region C, conductive wirings 196c.

Figure 16A:
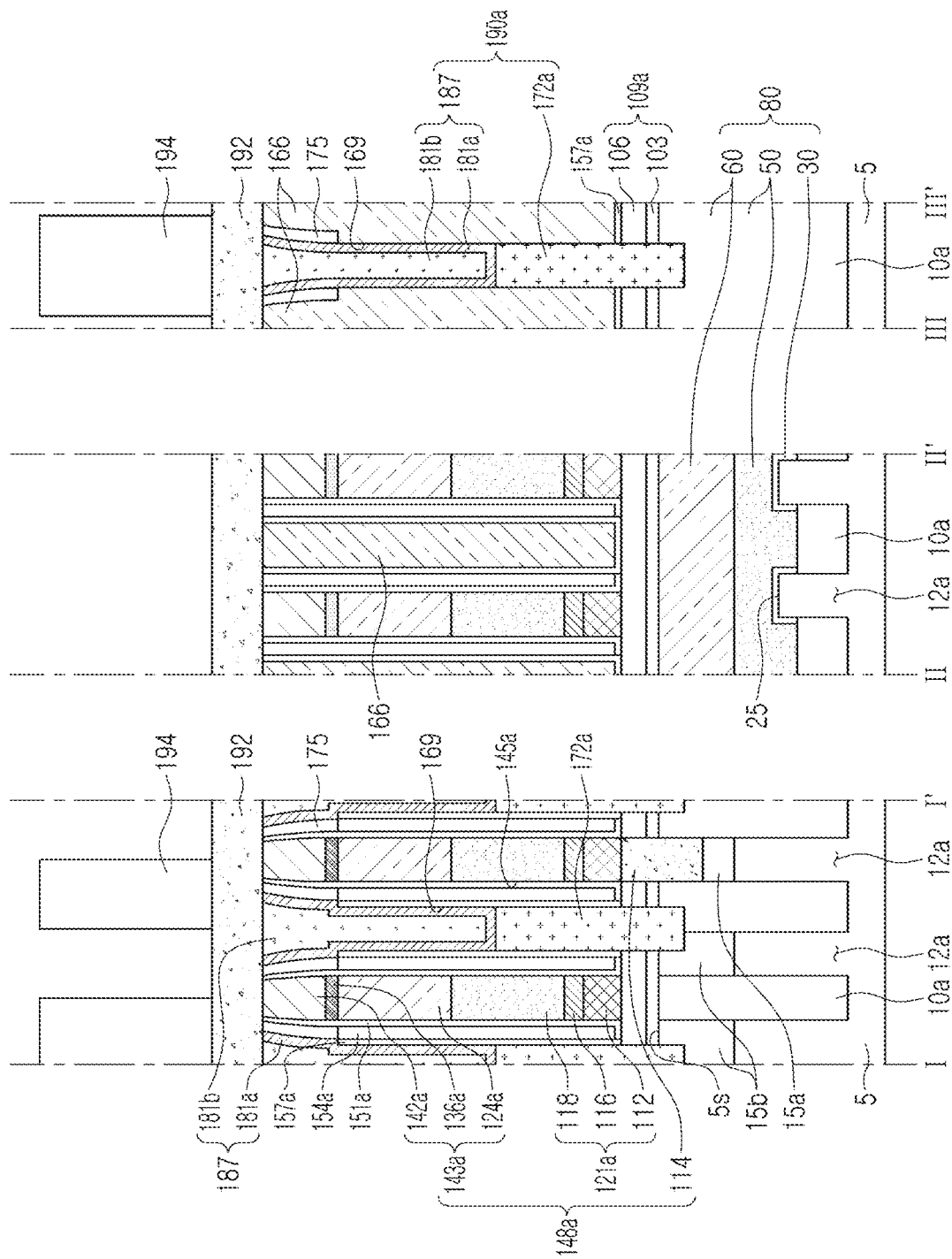
Figure 16B:
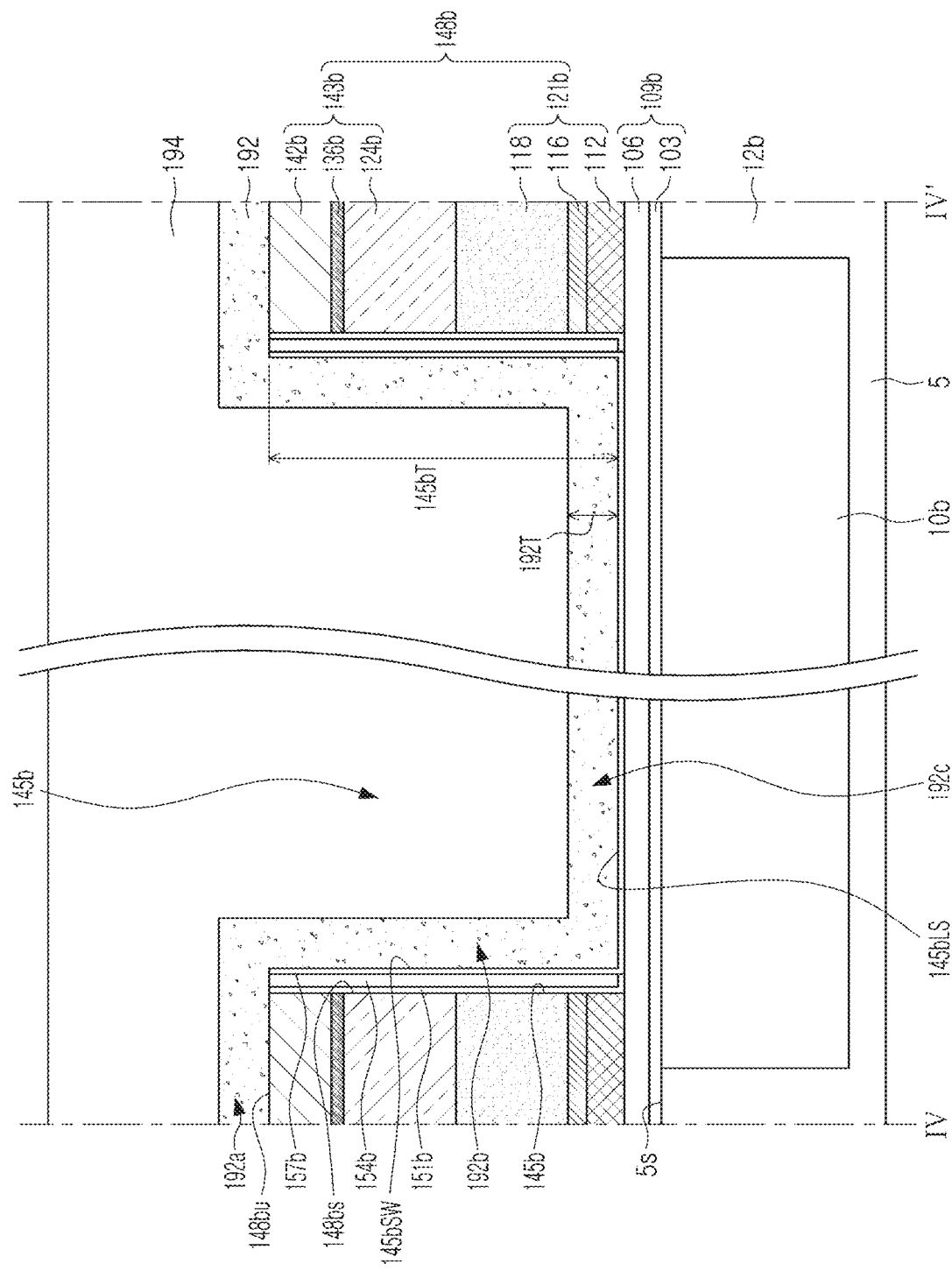
Figure 16C:
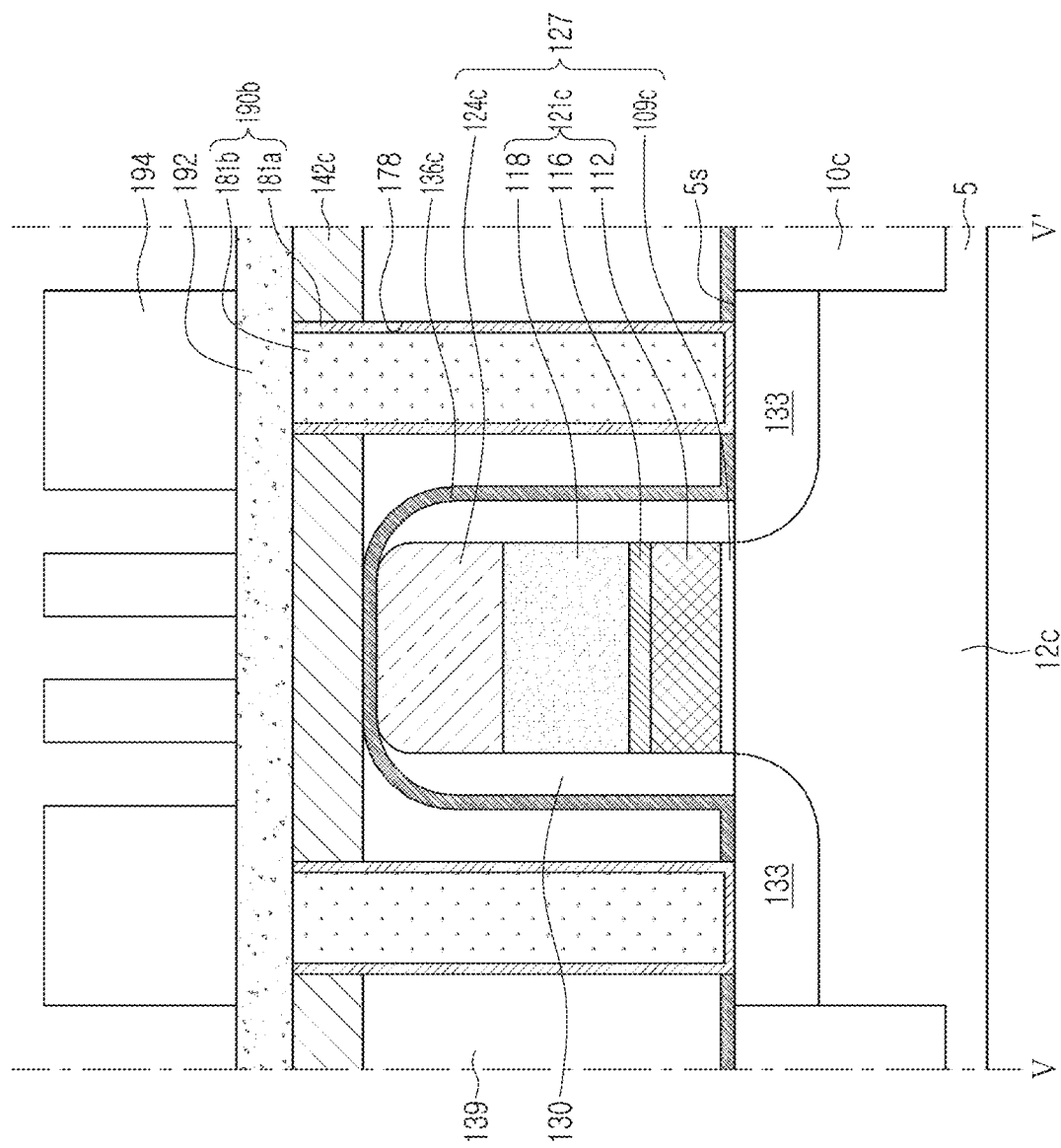
Figure 17A:
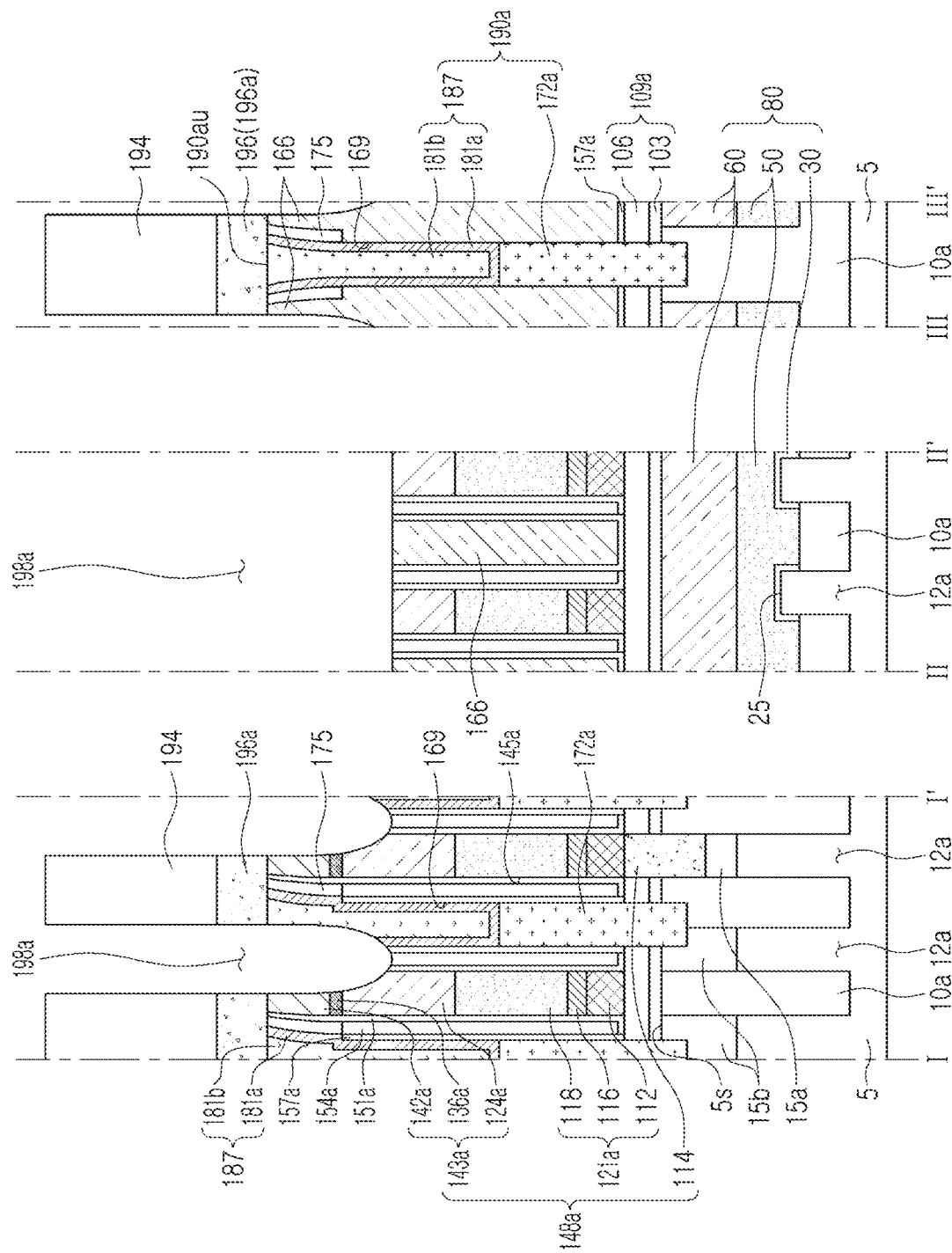
Figure 17B:
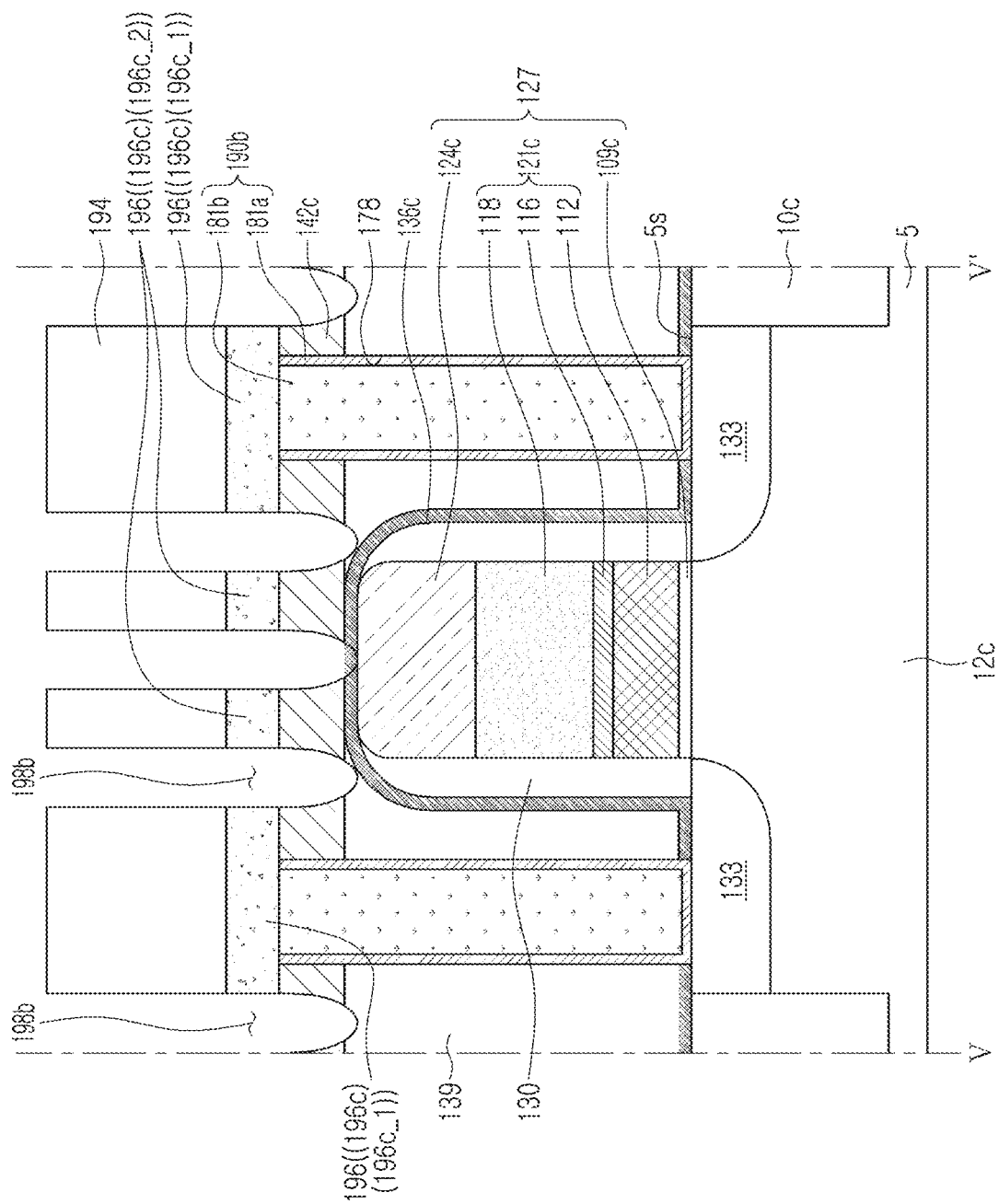
Figure 18A:
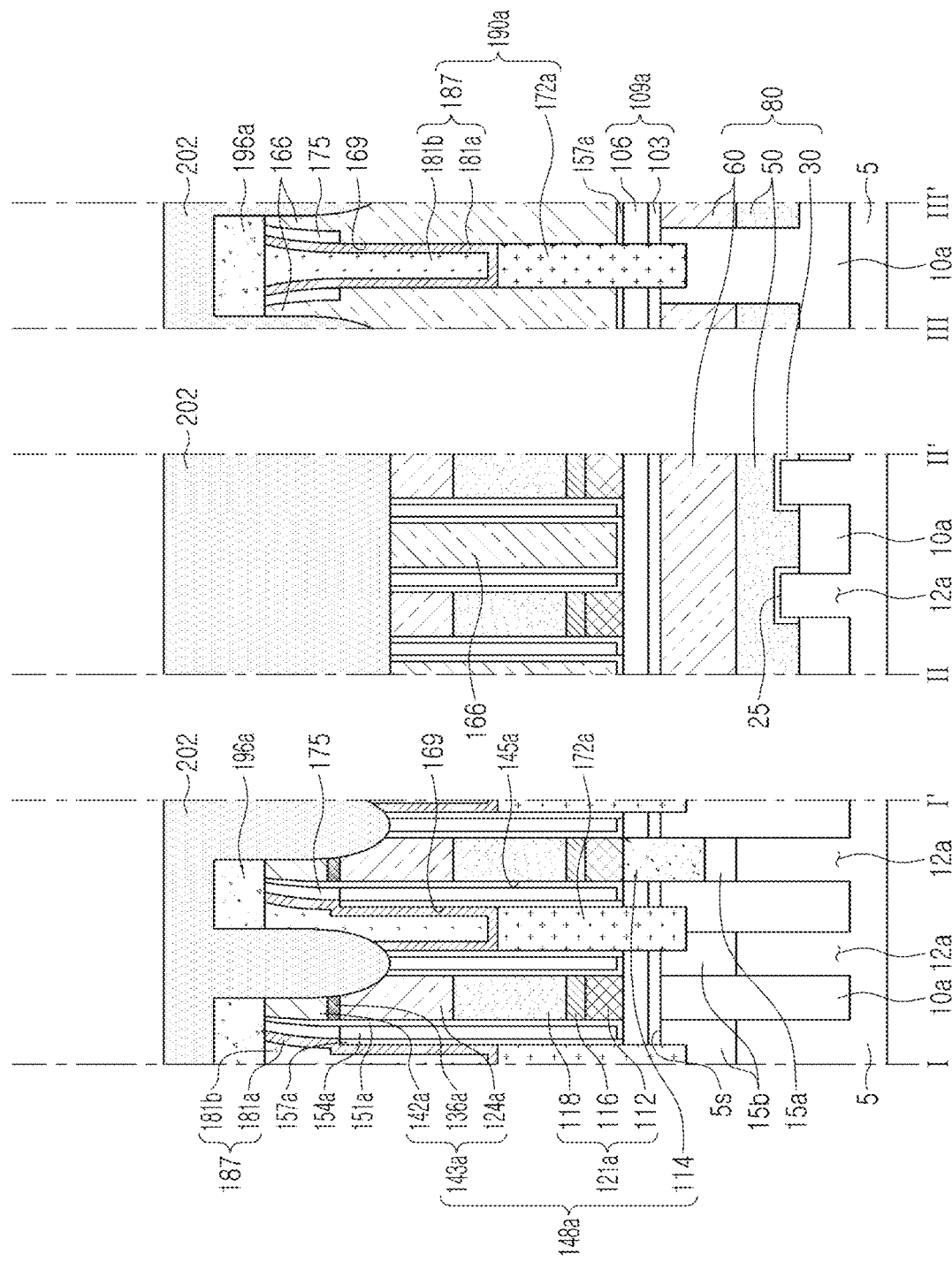
Figure 18B:
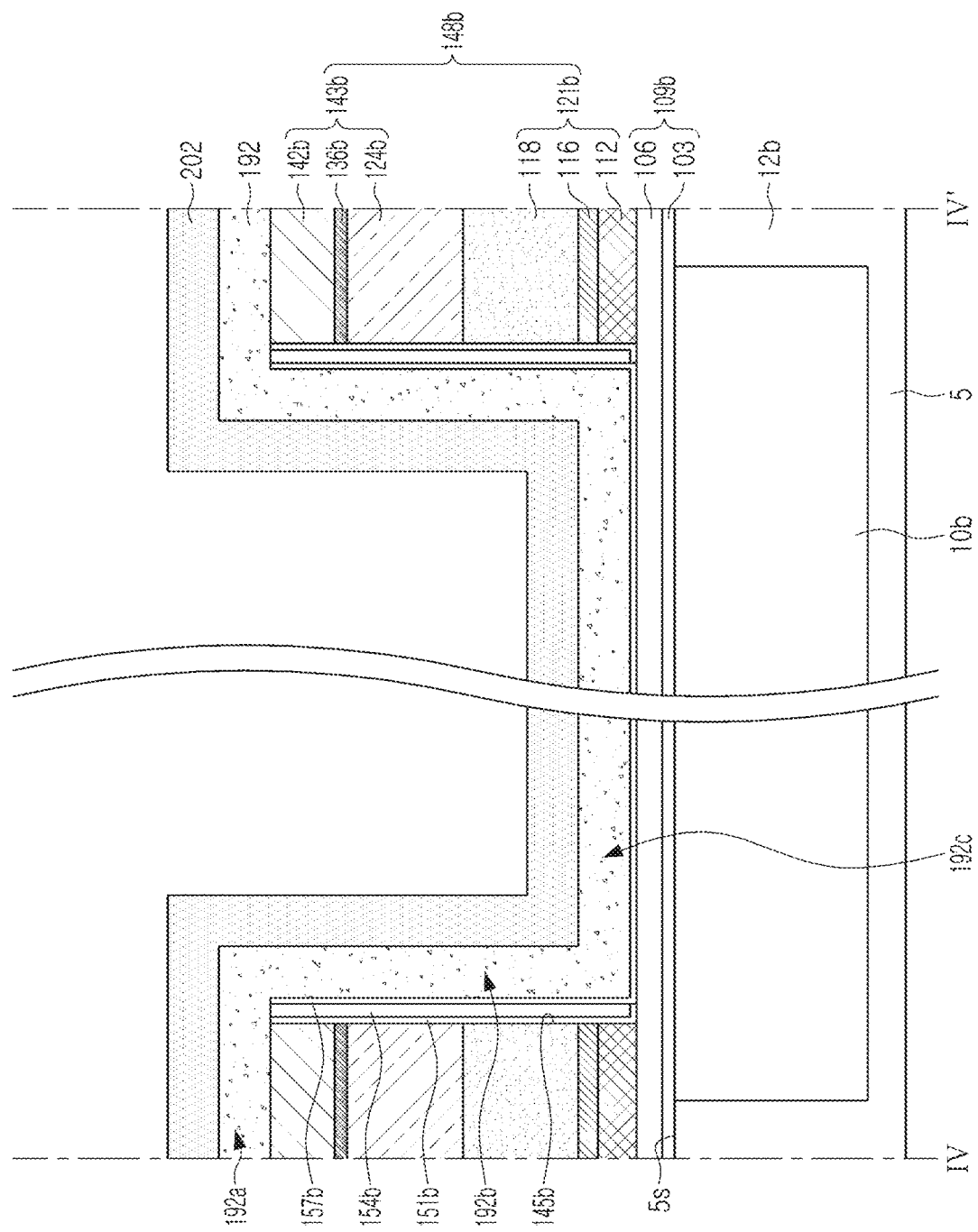
Figure 18C:
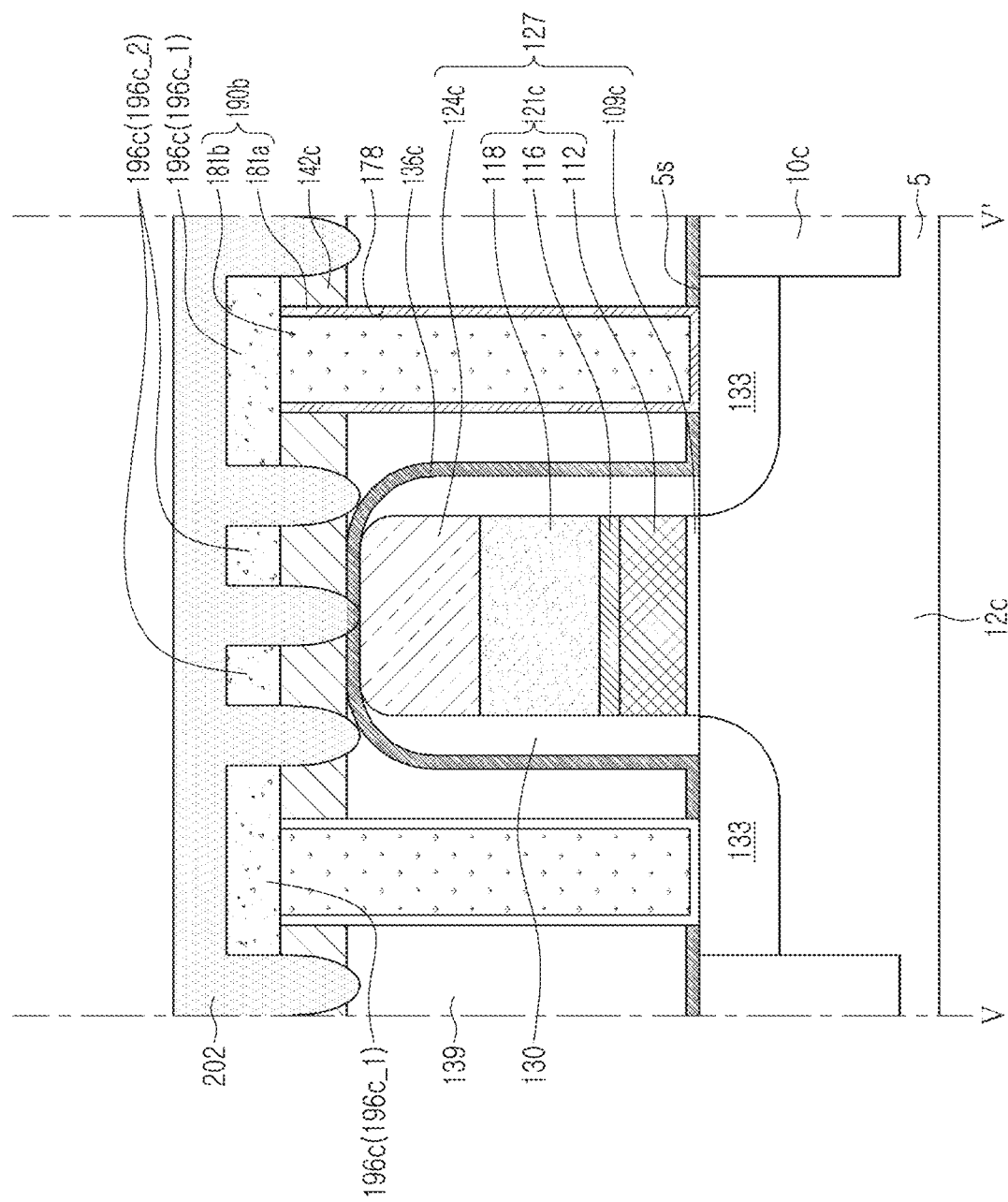
Figure 19A:
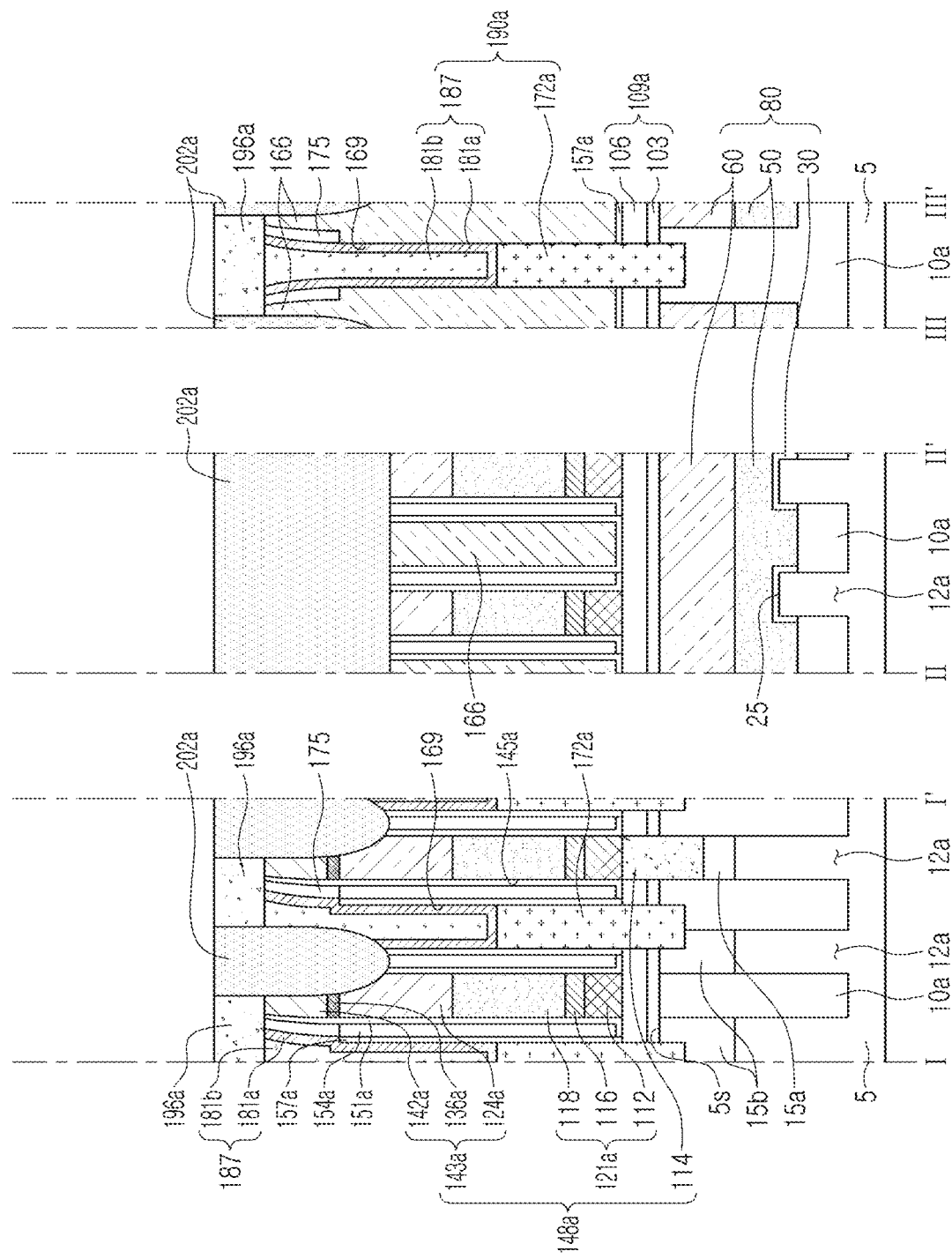
Figure 19B:
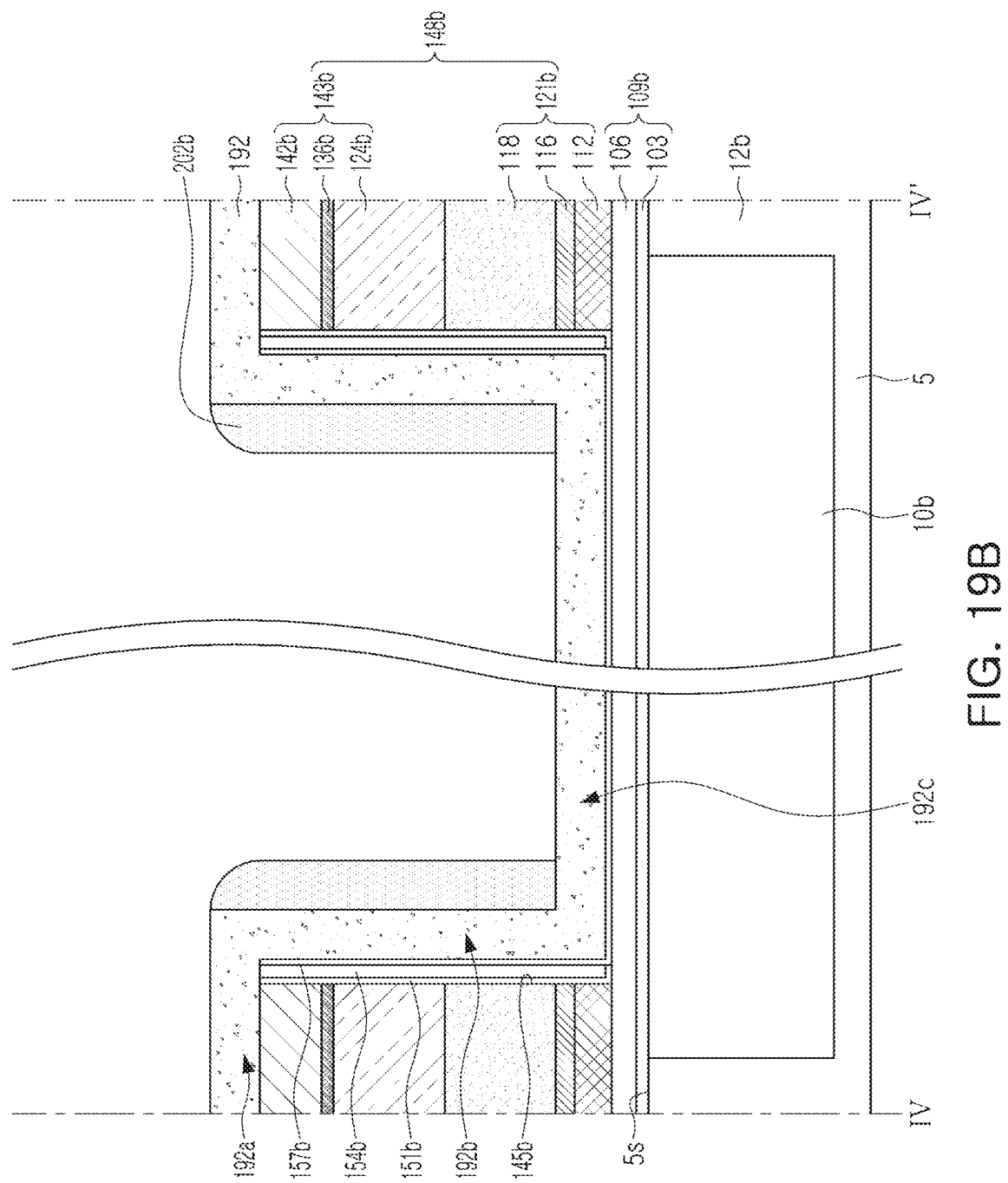
Figure 19C:
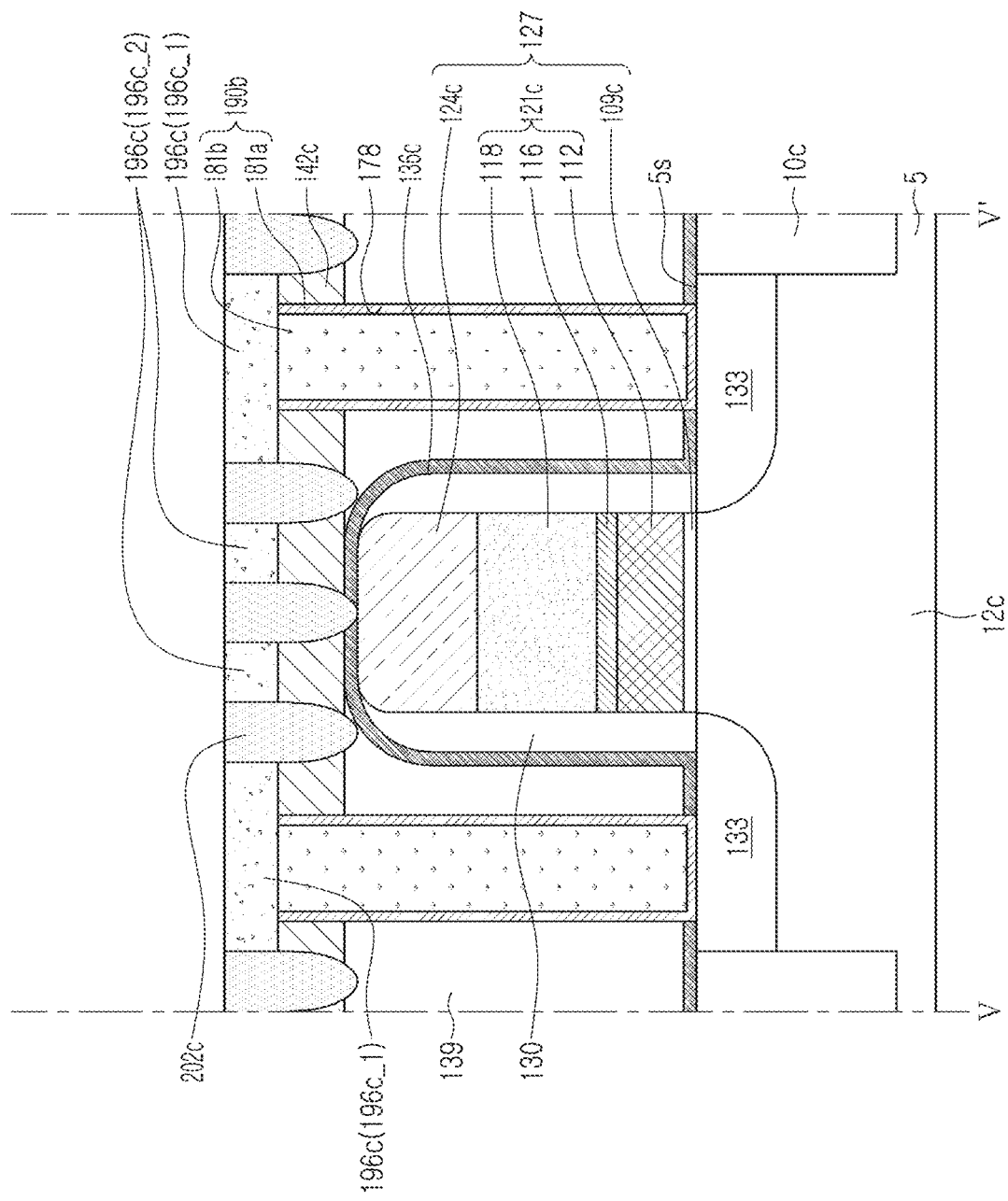
Figure 20A:
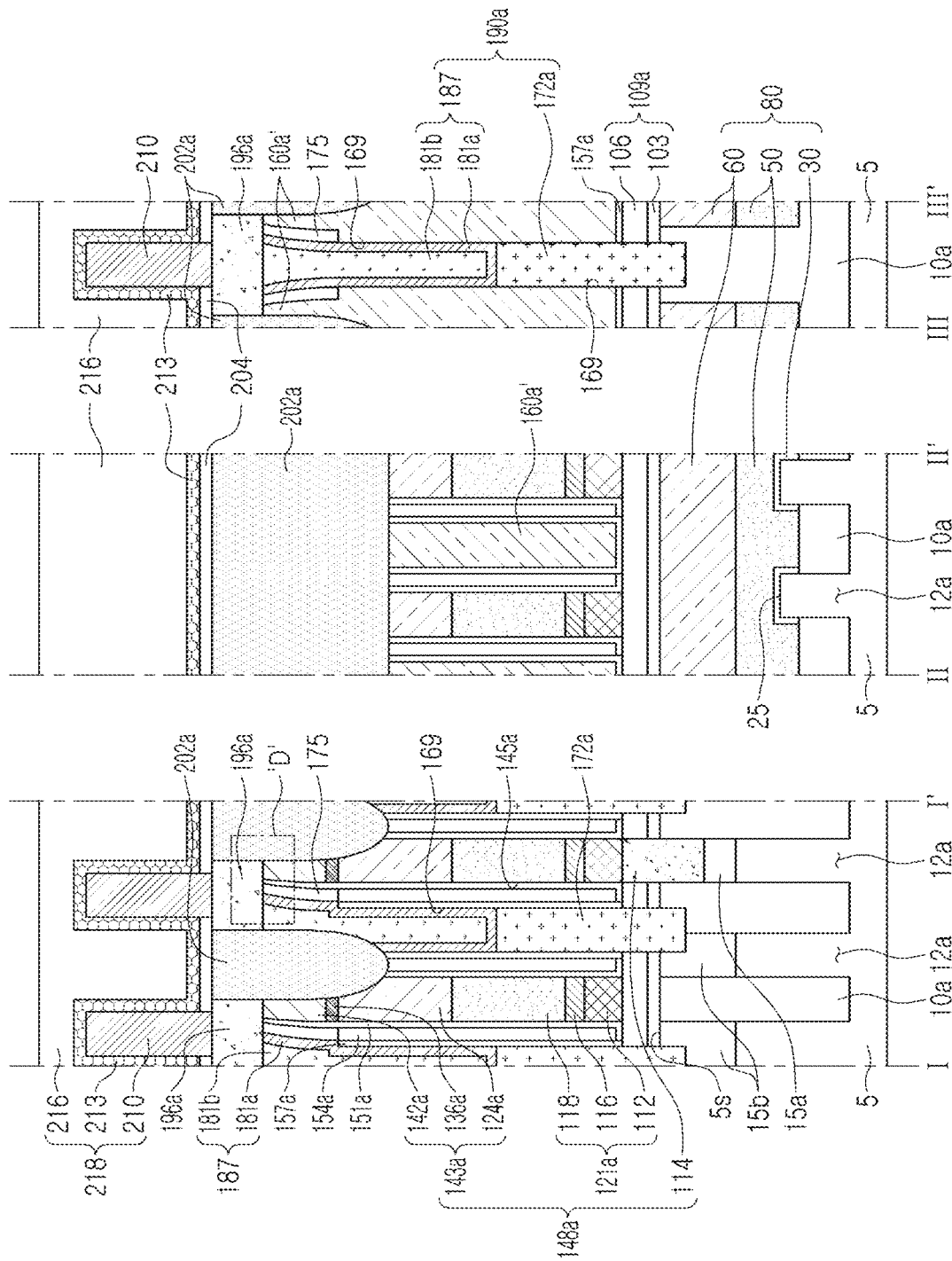
Figure 20B:
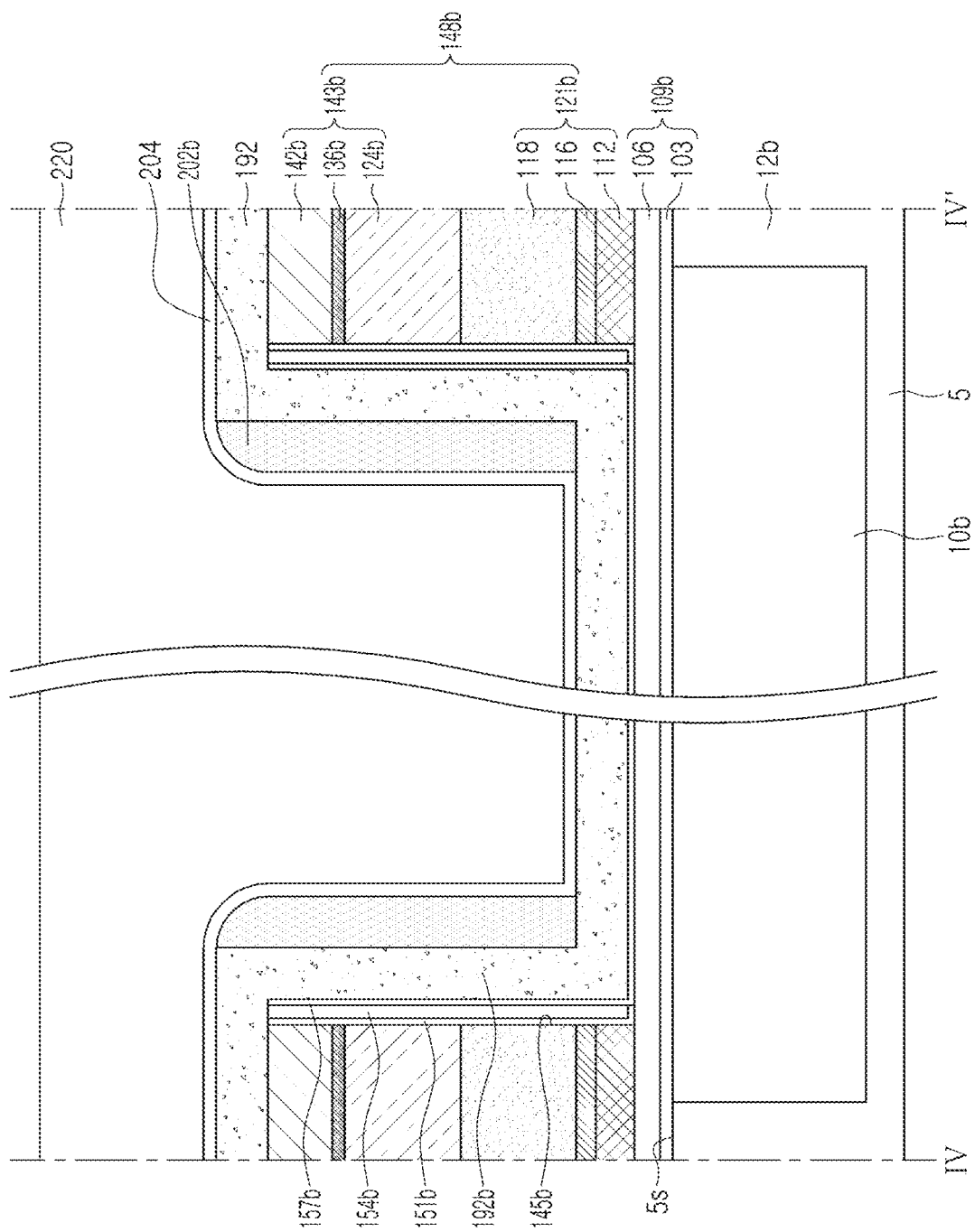
Figure 20C:
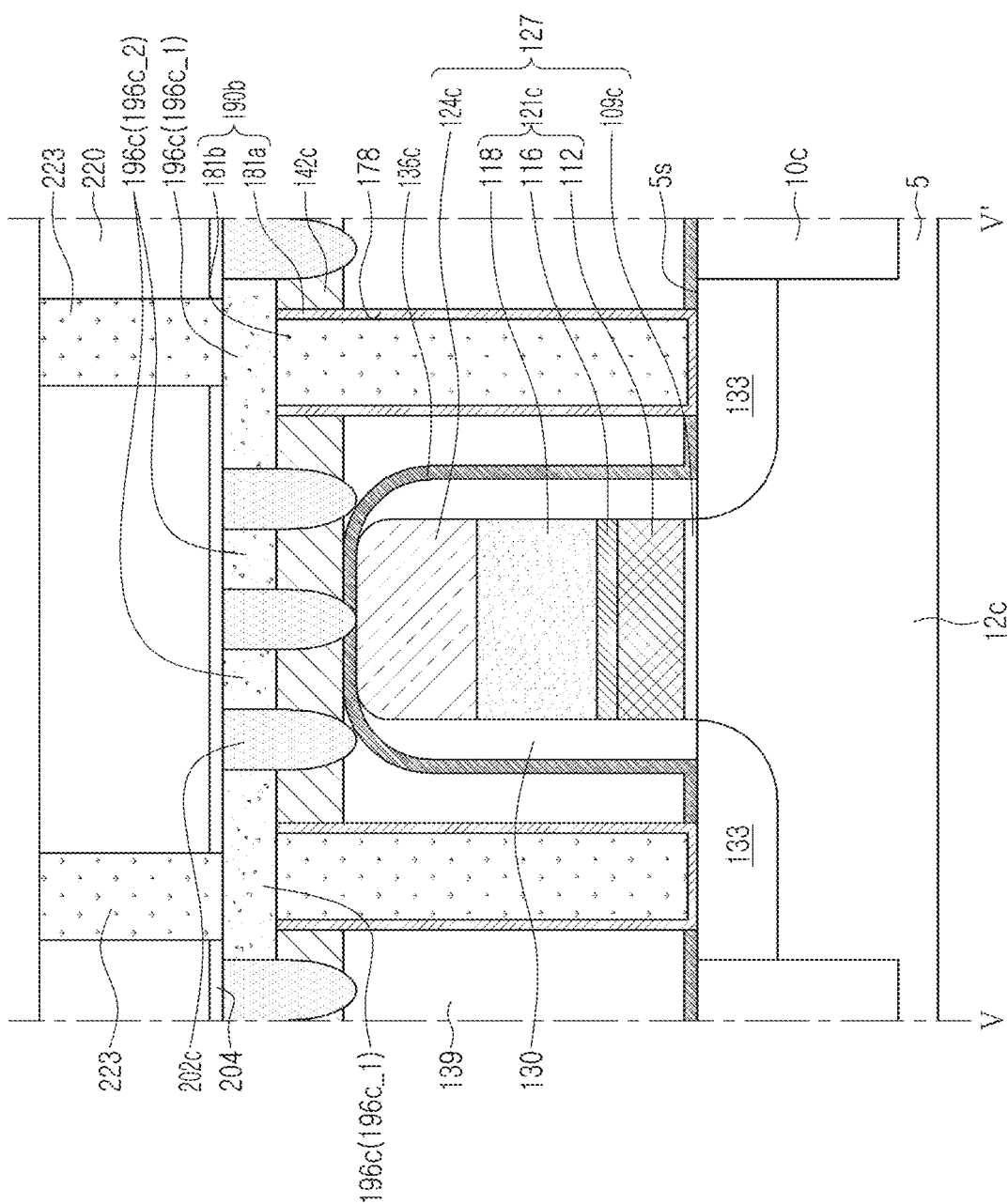

The upper conductive layer 192 may be etched using the mask pattern 194 as an etch mask to form the conductive pads 196a in the first region A and the conductive wirings 196c in the third region C. The upper conductive layer 192 may be left unremoved in the second region B by the covering of the mask pattern 194 as shown in FIG. 16B.

In the third region C, the conductive wirings 196c may include first conductive wirings 196c_1 overlapped with and electrically connected to separate, respective second contact structures 190b and second conductive wirings 196c_2 between the first conductive wirings 196c_1, where the second conductive wirings 196c_2 are overlapped with the peripheral gate structure 127 in a direction extending perpendicular or substantially perpendicular (e.g., perpendicular within manufacturing tolerances and/or material tolerances) to the upper surface 5s of the substrate 5.

In some example embodiments, at least some of the conductive wirings 196c may have a smaller width than a width of the peripheral gate structure 127.

The upper conductive layer 192 may be etched in the first region A to form the conductive pads 196a and a third opening 198a between the conductive pads 196a and may be etched in the third region C to form the conductive wirings 196c and a fourth opening 198b between the conductive wirings 196c.

Each of the conductive pads 196a may contact a portion of an upper surface of a corresponding one of the first contact structures 190a and may contact a portion of an upper surface of the first capping structure 143a immediately adjacent to the corresponding one of the first contact structures 190a.

In the first region A, the upper conductive layer 192 may be etched to form the conductive pads 196a, and then the etching process may be successively performed until the first intermediate spacer layer 154a is exposed, such that the third opening 198a may be formed. A lower surface of the third opening 198a may be lower than a lower surface of the first upper capping layer 142a with respect to the upper surface 5s of the substrate 5.

In the third region C, the upper conductive layer 192 may be etched to form the conductive wirings 196c, and then the third upper capping layer 142c may be successively etched, such that the fourth opening 198b may be formed. A lower surface of the fourth opening 198b may be lower than a lower surface of the third upper capping layer 142c with respect to the upper surface 5s of the substrate 5.

In some example embodiments, in the first region A, the first intermediate spacer layer 154a exposed by the third opening 198a may at least partially comprise an air gap. For example, the first intermediate spacer layer 154a exposed by the third opening 198a in the first region A may be removed, such that the air gap may be formed.

Referring to FIGS. 2, 3A, 3B, 3C, 18A, 18B, and 18C, the mask pattern 194 may be removed. Referring to FIGS. 2, 3A, 3B, 3C, 18A, 18B, and 18C, an insulation layer 202 may be formed on the substrate 5. The insulation layer 202 may at least partially comprise silicon nitride. The insulation layer 202 may be formed with a thickness smaller than a depth of the second opening 145b. In the first and third regions A and C, the insulation layer 202 may fill the third and fourth openings 198a and 198b, and in the second region B, the insulation layer 202 may be conformally formed along a surface of the upper conductive layer 192.

Referring to FIGS. 2, 3A, 3B, 3C, 19A, 19B and 19C, the insulation layer 202 may be etched back until upper surfaces of the conductive pads 196a, upper surfaces of the conductive wirings 196c, and the first portion 192a and the third portion 192c of the upper conductive layer 192 are exposed. Thus, the insulation layer 202 may be formed as a first insulation pattern 202a remaining in the third opening 198a in the first region A, as a second insulation pattern 202b remaining on a side of the second portion 192b of the upper conductive layer 192 in the second region B, and as a third insulation pattern 202c remaining in the fourth opening 198b in the third region C.

Referring to FIGS. 2, 3A, 3B, 3C, 20A, 20B, 20C, and 21, an etch stop layer 204 may be formed on the substrate 5. The etch stop layer 204 may at least partially comprise silicon nitride. The etch stop layer 204 may cover the conductive pads 196a, the conductive wirings 196c, the upper conductive layer 192, the first to third insulation patterns 202a, 202b, and 202c.

In the first region A, data storage elements 218 may be formed. For example, the data storage elements 218 may be cell capacitors of a volatile memory device such as a dynamic random access memory (DRAM). For example, the data storage elements 218 may include first electrodes 210 passing through the etch stop layer 204 and electrically connected to the conductive pads 196a, a capacitor dielectric layer 213, and a second electrode 216 covering the capacitor dielectric layer 213. In some example embodiments, the data storage elements 218 may be data storage elements of a nonvolatile memory device such as a magnetoresistive random access memory (MRAM).

An upper interlayer insulation layer 220 may be formed. The upper interlayer insulation layer 220 may be formed to cover the data storage elements 218 in the first region A. The upper interlayer insulation layer 220 may be formed on the etch stop layer 204 to fill the remainder of the second opening 145b and cover the second pattern structure 148b, in the second region B. The upper interlayer insulation layer 220 may be formed on the etch stop layer 204 in the third region C. The upper interlayer insulation layer 220 may at least partially comprise silicon oxide. The upper interlayer insulation layer 220 may be formed after the formation of the data storage elements 218.

In the third region C, upper contact structures 223 may be formed to pass through the upper interlayer insulation layer 220 and to be electrically connected to the conductive wirings 196c.

Figure 21:
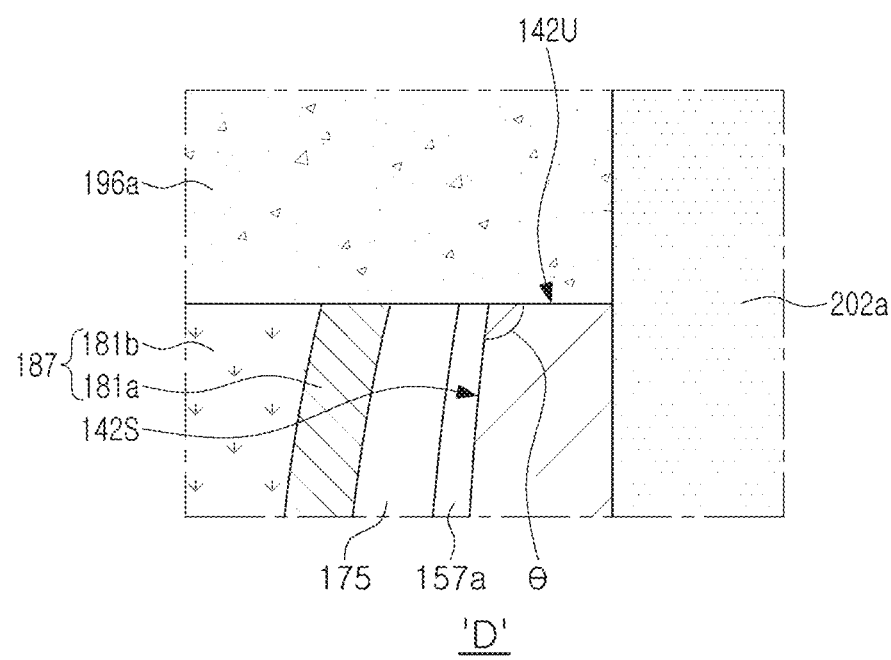
FIG. 21 is an enlarged view of a portion of FIG. 20A.

An example of the semiconductor device formed by the method of manufacturing the semiconductor device according to the aforementioned example embodiments of the inventive concept will be described with reference to FIGS. 3A, 3B, 3C, 20A, 20B, 20C, and 21. FIG. 21 is an enlarged view of portion "D" FIG. 20A. A structure of the semiconductor device that will be described with reference to FIGS. 3A to 3C, 20A to 20C, and 21 may be more easily understood with reference to the method of manufacturing the semiconductor device described above.

Referring to FIGS. 3A, 3B, 3C, 20A, 20B, 20C, and 21, the substrate 5 including the first region A, the second region B, and the third region C may be provided. The substrate 5 may be a semiconductor substrate.

In some example embodiments, the first region A may be a memory cell array region, the second region B may be an align mark region that is used for a photolithography process, and the third region C may be a peripheral circuit region. The second region B may be an overlay mark region that is used for a photolithography process.

In some example embodiments, the second region B may be omitted.

A field region 10, which may include first to third field regions 10a-10c and defining an active region may be disposed in the substrate 5. For example, the first active regions 12a defined by the first field region 10a may be disposed in the first region A, and the third active region 12c defined by the third field region 10c may be disposed in the third region C. The second active region 12b surrounding the second field region 10b may be disposed in the second region B. The first active regions 12a may be referred to as cell active regions, and the third active region 12c may be referred to as a peripheral active region.

The cell gate trench 25 traversing the first active region 12a and the first field region 10a may be disposed in the first region A. The cell gate structure 80 may be disposed in the cell gate trench 25. The first impurity region 15a and the second impurity region 15b may be disposed in the first active region 12a. The first and second impurity regions 15a and 15b may be cell source/drain regions. The cell gate trench 25 may traverse between the first and second impurity regions 15a and 15b.

The cell gate structure 80 may include the cell gate insulation layer 30, the cell gate electrode 50, and the cell gate capping layer 60. The cell gate insulation layer 30 may be disposed between the cell gate electrode 50 and each of the first active regions 12a. The cell gate capping layer 60 may be disposed on the cell gate electrode 50.

The first insulation layer 109a may be disposed in the first region A, and the second insulation layer 109b may be disposed in the second region B.

The first pattern structure 148a having the first opening 145a may be disposed in the first region A. The first pattern structure 148a may be disposed on the first insulation layer 109a. The first pattern structure 148a may include the first conductive layer 121a and the first capping structure 143a that are sequentially stacked. The first capping structure 143a may include the first lower capping layer 124a, the first intermediate capping layer 136a, and the first upper capping layer 142a that are sequentially stacked. The first pattern structure 148a may include the bit line contact plug 114 passing through the first insulation layer 109a and electrically connecting the first conductive layer 121a and the first impurity region 15a.

The second pattern structure 148b may be disposed in the second region B. The second pattern structure 148b may be disposed on the second insulation layer 109b. The second pattern structure 148b may include the second conductive layer 121b and the second capping structure 143b that are sequentially stacked. The second capping structure 143b may include the second lower capping layer 124b, the second intermediate capping layer 136b, and the second upper capping layer 142b that are sequentially stacked.

The peripheral gate structure 127 may be disposed in the third region C (i.e., the peripheral circuit region). Thus, the peripheral gate structure 127 may include a third insulation layer (i.e., the peripheral gate insulation layer) 109c, the third conductive layer (i.e., the peripheral gate electrode) 121c, and the third lower capping layer (i.e., the peripheral lower capping layer) 124c.

The peripheral gate spacer 130 may be disposed on the sidewalls of the peripheral gate structure 127.

In the third region C, the peripheral interlayer insulation layer 139 may be disposed around the peripheral gate structure 127. The third intermediate capping layer (i.e., peripheral intermediate capping layer) 136c may be disposed to be interposed between the peripheral interlayer insulation layer 139 and the peripheral gate spacer 130, to extend between the peripheral interlayer insulation layer 139 and the substrate 5, and to cover an upper surface of the peripheral gate structure 127. The third upper capping layer (i.e., peripheral upper capping layer) 142c may be disposed on the peripheral interlayer insulation layer 139 and the peripheral intermediate capping layer 136c.

Each of the first and second insulation layers 109a and 109b may include the lower insulation layer 103 and the upper insulation layer 106 on the lower insulation layer 103.

The first to third conductive layers 121a, 121b, and 121c may include the same material. For example, each of the first to third conductive layers 121a, 121b, and 121c may include the first material layer 112, the second material layer 116, and the third material layer 118. The bit line contact plug 114 may contact the first material layer 112 of the first conductive layer 121a and may pass through the first insulation layer 109a to be electrically connected to the first impurity region 15a. The first to third lower capping layers 124a, 124b, and 124c may include the same material.

In the third region C, the peripheral gate structure 127 may traverse the third active region 12c and may extend onto the third field region 10c. The peripheral source/drain regions 133 may be disposed in the third active region 12c at opposite sides of the peripheral gate structure 127.

In the first region A, the first pattern structure 148a may include a plurality of linear structures spaced apart from each other. The first opening 145a may be defined between the spaced linear structures.

The first contact structures 190a and the fences 166 may be disposed in the first opening 145a of the first pattern structure 148a. Each of the first contact structures 190a may include each of the lower contact patterns 172a and each of the upper contact patterns 187 that are sequentially stacked.

The first contact structures 190a may be electrically connected to the second impurity regions 15b.

The second contact structure 190b may be disposed on each of the peripheral source/drain regions 133 and may pass through the peripheral interlayer insulation layer 139 and the peripheral upper capping layer 142c.

Upper surfaces of the first contact structure 190a, the second contact structure 190b, and the peripheral upper capping layer 142c may be coplanar with each other.

The conductive pads 196a and the conductive wirings 196c may be disposed on the substrate 5. The conductive pads 196a may be electrically connected to the first contact structures 190a. The conductive wirings 196c may include the first conductive wirings 196c_1 overlapped with and electrically connected to the second contact structures 190b and the second conductive wirings 196c_2 between the first conductive wirings 196c_1. The second conductive wirings 196c_2 may be overlapped with the peripheral gate structure 127.

Each of the conductive pads 196a may contact a portion of an upper surface of a corresponding one of the first contact structures 190a and may contact a portion of an upper surface of the first capping structure 143a immediately adjacent to the corresponding one of the first contact structures 190a.

An obtuse angle θ may be formed between an upper surface 142U of the first upper capping layer 142a contacting one of the conductive pads 196a and a sidewall 142S of the first upper capping layer 142a facing the upper contact pattern 187 of the first contact structure 190a.

One or more first spacer layers may be disposed between the first pattern structure 148a and the first contact structure 190a. For example, the first inner spacer layer 151a, the first intermediate spacer layer 154a, and the first outer spacer layer 157a may be disposed between a portion of the first pattern structure 148a and the first contact structure 190a, and the upper spacer layer 175 may be disposed on the first intermediate spacer layer 154a. The first intermediate spacer layer 154a may be disposed between the first inner spacer layer 151a and the first outer spacer layer 157a. In some example embodiments, a height of the first spacer layers is greater than a height of the peripheral gate spacer 130 and a thickness of the first spacer layers is smaller than a thickness of the peripheral gate spacer 130. In some example embodiments, the first intermediate spacer layer 154a may be an air gap.

The first insulation pattern 202a may be disposed between the conductive pads 196a and may extend downwardly to have a lower surface that is lower than a lower surface of the first upper capping layer 142a with respect to the upper surface 5s of the substrate 5. The third insulation pattern 202c may be disposed between the conductive wirings 196c and may extend downwardly to pass through the peripheral upper capping layer 142c.

The data storage elements 218 may be disposed on the conductive pads 196a. The data storage elements 218 may be applied to the volatile memory device or the nonvolatile memory device.

The upper contact structure (i.e., peripheral contact structures) 223 may be disposed on the first conductive wirings 196c_1.

The upper interlayer insulation layer 220 may be disposed in the second opening 145b and may extend upwardly to cover an upper portion of the second pattern structure 148b. The upper conductive layer 192 may be disposed between the upper interlayer insulation layer 220 and a sidewall of the second pattern structure 148b, between the upper interlayer insulation layer 220 and a lower surface of the second opening 145b, and between the upper interlayer insulation layer 220 and an upper surface of the second pattern structure 148b.

The etch stop layer 204 may be disposed between the upper conductive layer 192 and the upper interlayer insulation layer 220. The second insulation pattern 202b may be disposed between the upper interlayer insulation layer 220 and the sidewall of the second pattern structure 148b and between the etch stop layer 204 and the upper conductive layer 192. The second inner spacer layer 151b, the second intermediate spacer layer 154b, and the second outer spacer layer 157b may be disposed between the upper conductive layer 192 and the sidewall of the second pattern structure 148b.

According to some example embodiments of the inventive concept, in operation S45 of forming the contact patterns remaining in the first and second contact holes 169 and 178 by planarizing the contact material layer 184 by the CMP process, the second gap fill layer 160b may protect or prevent the second pattern structure 148b from being damaged by the CMP process.

According to some example embodiments of the inventive concept, the mask pattern 194 may be formed by the photolithography process using the second pattern structure 148b covered by the upper conductive layer 192 as the align mark, in operation S60. Therefore, since the undamaged second pattern structure 148b is used for the align mark, the yield of the photolithography process may be increased.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A semiconductor device, comprising:
a substrate including a first active region and a second active region, the first active region including a first impurity region and a second impurity region, the second active region including a third impurity region and a fourth impurity region;
a bit line structure electrically connected to the first impurity region of the first active region, the bit line structure including a bit line conductive pattern and a bit line capping pattern that is disposed on the bit line conductive pattern;
a gate structure disposed on the second active region and including a gate conductive pattern and a gate capping pattern that is disposed on the gate conductive pattern;
a first contact structure electrically connected to the second impurity region of the first active region and including a lower contact pattern and an upper contact pattern that is disposed on the lower contact pattern, the upper contact pattern including a first barrier layer and a first metal layer that is disposed on the first barrier layer;
a second contact structure electrically connected to the third impurity region or the fourth impurity region of the second active region, the second contact structure including a second barrier layer and a second metal layer that is disposed on the second barrier layer;
a first conductive pad disposed on the first contact structure; and
a second conductive pad disposed on the second contact structure, wherein the bit line capping pattern of the bit line structure includes a first bit line capping layer, a second bit line capping layer that is disposed on the first bit line capping layer, and a third bit line capping layer that is disposed on the second bit line capping layer, wherein the gate capping pattern of the gate structure includes a first gate capping layer, a second gate capping layer that is disposed on the first gate capping layer, and a third gate capping layer that is disposed on the second gate capping layer, wherein the first conductive pad contacts a top surface of the third bit line capping layer of the bit line capping pattern of the bit line structure, wherein the top surface of the third bit line capping layer of the bit line capping pattern of the bit line structure is substantially coplanar with a top surface of the first barrier layer and a top surface of the first metal layer of the upper contact pattern of the first contact structure, wherein the second conductive pad contacts a top surface of the third gate capping layer of the gate capping pattern of the gate structure, and wherein the top surface of the third gate capping layer of the gate capping pattern of the gate structure is substantially coplanar with a top surface of the second barrier layer and a top surface of the second metal layer of the second contact structure.

2. The semiconductor device of claim 1, wherein
a bottom surface of the first conductive pad contacts the top surface of the first barrier layer and the top surface of the first metal layer of the upper contact pattern of the first contact structure, and
a bottom surface of the second conductive pad contacts the top surface of the second barrier layer and the top surface of the second metal layer of the second contact structure.

3. The semiconductor device of claim 1, wherein
the first bit line capping layer of the bit line capping pattern of the bit line structure includes a same material as the first gate capping layer of the gate capping pattern of the gate structure,
the second bit line capping layer of the bit line capping pattern of the bit line structure includes a same material as the second gate capping layer of the gate capping pattern of the gate structure, and
the third bit line capping layer of the bit line capping pattern of the bit line structure includes a same material as the third gate capping layer of the gate capping pattern of the gate structure.

4. The semiconductor device of claim 1, further comprising:
a first insulation pattern that is disposed on a side surface of the upper contact pattern of the first contact structure and a side surface of the first conductive pad; and
a second insulation pattern that is disposed on a side surface of the second conductive pad,
wherein a top surface of the first conductive pad is substantially coplanar with a top surface of the first insulation pattern, and
wherein a top surface of the second conductive pad is substantially coplanar with a top surface of the second insulation pattern.

5. The semiconductor device of claim 4, further comprising:
an etch stop layer that is disposed on the first conductive pad and the first insulation pattern; and
a capacitor lower electrode that passes through the etch stop layer and is disposed on the first conductive pad.

6. The semiconductor device of claim 4, further comprising:
an etch stop layer that is disposed on the second conductive pad and the second insulation pattern; and
a third contact structure that passes through the etch stop layer and is disposed on the second conductive pad.

7. The semiconductor device of claim 1, wherein the bit line conductive pattern of the bit line structure includes a same material as the gate conductive pattern of the gate structure.

8. The semiconductor device of claim 1, wherein the top surface of the third bit line capping layer of the bit line capping pattern of the bit line structure is flat.

9. The semiconductor device of claim 4, wherein
a bottom surface of the second insulation pattern is disposed lower than a bottom surface of the third gate capping layer of the gate capping pattern of the gate structure, and
the second insulation pattern contacts the second gate capping layer of the gate capping pattern of the gate structure.

10. The semiconductor device of claim 1, further comprising:
an insulation fence pattern that is disposed adjacent to the first contact structure,
wherein a top surface of the insulation fence pattern is substantially coplanar with a top surface of the upper contact pattern of the first contact structure.

11. A semiconductor device, comprising:
a substrate including a first active region and a second active region, the first active region including a first impurity region and a second impurity region, the second active region including a third impurity region and a fourth impurity region;
a bit line structure electrically connected to the first impurity region of the first active region, the bit line structure including a bit line conductive pattern and a bit line capping pattern that is disposed on the bit line conductive pattern;
a gate structure disposed on the second active region and including a gate conductive pattern and a gate capping pattern that is disposed on the gate conductive pattern;
a first contact structure electrically connected to the second impurity region of the first active region and including a lower contact pattern and an upper contact pattern that is disposed on the lower contact pattern;
a second contact structure electrically connected to the third impurity region or the fourth impurity region of the second active region;
a first conductive pad disposed on the first contact structure; and
a second conductive pad disposed on the second contact structure,
wherein the bit line capping pattern of the bit line structure includes a first bit line capping layer, a second bit line capping layer that is disposed on the first bit line capping layer, and a third bit line capping layer that is disposed on the second bit line capping layer,
wherein the gate capping pattern of the gate structure includes a first gate capping layer, a second gate capping layer that is disposed on the first gate capping layer, and a third gate capping layer that is disposed on the second gate capping layer,
wherein a bottom surface of the first conductive pad contacts a top surface of the upper contact pattern of the first contact structure and a top surface of the third bit line capping layer of the bit line capping pattern of the bit line structure, wherein a bottom surface of the second conductive pad contacts a top surface of the second contact structure and a top surface of the third gate capping layer of the gate capping pattern of the gate structure, wherein the first bit line capping layer of the bit line capping pattern of the bit line structure includes a same material as the first gate capping layer of the gate capping pattern of the gate structure, wherein the second bit line capping layer of the bit line capping pattern of the bit line structure includes a same material as the second gate capping layer of the gate capping pattern of the gate structure, and wherein the third bit line capping layer of the bit line capping pattern of the bit line structure includes a same material as the third gate capping layer of the gate capping pattern of the gate structure.

12. The semiconductor device of claim 11, wherein
the upper contact pattern of the first contact structure includes a first barrier layer and a first metal layer that is disposed on the first barrier layer,
the second contact structure includes a second barrier layer and a second metal layer that is disposed on the second barrier layer,
the bottom surface of the first conductive pad contacts a top surface of the first barrier layer and a top surface of the first metal layer of the upper contact pattern of the first contact structure, and
the bottom surface of the second conductive pad contacts a top surface of the second barrier layer and a top surface of the second metal layer of the second contact structure.

13. The semiconductor device of claim 11, further comprising:
a first insulation pattern that is disposed on a side surface of the upper contact pattern of the first contact structure and a side surface of the first conductive pad; and
a second insulation pattern that is disposed on a side surface of the second conductive pad,
wherein a top surface of the first conductive pad is substantially coplanar with a top surface of the first insulation pattern, and
wherein a top surface of the second conductive pad is substantially coplanar with a top surface of the second insulation pattern.

14. The semiconductor device of claim 13, further comprising:
an etch stop layer that is disposed on the first conductive pad, the first insulation pattern, the second conductive pad and the second insulation pattern;
a capacitor lower electrode which passes through the etch stop layer and is disposed on the first conductive pad; and
a third contact structure which passes through the etch stop layer and is disposed on the second conductive pad.

15. The semiconductor device of claim 13, wherein
a bottom surface of the second insulation pattern is disposed lower than a bottom surface of the third gate capping layer of the gate capping pattern of the gate structure, and
the second insulation pattern contacts the second gate capping layer of the gate capping pattern of the gate structure.

16. The semiconductor device of claim 11, further comprising:
an insulation fence pattern that is disposed adjacent to the first contact structure,
wherein a top surface of the insulation fence pattern is substantially coplanar with the top surface of the upper contact pattern of the first contact structure.

17. A semiconductor device, comprising:
a substrate including a first active region and a second active region, the first active region including a first impurity region and a second impurity region, the second active region including a third impurity region and a fourth impurity region;
a bit line structure electrically connected to the first impurity region of the first active region, the bit line structure including a bit line conductive pattern and a bit line capping pattern that is disposed on the bit line conductive pattern;
a gate structure disposed on the second active region and including a gate conductive pattern and a gate capping pattern that is disposed on the gate conductive pattern;
a first contact structure electrically connected to the second impurity region of the first active region and including a lower contact pattern and an upper contact pattern that is disposed on the lower contact pattern, the upper contact pattern including a first barrier layer and a first metal layer that is disposed on the first barrier layer;
a second contact structure electrically connected to the third impurity region or the fourth impurity region of the second active region, the second contact structure including a second barrier layer and a second metal layer that is disposed on the second barrier layer;
a first conductive pad disposed on the upper contact pattern of the first contact structure;
a second conductive pad disposed on the second contact structure;
a first insulation pattern disposed on a side surface of the upper contact pattern of the first contact structure and a side surface of the first conductive pad;
a second insulation pattern disposed on a side surface of the second conductive pad; and
an etch stop layer disposed on the first conductive pad, the first insulation pattern, the second conductive pad and the second insulation pattern,
wherein a top surface of the first conductive pad is substantially coplanar with a top surface of the first insulation pattern,
wherein a bottom surface of the first conductive pad contacts a top surface of the first barrier layer and a top surface of the first metal layer of the upper contact pattern of the first contact structure,
wherein a top surface of the second conductive pad is substantially coplanar with a top surface of the second insulation pattern, and
wherein a bottom surface of the second conductive pad contacts a top surface of the second barrier layer and a top surface of the second metal layer of the second contact structure.

18. The semiconductor device of claim 17, further comprising:
a capacitor lower electrode that passes through the etch stop layer and contacts the first conductive pad.

19. The semiconductor device of claim 17, further comprising:
a third contact structure that passes through the etch stop layer and contacts the second conductive pad.

20. The semiconductor device of claim 17, further comprising:
   an insulation fence pattern that is disposed adjacent to the first contact structure,
   wherein a top surface of the insulation fence pattern is substantially coplanar with a top surface of the upper contact pattern of the first contact structure.

\* \* \* \* \*